United States Patent
Ito et al.

(10) Patent No.: US 12,292,683 B2
(45) Date of Patent: May 6, 2025

(54) CURABLE COMPOSITION, CURED PRODUCT, COLOR FILTER, SOLID-STATE IMAGING ELEMENT, AND IMAGE DISPLAY DEVICE

(71) Applicant: FUJIFILM Corporation, Tokyo (JP)

(72) Inventors: Junichi Ito, Shizuoka (JP); Hiroaki Idei, Shizuoka (JP); Yushi Kaneko, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 619 days.

(21) Appl. No.: 17/680,301

(22) Filed: Feb. 25, 2022

(65) Prior Publication Data

US 2022/0179311 A1    Jun. 9, 2022

Related U.S. Application Data

(63) Continuation of application No. PCT/JP2020/030729, filed on Aug. 12, 2020.

(30) Foreign Application Priority Data

Aug. 27, 2019 (JP) .................................. 2019-154274

(51) Int. Cl.
| | | |
|---|---|---|
| *G03F 7/033* | (2006.01) | |
| *C08F 265/04* | (2006.01) | |
| *C08G 63/12* | (2006.01) | |
| *G02B 5/00* | (2006.01) | |
| *G02B 5/20* | (2006.01) | |
| *G03F 7/037* | (2006.01) | |
| *H01L 27/146* | (2006.01) | |
| *H10K 59/38* | (2023.01) | |

(52) U.S. Cl.
CPC ............ *G03F 7/037* (2013.01); *C08F 265/04* (2013.01); *C08G 63/12* (2013.01); *G02B 5/003* (2013.01); *G02B 5/208* (2013.01); *G03F 7/033* (2013.01); *H01L 27/14621* (2013.01); *H10K 59/38* (2023.02)

(58) Field of Classification Search
CPC .................................. G03F 7/037; G03F 7/033
See application file for complete search history.

(56) References Cited

U.S. PATENT DOCUMENTS

| | | |
|---|---|---|
| 2015/0010856 A1 | 1/2015 | Idei et al. |
| 2016/0154303 A1* | 6/2016 | Itou ...................... C09B 69/008 430/7 |
| 2020/0018878 A1 | 1/2020 | Chuko et al. |

FOREIGN PATENT DOCUMENTS

| | | |
|---|---|---|
| JP | 2008065040 | 3/2008 |
| JP | 2013225112 | 10/2013 |
| JP | 2016143061 | 8/2016 |
| JP | 2017165820 | 9/2017 |
| JP | 2018090788 | 6/2018 |
| JP | 2018169600 | 11/2018 |
| JP | 2018205533 | 12/2018 |
| WO | 2018135249 | 7/2018 |

OTHER PUBLICATIONS

"International Search Report (Form PCT/ISA/210) of PCT/JP2020/030729," mailed on Sep. 24, 2020, with English translation thereof, pp. 1-5.
"Written Opinion of the International Searching Authority (Form PCT/ISA/237)" of PCT/JP2020/030729, mailed on Sep. 24, 2020, with English translation thereof, pp. 1-7.
"Office Action of Japan Counterpart Application", issued on Aug. 30, 2022, with English translation thereof, pp. 1-5.

* cited by examiner

Primary Examiner — John S. Chu
(74) Attorney, Agent, or Firm — JCIPRNET

(57) ABSTRACT

Provided are a curable composition including a colorant, a resin, and a thiol compound, in which a thiol value is $6\times10^{-6}$ mmol/g to $6\times10^{-4}$ mmol/g; a curable composition including a colorant, a resin, and a thiol compound, in which a content of the thiol compound is 1 ppm to 99 ppm; a cured product of the curable composition; a color filter including the cured product; and a solid-state imaging element and an image display device including the color filter.

19 Claims, 1 Drawing Sheet

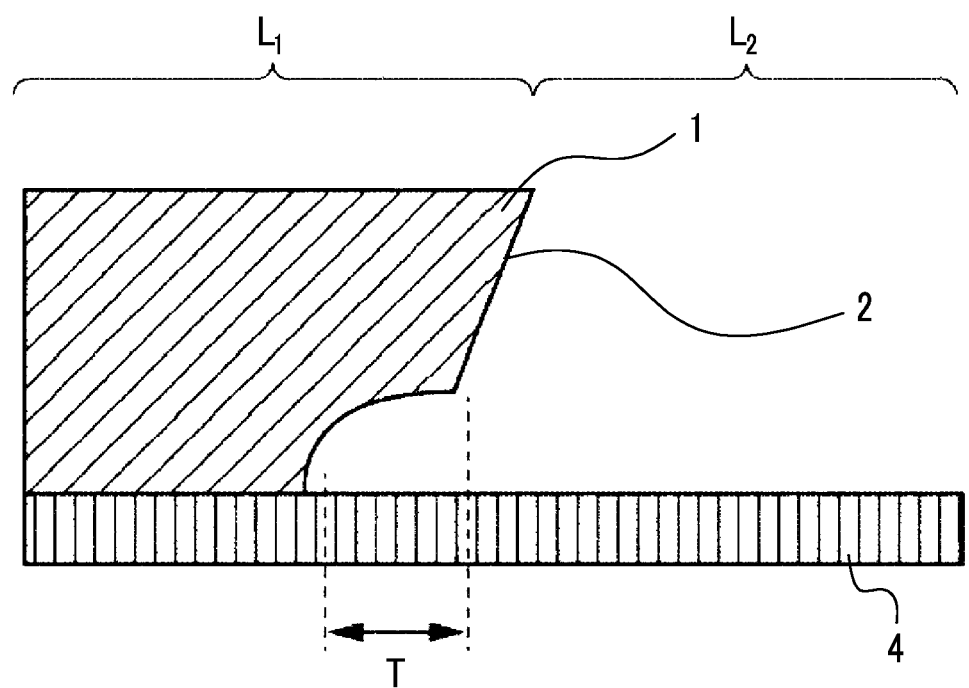

CURABLE COMPOSITION, CURED PRODUCT, COLOR FILTER, SOLID-STATE IMAGING ELEMENT, AND IMAGE DISPLAY DEVICE

CROSS-REFERENCE TO RELATED APPLICATIONS

This application is a continuation application of International Application No. PCT/JP2020/030729, filed Aug. 12, 2020, the disclosure of which is incorporated herein by reference in its entirety. Further, this application claims priority from Japanese Patent Application No. 2019-154274, filed Aug. 27, 2019, the disclosure of which is incorporated herein by reference in its entirety.

BACKGROUND OF THE INVENTION

1. Field of the Invention

The present disclosure relates to a curable composition, a cured product, a color filter, a solid-state imaging element, and an image display device.

2. Description of the Related Art

As a digital camera, a mobile phone with a camera, and the like have been further spreading, there has been a greatly increasing demand for a solid-state imaging element such as a charge coupled device (CCD) image sensor. A color filter has been used as a key device in a display or an optical element. The color filter normally includes pixels (colored patterns) of three primary colors of red, green, and blue, and acts to separate transmitted light into the three primary colors. The color filter is formed of a composition including a colorant such as a pigment.

In addition, as a curable composition in the related art, for example, the curable composition disclosed in JP2018-205533A or JP2018-169600A has been known.

SUMMARY OF THE INVENTION

An object to be achieved by an embodiment according to the present disclosure is to provide a curable composition having an excellent edge shape of a patterned cured product to be obtained.

Another object to be achieved by the embodiment according to the present disclosure is a cured product of the above-described curable composition, a color filter including the cured product, and a solid-state imaging element or an image display device including the color filter.

Methods for achieving the objects described above include the following aspects.
<1> A curable composition comprising:
a colorant;
a resin; and
a thiol compound,
in which a thiol value is $6 \times 10^{-6}$ mmol/g to $6 \times 10^{-4}$ mmol/g.
<2> A curable composition comprising:
a colorant;
a resin; and
a thiol compound,
in which a content of the thiol compound is 1 ppm to 99 ppm.
<3> The curable composition according to <1> or <2>,
in which the resin includes a resin having a carboxy group and a graft chain.
<4> The curable composition according to <3>,
in which the resin is a polyester resin which has a carboxy group directly bonded to a main chain and has a graft chain in a side chain.
<5> The curable composition according to <3> or <4>,
in which the graft chain is an addition polymerization-type resin chain.
<6> The curable composition according to any one of <3> to <5>,
in which the graft chain is an acrylic resin chain.
<7> The curable composition according to any one of <1> to <6>,
in which the resin is a resin obtained by reacting a hydroxy group in a vinyl polymer (a) which is produced by a radical polymerization of an ethylenically unsaturated monomer in the presence of a compound (a1) having two hydroxy groups and one thiol group in a molecule, and has two hydroxy groups in one terminal region, with an acid anhydride group in a tetracarboxylic acid anhydride (b).
<8> The curable composition according to any one of <1> to <7>,
in which the thiol compound includes a compound having two or more of at least one group selected from the group consisting of an ester bond and an amide bond, and one or more thiol groups.
<9> The curable composition according to any one of <1> to <8>,
in which the thiol compound includes a compound having two or more carboxy groups and one or more thiol groups.
<10> The curable composition according to any one of <1> to <9>,
in which the thiol compound includes at least one compound of the following compounds A to D,
compound A: a compound obtained by condensing a thiol compound having a hydroxy group with a polyvalent carboxylic acid compound or a polyvalent carboxylic acid anhydride,
compound B: a compound obtained by condensing a thiol compound having an amino group with a polyvalent carboxylic acid compound or a polyvalent carboxylic acid anhydride,
compound C: a compound obtained by condensing a thiol compound having two or more carboxy groups with a polyhydric alcohol compound,
compound D: a compound obtained by condensing a thiol compound having two or more carboxy groups with a polyvalent amine compound.
<11> The curable composition according to any one of <1> to <10>,
in which the thiol compound includes a thiol compound having a molecular weight of 300 or more.
<12> The curable composition according to any one of <1> to <11>, further comprising:
a polymerizable compound; and
a photopolymerization initiator.
<13> The curable composition according to any one of <1> to <12>, further comprising:
an ultraviolet absorber.
<14> The curable composition according to any one of <1> to <13>, further comprising:
a polymerization inhibitor.

<15> The curable composition according to <14>,
in which the polymerization inhibitor includes at least one compound selected from the group consisting of 2,2,6,6-tetramethylpiperidin-1-oxyl and 2,2,6,6-tetramethyl-4-hydroxypiperidin-1-oxyl.

<16> A cured product obtained by curing the curable composition according to any one of <1> to <15>.

<17> A color filter comprising:
the cured product according to <16>.

<18> A solid-state imaging element comprising:
the color filter according to <17>.

<19> An image display device comprising:
the color filter according to <17>.

According to the embodiment according to the present disclosure, a curable composition having an excellent edge shape of a patterned cured product to be obtained is provided.

According to another embodiment according to the present disclosure, a cured product of the above-described curable composition, a color filter including the cured product, and a solid-state imaging element or an image display device including the color filter are provided.

BRIEF DESCRIPTION OF THE DRAWINGS

FIG. 1 is a schematic view showing a measurement position of an undercut width in a cured product on a pattern in Example.

DESCRIPTION OF THE PREFERRED EMBODIMENTS

Hereinafter, the contents of the present disclosure will be described in detail. The configuration requirements will be described below based on the representative embodiments of the present disclosure, but the present disclosure is not limited to such embodiments.

In the present disclosure, a term "to" showing a range of numerical values is used as a meaning including a lower limit value and an upper limit value disclosed before and after the term.

In a range of numerical values described in stages in the present disclosure, the upper limit value or the lower limit value described in one range of numerical values may be replaced with an upper limit value or a lower limit value of the range of numerical values described in other stages. In addition, in a range of numerical values described in the present disclosure, the upper limit value or the lower limit value of the range of numerical values may be replaced with values shown in the examples.

Further, in the present disclosure, in a case where a plurality of substances corresponding to each component in a composition is present, the amount of each component in the composition means the total amount of the plurality of substances present in the composition, unless otherwise specified.

In addition, regarding a term of group (atomic group) in the present disclosure, a term with no description of "substituted" and "unsubstituted" includes both a group not including a substituent and a group including a substituent. For example, an "alkyl group" includes not only an alkyl group having no substituent (unsubstituted alkyl group), but also an alkyl group having a substituent (substituted alkyl group).

In the present disclosure, unless otherwise specified, "Me" represents a methyl group, "Et" represents an ethyl group, "Pr" represents a propyl group, "Bu" represents a butyl group, and "Ph" represents a phenyl group.

In the present disclosure, the concept of "(meth)acryl" includes both acryl and methacryl, and the concept of "(meth)acryloyl" includes both acryloyl and methacryloyl.

In addition, in the present disclosure, a term "step" includes not only the independent step but also a step in which intended purposes are achieved even in a case where the step cannot be precisely distinguished from other steps.

In the present disclosure, a "total solid content" refers to a total mass of components obtained by removing a solvent from the whole composition of the composition. In addition, a "solid content" is a component obtained by removing a solvent as described above, and for example, the component may be solid or may be liquid at 25° C.

In the present disclosure, the "main chain" represents a relatively longest binding chain in a molecule of a polymer compound constituting a resin, in which in a case where the binding chain has a ring structure, the entire ring structure is represented as the main chain, and the "side chain" represents an atomic group branched from the main chain.

In addition, in the present disclosure, "mass %" is identical to "weight %" and "part by mass" is identical to "part by weight".

Furthermore, in the present disclosure, a combination of two or more preferred aspects is a more preferred aspect.

In addition, the weight-average molecular weight (Mw) and the number-average molecular weight (Mn) in the present disclosure are molecular weights in terms of polystyrene used as a standard substance, which are detected by using a solvent tetrahydrofuran (THF), a differential refractometer, and a gel permeation chromatography (GPC) analysis apparatus using TSKgel GMHxL, TSKgel G4000HxL, and TSKgel G2000HxL (all trade names manufactured by Tosoh Corporation) as columns, unless otherwise specified.

In the present disclosure, a pigment means a colorant which is hardly dissolved in a solvent. For example, as the pigment, both of the solubility in 100 g of water at 23° C. and 100 g of propylene glycol monomethyl ether acetate at 23° C. is preferably 0.1 g or less and more preferably 0.01 g or less.

Hereinafter, the present disclosure will be described in detail.

(Curable Composition)

In a first embodiment of a curable composition according to the present disclosure, the curable composition includes a colorant, a resin, and a thiol compound, in which a thiol value is $6 \times 10^{-6}$ mmol/g to $6 \times 10^{4}$ mmol/g.

In a second embodiment of a curable composition according to the present disclosure, the curable composition includes a colorant, a resin, and a thiol compound, in which a content of the thiol compound is 1 ppm to 99 ppm.

Hereinafter, a term "curable composition according to the embodiment of the present disclosure" is used to describe both the first embodiment and the second embodiment of the curable composition according to the present disclosure.

The curable composition according to the embodiment of the present disclosure can be preferably used as a curable composition for a solid-state imaging element.

In addition, the curable composition according to the embodiment of the present disclosure can be preferably used as a curable composition for a color filter. Specifically, the curable composition according to the embodiment of the present disclosure can be preferably used as a curable composition for forming a pixel of a color filter, and can be more preferably used as a curable composition for forming a pixel of a color filter used in a solid-state imaging element.

In recent years, as the number of pixels of an image sensor has increased, the pattern has been finer and thinner. Along with this, the present inventors have found that, in a curable composition in the related art, among shapes of a patterned cured product to be obtained, an edge shape, which is a shape of the end part of the cured product, may not be sufficient.

Therefore, as a result of intensive studies, the present inventors have found that, by adopting the above-described first embodiment or the above-described second embodiment, the patterned cured product to be obtained has an excellent edge shape.

Since the curable composition according to the embodiment of the present disclosure includes the above-described thiol compound, and the thiol value is $6 \times 10^{-6}$ mmol/g to $6 \times 10^{-4}$ mmol/g or the content of the above-described thiol compound is 1 ppm to 99 ppm, it is presumed that curing properties are improved and development suppression of an exposed portion is excellent, especially during development, a reduction (undercut width) in a surface direction at the bottom and end part of the exposed portion is suppressed and the patterned cured product to be obtained has excellent edge shape.

In addition, since the curable composition according to the embodiment of the present disclosure includes the above-described thiol compound, and the thiol value is $6 \times 10^{-6}$ mmol/g to $6 \times 10^{4}$ mmol/g or the content of the above-described thiol compound is 1 ppm to 99 ppm, it is presumed that curing properties at the interface with other members such as a substrate is improved and adhesiveness of the cured product to be obtained is also excellent.

Further, since the curable composition according to the embodiment of the present disclosure includes the above-described thiol compound, and the thiol value is $6 \times 10^{-6}$ mmol/g to $6 \times 10^{-4}$ mmol/g or the content of the above-described thiol compound is 1 ppm to 99 ppm, it is presumed that the curing properties are improved, the shape and development suppression of the exposed portion and developability of a non-exposed portion are excellent, and the patterned cured product to be obtained has few defects.

Hereinafter, details of each component included in the curable composition according to the embodiment of the present disclosure, physical property values, and the like will be described.

<Thiol Compound>

In the first embodiment of the curable composition according to the present disclosure, the curable composition includes a thiol compound, in which a thiol value is $6 \times 10^{-6}$ mmol/g to $6 \times 10^{-4}$ mmol/g.

In the second embodiment of the curable composition according to the present disclosure, the curable composition includes a thiol compound, in which a content of the thiol compound is 1 ppm to 99 ppm.

In addition, in the curable composition according to the embodiment of the present disclosure, from the viewpoint of the edge shape of the patterned cured product to be obtained, adhesiveness, and defect suppression, it is preferable that the thiol value is $6 \times 10^{6}$ mmol/g to $6 \times 10^{4}$ mmol/g and the content of the thiol compound is 1 ppm to 99 ppm. Further, the curable composition according to the embodiment of the present disclosure may include only one kind of thiol compound or two or more kinds thereof.

In the first embodiment of the curable composition according to the present disclosure, the thiol value is $6 \times 10^{-6}$ mmol/g to $6 \times 10^{-4}$ mmol/g, and from the viewpoint of edge shape of the patterned cured product to be obtained, adhesiveness, and defect suppression, is preferably $1.0 \times 10^{5}$ mmol/g to $5.0 \times 10^{4}$ mmol/g, more preferably $9.0 \times 10^{5}$ mmol/g to $4.0 \times 10^{-4}$ mmol/g, still more preferably $1.0 \times 10^{-4}$ mmol/g to $4.0 \times 10^{-4}$ mmol/g, and particularly preferably $2.5 \times 10^{4}$ mmol/g to $4.0 \times 10^{4}$ mmol/g.

In the second embodiment of the curable composition according to the present disclosure, from the viewpoint of the edge shape of the patterned cured product to be obtained, adhesiveness, and defect suppression, the thiol value is preferably $6 \times 10^{-6}$ mmol/g to $6 \times 10^{4}$ mmol/g, more preferably $1.0 \times 10^{-5}$ mmol/g to $5.0 \times 10^{4}$ mmol/g, still more preferably $9.0 \times 10^{-5}$ mmol/g to $4.0 \times 10^{-4}$ mmol/g, even more preferably $1.0 \times 10^{4}$ mmol/g to $4.0 \times 10^{4}$ mmol/g, and particularly preferably $2.5 \times 10^{-4}$ mmol/g to $4.0 \times 10^{-4}$ mmol/g.

In the present disclosure, a measuring method of the thiol value of a curable composition is measured according to the following method.

1. Preparation of color solution: an acetone solution having 2.5 mM of 5,5'-dithiobis(2-nitrobenzoic acid) (DTNB) and 2.7 mM of triethylamine is prepared.
2. Preparation of sample for calibration curve: a solution diluted with an eluent for high performance liquid chromatography (HPLC) is prepared so that 3-mercaptopropionic acid is 0.1 M (mol/L).
3. Using the solution prepared in 2. to the solution prepared in 1., the sample added so that 3-mercaptopropionic acid is 0.2 mM is stirred at room temperature (25° C.) for 20 minutes. A sample for calibration curve is prepared by diluting 3-mercaptopropionic acid to which the above-described sample is added so as to be 0.1 ppm, 1 ppm, 10 ppm, and 100 ppm.
4. A mixed solution of 10 g of the sample to be measured and 50 mL of the solution prepared in 1. is stirred at room temperature for 20 minutes, and the reaction solution is put into a 100 mL volumetric flask, washed with 5 mL of acetone, and diluted in the volumetric flask with the eluent for HPLC.
5. The sample obtained in 4. is filtered and used as a measurement sample.
6. 2-nitro-5-mercaptobenzoic acid is quantified by the following HPLC measurement. From the measurement result of the sample for calibration curve, a calibration curve is obtained, and based on this, the mol amount of the thiol group included in the measurement sample is calculated and used as the thiol value.

<<HPLC Measurement Conditions>>

Eluent: an aqueous solution containing 0.2% of phosphoric acid and 0.2% of triethylamine is prepared, mixed with methanol, and adjusted to a ratio of 90/10 (aqueous solution/methanol)

Measuring equipment: Agilent-1200 (manufactured by Agilent Technologies, Inc.)

Column: Synergi 4u Polar-RP 80A manufactured by Phenomenex; 250 mm×4.60 mm (inner diameter)+guard column Column temperature: 40° C.

Analysis time: 15 minutes

Flow rate: 1.0 mL/min (maximum liquid feeding pressure: 182 bar (18.2 MPa))

Injection amount: 5 μL

Detection wavelength: 412 nm

In the second embodiment of the curable composition according to the present disclosure, the content of the thiol compound is 1 ppm to 99 ppm, and from the viewpoint of the edge shape of the patterned cured product to be obtained, adhesiveness, and defect suppression, is preferably 10 ppm to 80 ppm, more preferably 20 ppm to 70 ppm, and particularly preferably 30 ppm to 60 ppm.

In the first embodiment of the curable composition according to the present disclosure, from the viewpoint of the edge shape of the patterned cured product to be obtained, adhesiveness, and defect suppression, the content of the thiol compound is preferably 1 ppm to 99 ppm, more preferably 10 ppm to 80 ppm, still more preferably 20 ppm to 70 ppm, and particularly preferably 30 ppm to 60 ppm.

In the present disclosure, ppm represents ppm by mass unless otherwise specified.

In the present disclosure, a measuring method of the content of the thiol compound of a curable composition is measured according to the following method.

1. Cu-immobilized column: a column is prepared by passing 50 mL of a 1,000 ppm copper sulfate aqueous solution through a solid phase (MetaSEP IC-ME: GL Sciences Inc.) filled with a chelate resin.
2. The metal-immobilized column is passed through a column in the order of 10 mL of ultrapure water, 5 mL of methanol, and 5 mL of dichloromethane to prepare the metal-immobilized column for measurement.
3. 1 g of a measurement sample is put into a 10 mL volumetric flask and diluted with dichloromethane. This liquid is passed through the metal-immobilized column to adsorb the thiol compound, and the metal-immobilized column adsorbing the thiol compound is recovered.
4. By a thermal decomposition gas chromatograph mass spectrometry of the metal-immobilized column on which the thiol compound is adsorbed in 3., the temperature at which the adsorbed thiol compound volatilizes is confirmed.

<<Thermal Decomposition Gas Chromatograph Mass Spectrometry Measurement Conditions>>

Thermal decomposition gas chromatograph device: multi-shot pyrolyzer EGA/PY-3030D (manufactured by Frontier Laboratories Ltd.)

Thermal analysis condition: generated gas analysis

Thermal decomposition gas chromatograph conditions: reactor temperature 50° C. to 800° C. temperature range (held for 1 minute), interface temperature 320° C.

Analytical instrument: 6890N GC, 5973N MSD (manufactured by Agilent Technologies, Inc.)

Column: HP-5MS, 30 m (length)×0.25 mm (inner diameter), 0.25 μm (film thickness) (manufactured by Agilent Technologies, Inc.)

Split ratio: 1/50

Carrier gas, flow rate: He gas, 1 mL/min

Injection port temperature: 250° C.

Oven temperature: 40° C. (3 minutes)→5° C./min→200° C. (0 minutes: reaching temperature)→10° C./min→320° C. (3 minutes)

Mass range: m/z 10 to 500

5. By a thermogravimetric analysis of the metal-immobilized column on which the thiol compound is adsorbed in 3., the content of the thiol compound is calculated with the amount of weight fluctuation at the temperature of 4., at which the thiol compound volatilizes.

<<Thermogravimetric Analysis Measurement Conditions>>

Analytical instrument: TGA 550 (manufactured by TA Instruments)

Thermal analysis condition: the temperature is raised at 10° C./min, and in a case where the temperature at which each thiol compound volatilizes is reached, the temperature is maintained for 30 minutes.

It is sufficient that the thiol compound in the present disclosure is a compound having one or more thiol groups (mercapto groups), and the thiol compound may be a low-molecular-weight compound or a high-molecular weight compound.

From the viewpoint of the edge shape of the patterned cured product to be obtained, adhesiveness, and defect suppression, the above-described thiol compound included in the curable composition according to the embodiment of the present disclosure preferably includes a compound having two or more of at least one group selected from the group consisting of an ester bond and an amide bond, and one or more thiol groups, and more preferably includes a compound having two or more ester bonds and one or more thiol groups.

In addition, from the viewpoint of the edge shape of the patterned cured product to be obtained, adhesiveness, and defect suppression, the above-described thiol compound included preferably includes a compound having two or more carboxy groups and one or more thiol groups, more preferably includes a compound having two or more of at least one group selected from the group consisting of an ester bond and an amide bond, two or more carboxy groups, and one or more thiol groups, and particularly preferably includes a compound having two or more ester bonds, two or more carboxy groups, and one or more thiol groups.

In a case where the above-described thiol compound includes a thiol compound having a carboxy group, from the viewpoint of the edge shape of the patterned cured product to be obtained, adhesiveness, and defect suppression, the number of carboxy groups in the thiol compound having a carboxy group is preferably 2 to 15.

Further, from the viewpoint of the edge shape of the patterned cured product to be obtained, adhesiveness, and defect suppression, the above-described thiol compound preferably has an ethylenically unsaturated bond.

Further, from the viewpoint of the edge shape of the patterned cured product to be obtained, adhesiveness, and defect suppression, the above-described thiol compound preferably includes at least one compound of the following compounds A to D, and more preferably includes the following compound A.

compound A: a compound obtained by condensing a thiol compound having a hydroxy group with a polyvalent carboxylic acid compound or a polyvalent carboxylic acid anhydride, compound B: a compound obtained by condensing a thiol compound having an amino group with a polyvalent carboxylic acid compound or a polyvalent carboxylic acid anhydride, compound C: a compound obtained by condensing a thiol compound having two or more carboxy groups with a polyhydric alcohol compound, compound D: a compound obtained by condensing a thiol compound having two or more carboxy groups with a polyvalent amine compound.

As the thiol compound having a hydroxy group, used in the above-described synthesis of compound A, from the viewpoint of the edge shape of the patterned cured product to be obtained, adhesiveness, and defect suppression, a compound having one or more hydroxy groups and one thiol group is preferable, a compound having one or two hydroxy groups and one thiol group is more preferable, and a compound having two hydroxy groups and one thiol group is particularly preferable.

As the polyvalent carboxylic acid compound or polyvalent carboxylic acid anhydride used in the above-described synthesis of compound A or compound B, from the viewpoint of the edge shape of the patterned cured product to be obtained, adhesiveness, and defect suppression, a divalent to octavalent polyvalent carboxylic acid compound or a divalent to octavalent polyvalent carboxylic acid anhydride is preferable, a divalent or tetravalent polyvalent carboxylic acid compound or a divalent or tetravalent polyvalent carboxylic acid anhydride is more preferable, a divalent or tetravalent polyvalent carboxylic acid anhydride is still more preferable, and a tetravalent polyvalent carboxylic acid anhydride is particularly preferable.

In addition, from the viewpoint of the edge shape of the patterned cured product to be obtained, adhesiveness, and defect suppression, the number of carbon atoms in the polyvalent carboxylic acid compound or polyvalent carboxylic acid anhydride used in the above-described synthesis of compound A or compound B is preferably 4 to 16, more preferably 2 to 12, and particularly preferably 10 to 12.

Further, from the viewpoint of the edge shape of the patterned cured product to be obtained, adhesiveness, and defect suppression, the polyvalent carboxylic acid compound or polyvalent carboxylic acid anhydride used in the above-described synthesis of compound A or compound B preferably has an ethylenically unsaturated bond.

As the thiol compound having an amino group, used in the above-described synthesis of compound B, from the viewpoint of the edge shape of the patterned cured product to be obtained, adhesiveness, and defect suppression, a compound having one or more amino groups and one thiol group is preferable, a compound having one or two amino groups and one thiol group is more preferable, and a compound having two amino groups and one thiol group is particularly preferable.

As the thiol compound having two or more carboxy groups, used in the above-described synthesis of compound C or compound D, from the viewpoint of the edge shape of the patterned cured product to be obtained, adhesiveness, and defect suppression, a compound having two or more carboxy groups and one thiol group is preferable, a compound having two to eight carboxy groups and one thiol group is more preferable, and a compound having two carboxy groups and one thiol group is particularly preferable.

As the polyhydric alcohol compound used in the above-described synthesis of compound C, from the viewpoint of the edge shape of the patterned cured product to be obtained, adhesiveness, and defect suppression, a polyhydric aliphatic alcohol compound is preferable, a dihydric aliphatic alcohol compound is more preferable, and an alkanediol compound is particularly preferable.

In addition, from the viewpoint of the edge shape of the patterned cured product to be obtained, adhesiveness, and defect suppression, the number of carbon atoms in the polyhydric alcohol compound used in the above-described synthesis of compound C is preferably 2 to 10, more preferably 2 to 8, and particularly preferably 3 to 6.

As the polyvalent amine compound used in the above-described synthesis of compound D, from the viewpoint of the edge shape of the patterned cured product to be obtained, adhesiveness, and defect suppression, a polyvalent aliphatic amine compound is preferable, a divalent aliphatic amine compound is more preferable, and an alkanediamine compound is particularly preferable.

In addition, from the viewpoint of the edge shape of the patterned cured product to be obtained, adhesiveness, and defect suppression, the number of carbon atoms in the polyvalent amine compound used in the above-described synthesis of compound D is preferably 2 to 10, more preferably 2 to 8, and particularly preferably 3 to 6.

The thiol compound having a hydroxy group, an amino group, or two or more carboxy groups, used in the above-described synthesis of compounds A to D, may be an aliphatic thiol compound or an aromatic thiol compound, but from the viewpoint of the edge shape of the patterned cured product to be obtained, adhesiveness, and defect suppression, an aliphatic thiol compound is preferable.

In addition, from the viewpoint of the edge shape of the patterned cured product to be obtained, adhesiveness, and defect suppression, the number of carbon atoms in the thiol compound having a hydroxy group, an amino group, or two or more carboxy groups, used in the above-described synthesis of compounds A to D, is preferably 2 to 8, more preferably 2 to 6, and particularly preferably 3 or 4.

The ratio of the thiol compound having a hydroxy group and the polyvalent carboxylic acid compound or polyvalent carboxylic acid anhydride used in the above-described synthesis of compound A is preferably 5:1 to 1:5, more preferably 2.5:1 to 1:2.5, and particularly preferably 2:1 to 1:2 in a mass ratio.

The ratio of the thiol compound having an amino group and the polyvalent carboxylic acid compound or polyvalent carboxylic acid anhydride used in the above-described compound B is preferably 5:1 to 1:5, more preferably 2.5:1 to 1:2.5, and particularly preferably 2:1 to 1:2 in a mass ratio.

The ratio of the thiol compound having two or more carboxy groups and the polyhydric alcohol compound used in the above-described synthesis of compound C is preferably 5:1 to 1:5, more preferably 2.5:1 to 1:2.5, and particularly preferably 2:1 to 1:2 in a mass ratio.

The ratio of the thiol compound having two or more carboxy groups and the polyvalent amine compound used in the above-described synthesis of compound D is preferably 5:1 to 1:5, more preferably 2.5:1 to 1:2.5, and particularly preferably 2:1 to 1:2 in a mass ratio.

In addition, from the viewpoint of the edge shape of the patterned cured product to be obtained, adhesiveness, and defect suppression, the above-described thiol compound preferably includes a compound having a structure represented by any one of Formula (S-1), Formula (S-2), or Formula (S-3), more preferably includes a compound having a structure represented by Formula (S-1) or Formula (S-2), and particularly preferably includes a compound having a structure represented by Formula (S-1).

Further, from the viewpoint of the edge shape of the patterned cured product to be obtained, adhesiveness, and defect suppression, the above-described thiol compound more preferably includes a compound having two or more structures represented by any one of Formula (S-1), Formula (S-2), or Formula (S-3).

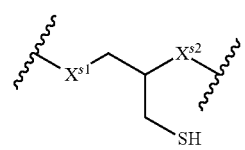

(S-1)

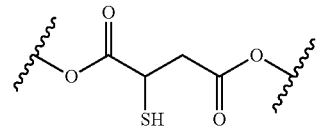

(S-2)

-continued

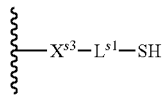
(S-3)

In Formulae (S-1) to (S-3), $X^{s1}$ to $X^{s3}$ each independently represent O, $NR^s$, or COO, $R^s$ represents a hydrogen atom or an alkyl group, $L^{s1}$ represents an alkylene group having 2 to 8 carbon atoms or an arylene group having 6 to 10 carbon atoms, and a wavy line portion represents a bonding position with other structures.

$X^{s1}$ and $X^{s2}$ in Formula (S-1) are each independently preferably O or $NR^s$ and more preferably O.

In addition, it is preferable that $X^{s1}$ and $X^{s2}$ in Formula (S-1) have the same group.

$X^{s3}$ in Formula (S-3) is preferably O or $NR^s$ and more preferably O.

$L^{s1}$ in Formula (S-3) is preferably an alkylene group having 2 to 8 carbon atoms or a phenylene group, more preferably an alkylene group having 2 to 8 carbon atoms, and particularly preferably a linear alkylene group having 2 to 8 carbon atoms.

From the viewpoint of the edge shape of the patterned cured product to be obtained, adhesiveness, and defect suppression, the above-described thiol compound preferably includes a thiol compound having a molecular weight of 300 or more, more preferably includes a thiol compound having a molecular weight of 300 to 100,000, still more preferably includes a thiol compound having a molecular weight of 500 to 80,000, and particularly preferably includes a thiol compound having a molecular weight of 1,000 to 50,000.

From the viewpoint of the edge shape of the patterned cured product to be obtained, adhesiveness, and defect suppression, the acid value of the above-described thiol compound is preferably 100 mgKOH/g or more, more preferably 200 mgKOH/g or more, still more preferably 200 mgKOH/g to 800 mgKOH/g, and particularly preferably 200 mgKOH/g to 600 mgKOH/g.

The acid value of a compound or resin in the present disclosure is determined by a neutralization titration using a sodium hydroxide aqueous solution. Specifically, the obtained compound or resin is dissolved in a solvent, the solution is titrated with a sodium hydroxide aqueous solution using a potential difference measurement method to calculate the number of millimoles of the acid included in 1 g of the solid resin, and then the acid value is determined by multiplying the calculated value by 56.1 as a molecular weight of potassium hydroxide (KOH). The unit of the acid value is mgKOH/g.

Suitable examples of the above-described thiol compound include compounds shown below, but it is needless to say that the above-described thiol compound is not limited thereto.

T1-1: compound shown below, thiol value: 6.66 mmol/g, acid value: 747 mgKOH/g

T1-2: compound shown below, thiol value: 5.05 mmol/g, acid value: 566 mgKOH/g

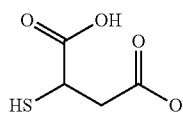

T1-1

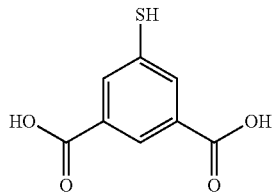

T1-2

—Compound A: Compound Obtained by Condensing Thiol Compound Having Hydroxy Group with Polyvalent Carboxylic Acid Compound or Polyvalent Carboxylic Acid Anhydride—

T2-1 to T2-5: compounds obtained by condensing the following two compounds at the molar ratio shown below

| | Thiol compound having hydroxy group | Molar ratio | Polyvalent carboxylic acid compound | Molar ratio | Thiol value (mmol/g) | Acid value (mgKOH/g) |
|---|---|---|---|---|---|---|
| T2-1 | HO~~SH | 2 | (pyromellitic dianhydride) | 1 | 5.34 | 300 |
| T2-2 | HO~~~~~~SH | 2 | (pyromellitic dianhydride) | 1 | 4.11 | 231 |
| T2-3 | HO-CH(OH)-CH2-SH | 1 | (succinic anhydride) | 2 | 4.80 | 539 |

| | Thiol compound having hydroxy group | Molar ratio | Polyvalent carboxylic acid compound | Molar ratio | Thiol value (mmol/g) | Acid value (mgKOH/g) |
|---|---|---|---|---|---|---|
| T2-4 | 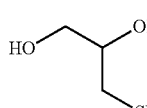 | 1 | 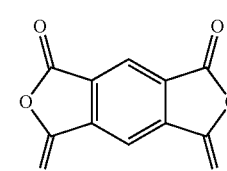 | 1 | 3.06 | 344 |
| T2-5 | 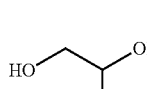 | 1 |  | 1 | 2.81 | 315 |

—Compound B: Compound Obtained by Condensing Thiol Compound Having Amino Group with Polyvalent Carboxylic Acid Compound or Polyvalent Carboxylic Acid Anhydride—

T3-1 to T3-3: compounds obtained by condensing the following two compounds at the molar ratio shown below

| | Thio compound having amino group | Molar ratio | Polyvalent carboxylic acid compound | Molar ratio | Thiol value (mmol/g) | Acid value (mgKOH/g) |
|---|---|---|---|---|---|---|
| T3-1 | 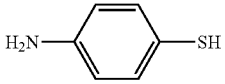 | 2 | 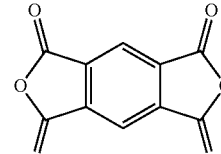 | 1 | 4.27 | 239 |
| T3-2 | 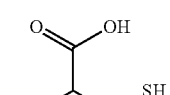 | 2 | 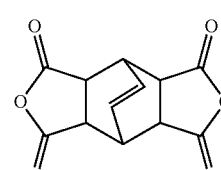 | 1 | 4 08 | 458 |
| T3-3 | 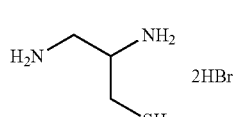 | 1 | 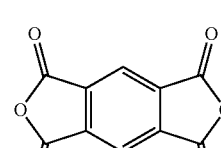 | 1 | 3 08 | 346 |

—Compound C: Compound Obtained by Condensing Thiol Compound Having Two or More Carboxy Groups with Polyhydric Alcohol Compound—
  T4-1: compound obtained by condensing the following two compounds at the molar ratio shown below

| Thiol compound having two or more carboxy groups | Molar ratio | Polyhydric alcohol compound | Molar ratio | Thiol value (mmol/g) | Acid value (mgKOH/g) |
|---|---|---|---|---|---|
| T4-1 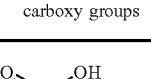 | 2 | 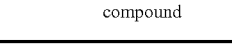 | 1 | 5.12 | 287 |

—Compound D: Compound Obtained by Condensing Thiol Compound Having Two or More Carboxy Groups with Polyvalent Amine Compound—
  T5-1: compound obtained by condensing the following two compounds at the molar ratio shown below

| Thiol compound having two or more carboxy groups | Molar ratio | Polyvalent amine compound | Molar ratio | Thiol value (mmol/g) | Acid value (mgKOH/g) |
|---|---|---|---|---|---|
| T5-1 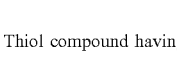 | 2 |  | 1 | 5 34 | 300 |

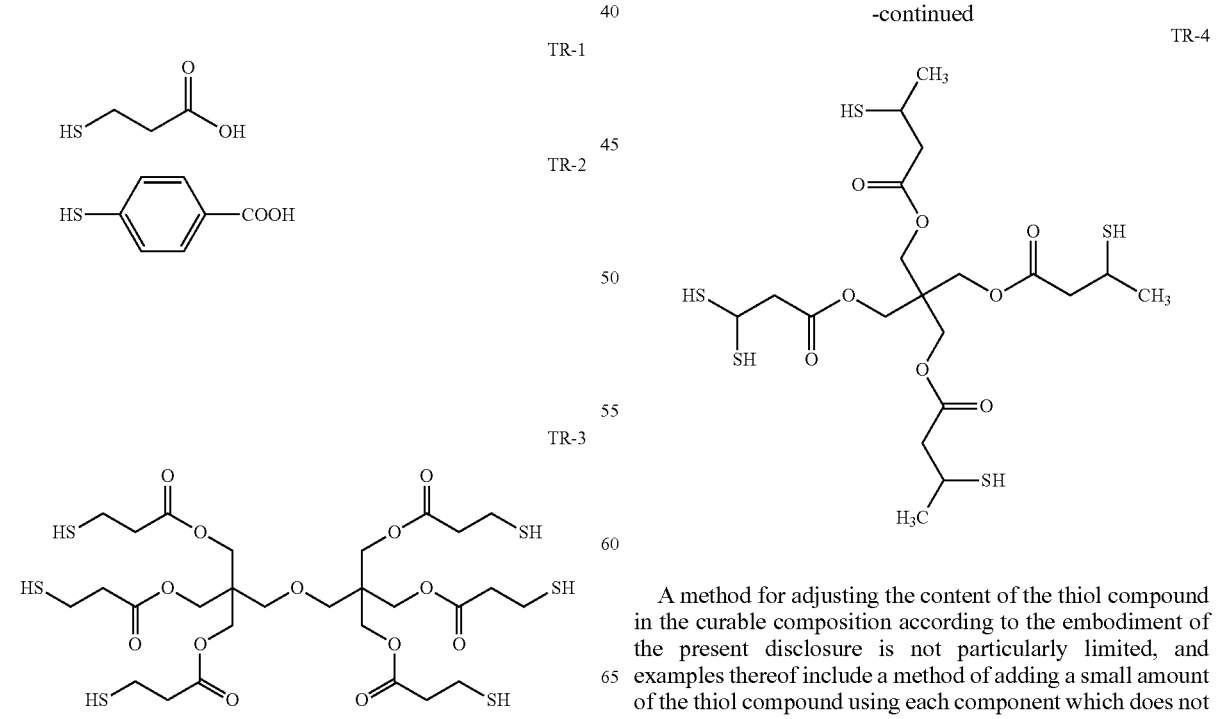

A method for adjusting the content of the thiol compound in the curable composition according to the embodiment of the present disclosure is not particularly limited, and examples thereof include a method of adding a small amount of the thiol compound using each component which does not include the thiol compound, and a method of, in a case where a large amount of the thiol compound is included as an impurity, adding an oxidizing agent to oxidize the excess thiol compound to a disulfide compound, so that the content of the thiol compound is reduced.

In the curable composition according to the embodiment of the present disclosure, from the viewpoint of the edge shape of the patterned cured product to be obtained, adhesiveness, and defect suppression, a mass ratio ($M^P/M^T$) of a content $M^T$ of the thiol compound to a content MP of the resin is preferably $0.05 \times 10^{-6}$ to $5 \times 10^{-6}$, more preferably $1 \times 10^{-6}$ to $5 \times 10^{-6}$, and particularly preferably $1.5 \times 10^{-6}$ to $4 \times 10^{-6}$.

<Colorant>

The curable composition according to the embodiment of the present disclosure includes a colorant.

As the colorant, a known colorant can be used, and examples thereof include a pigment and a dye.

<<Pigment>>

The curable composition according to the embodiment of the present disclosure preferably contains a pigment.

Examples of the pigment include a white pigment, a black pigment, a chromatic pigment, and a near-infrared absorbing pigment. In the present disclosure, the white pigment includes not only a pure white pigment but also a bright gray (for example, grayish-white, light gray, and the like) pigment close to white. In addition, the pigment may be an inorganic pigment or an organic pigment, but from the viewpoint that dispersion stability is more easily improved, an organic pigment is preferable. In addition, as the pigment, a pigment having a maximal absorption wavelength in a wavelength range of 400 nm to 2,000 nm is preferable, and a pigment having a maximal absorption wavelength in a wavelength range of 400 nm to 700 nm is more preferable. In addition, in a case of using a pigment (preferably a chromatic pigment) having a maximal absorption wavelength in a wavelength range of 400 nm to 700 nm, the curable composition according to the embodiment of the present disclosure can be preferably used as a curable composition for forming a colored layer in a color filter. Examples of the colored layer include a red-colored layer, a green-colored layer, a blue-colored layer, a magenta-colored layer, a cyan-colored layer, and a yellow-colored layer.

The average primary particle diameter of the pigment is preferably 1 nm to 200 nm. The lower limit is preferably 5 nm or more and more preferably 10 nm or more. The upper limit is preferably 180 nm or less, more preferably 150 nm or less, and still more preferably 100 nm or less. In a case where the average primary particle diameter of the pigment is within the above-described range, dispersion stability of the pigment in the curable composition is good. In the present disclosure, the primary particle diameter of the pigment can be determined from an image obtained by observing primary particles of the pigment using a transmission electron microscope. Specifically, a projected area of the primary particles of the pigment is determined, and the corresponding equivalent circle diameter is calculated as the primary particle diameter of the pigment. In addition, the average primary particle diameter in the present disclosure is the arithmetic average value of the primary particle diameters with respect to 400 primary particles of the pigment. In addition, the primary particle of the pigment refers to a particle which is independent without aggregation.

—Chromatic Pigment—

The chromatic pigment is not particularly limited, and a known chromatic pigment can be used. Examples of the chromatic pigment include a pigment having a maximal absorption wavelength in a wavelength range of 400 nm to 700 nm. Examples thereof include a yellow pigment, an orange pigment, a red pigment, a green pigment, a violet pigment, and a blue pigment. Specific examples of these pigments include the following pigments.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, 215, 228 (direct connection-type quinophthalone dimer described in WO2013/098836A), 231, 232 (methine-based), 233 (quinoline-based), 234 (aminoketone-based), 235 (aminoketone-based), 236 (aminoketone-based), and the like (all of which are yellow pigments);

C. I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, 294 (xanthene-based, Organo Ultramarine, Bluish Red), 295 (monoazo-based), 296 (diazo-based), 297 (aminoketone-based), and the like (all of which are red pigments);

C. I. Pigment Green 7, 10, 36, 37, 58, 59, 62, and 63 (all of which are green pigments);

C. I. Pigment Violet 1, 19, 23, 27, 32, 37, 42, 60 (triarylmethane-based), 61 (xanthene-based), and the like (all of which are violet pigments); and C. I. Pigment Blue 1, 2, 15, 15:1, 15:2, 15:3, 15:4, 15:6, 16, 22, 60, 64, 66, 79, 80, 87 (monoazo-based), 88 (methine-based), and the like (all of which are blue pigments).

As the green pigment, a halogenated zinc phthalocyanine compound having an average number of halogen atoms in one molecule of 10 to 14, an average number of bromine atoms in one molecule of 8 to 12, and an average number of chlorine atoms in one molecule of 2 to 5 can also be used. As specific examples thereof, compounds described in WO2015/118720A, compounds described in CN2010-6909027A, a phthalocyanine compound having a phosphoric acid ester as a ligand, and the like can also be used.

In addition, as the green pigment, green pigments described in JP2019-8014A or JP2018-180023A may be used.

An aluminum phthalocyanine compound having a phosphorus atom can also be used as the blue pigment. Specific examples thereof include the compounds described in paragraphs 0022 to 0030 of JP2012-247591A and paragraph 0047 of JP2011-157478A.

In addition, a pigment described in JP2017-201003A and a pigment described in JP2017-197719A can be used as the yellow pigment. In addition, as the yellow pigment, a metal azo pigment which includes at least one kind of an anion selected from the group consisting of an azo compound represented by Formula (Y) and an azo compound having a tautomeric structure of the azo compound represented by Formula (Y), two or more kinds of metal ions, and a melamine compound can be used.

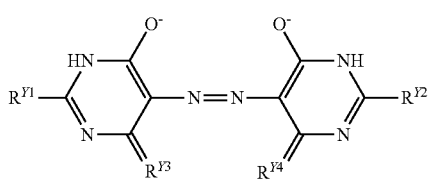

(Y)

In Formula (Y), $R^{Y1}$ and $R^{Y2}$ each independently represent —OH or $NR^{Y5}R^{Y6}$, $R^{Y3}$ and $R^{Y4}$ each independently represent =O or =$NR^{Y7}$, and $R^{Y5}$ to $R^{Y7}$ each independently represent a hydrogen atom or an alkyl group.

The alkyl group represented by $R^{Y5}$ to $R^{Y7}$ preferably has 1 to 10 carbon atoms, more preferably has 1 to 6 carbon atoms, and still more preferably has 1 to 4 carbon atoms. The above-described alkyl group may be linear, branched, or cyclic, and is preferably linear or branched and more preferably linear. The above-described alkyl group may have a substituent. Preferred examples of the substituent include a halogen atom, a hydroxy group, an alkoxy group, a cyano group, and an amino group.

The details of the metal azo pigment can be found in paragraphs 0011 to 0062 and 0137 to 0276 of JP2017-171912A, paragraphs 0010 to 0062 and 0138 to 0295 of JP2017-171913A, paragraphs 0011 to 0062 and 0139 to 0190 of JP2017-171914A, and paragraphs 0010 to 0065 and 0142 to 0222 of JP2017-171915A, the contents of which are incorporated herein by reference.

In addition, as the yellow pigment, a quinophthalone dimer represented by Formula (Q) can also be suitably used. Further, a quinophthalone dimer described in JP6443711B can also be suitably used.

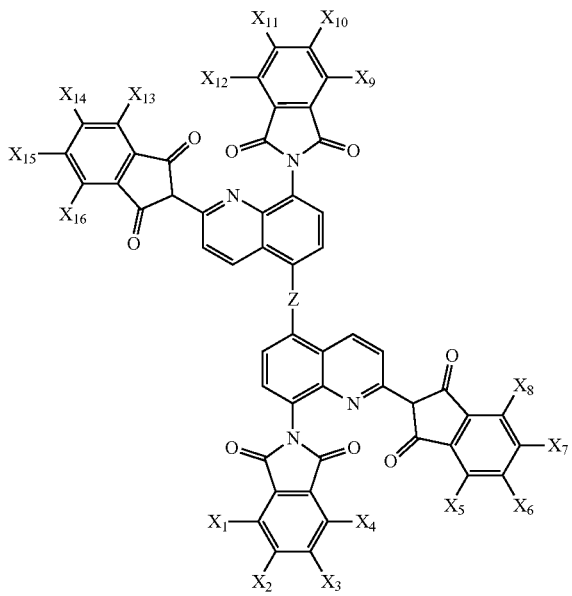

(Q)

In Formula (Q), $X_1$ to $X_{16}$ each independently represent a hydrogen atom or a halogen atom, and Z represents an alkylene group having 1 to 3 carbon atoms.

As the yellow pigment, quinophthalone pigments described in JP2018-203798A, JP2018-62578A, JP6432077B, JP6432076B, JP2018-155881A, JP2018-111757A, JP2018-40835A, JP2017-197640A, JP2016-145282A, JP2014-85565A, JP2014-21139A, JP2013-209614A, JP2013-209435A, JP2013-181015A, JP2013-61622A, JP2013-54339A, JP2013-32486A, JP2012-226110A, JP2008-74987A, JP2008-81565A, JP2008-74986A, JP2008-74985A, JP2008-50420A, JP2008-31281A, or JP1973-32765B (JP-S48-32765B) can also be suitably used.

In addition, as the yellow pigment, quinophthalone compounds described in paragraphs 0011 to 0034 of JP2013-54339A, quinophthalone compounds described in paragraphs 0013 to 0058 of JP2014-26228A, yellow pigments described in JP2019-8014A, quinophthalone compounds described in JP6607427B, compounds described in KR10-2014-0034963A, compounds described in JP2017-095706A, compounds described in TW2019-20495A, compounds described in JP6607427B, and the like can also be used.

In addition, as the yellow pigment, compounds described in JP2018-62644A can also be used. These compounds can also be used as a pigment derivative.

Further, as described in JP2018-155881A, C. I. Pigment Yellow 129 may be added for the purpose of improving weather fastness.

As the red pigment, diketopyrrolopyrrole-based pigments described in JP2017-201384A, in which the structure has at least one substituted bromine atom, diketopyrrolopyrrole-based pigments described in paragraphs 0016 to 0022 of JP6248838B, diketopyrrolopyrrole compounds described in WO2012/102399A, diketopyrrolopyrrole compounds described in WO2012/117965A, naphtholazo compounds described in JP2012-229344, and the like can also be used.

Further, as the red pigment, red pigments described in JP6516119B or JP6525101B can also be suitably used.

In addition, as the red pigment, a compound having a structure that an aromatic ring group in which a group bonded with an oxygen atom, a sulfur atom, or a nitrogen atom is introduced to an aromatic ring is bonded to a diketopyrrolopyrrole skeleton can be used. As the compound, a compound represented by Formula (DPP1) is preferable, and a compound represented by Formula (DPP2) is more preferable.

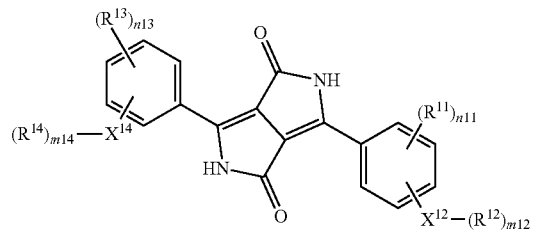

(DPP1)

(DPP2)

In the formulae, $R^{11}$ and $R^{13}$ each independently represent a substituent, $R^{12}$ and $R^{14}$ each independently represent a hydrogen atom, an alkyl group, an aryl group, or a heteroaryl group, n11 and n13 each independently represent an integer of 0 to 4, $X^{12}$ and $X^{14}$ each independently represent an oxygen atom, a sulfur atom, or a nitrogen atom, in a case where $X^{12}$ is an oxygen atom or a sulfur atom, m12 represents 1, in a case where $X^{12}$ is a nitrogen atom, m12 represents 2, in a case where $X^4$ is an oxygen atom or a sulfur atom, m14 represents 1, and in a case where $X^{14}$ is a nitrogen atom, m14 represents 2. Preferred specific examples of the substituent represented by $R^{11}$ and $R^{13}$ include an alkyl group, an aryl group, a halogen atom, an acyl group, an alkoxycarbonyl group, an aryloxycarbonyl group, a heteroaryloxycarbonyl group, an amide group, a cyano group, a nitro group, a trifluoromethyl group, a sulfoxide group, and a sulfo group.

In the present disclosure, the chromatic pigment may be used in combination of two or more kinds thereof. In addition, in a case where the chromatic pigment is used in combination of two or more kinds thereof, the combination of two or more chromatic pigments may form black. Examples of such a combination include the following aspects (1) to (7). In a case where two or more chromatic pigments are included in the curable composition and the combination of two or more chromatic pigments forms black, the curable composition according to the embodiment of the present disclosure can be preferably used as the near-infrared transmitting filter.

(1) aspect in which a red pigment and a blue pigment are contained.
(2) aspect in which a red pigment, a blue pigment, and a yellow pigment are contained.
(3) aspect in which a red pigment, a blue pigment, a yellow pigment, and a violet pigment are contained.
(4) aspect in which a red pigment, a blue pigment, a yellow pigment, a violet pigment, and a green pigment are contained.
(5) aspect in which a red pigment, a blue pigment, a yellow pigment, and a green pigment are contained.
(6) aspect in which a red pigment, a blue pigment, and a green pigment are contained.
(7) aspect in which a yellow pigment and a violet pigment are contained.

In addition, in a case of a cyan-colored curable composition, as the colorant, it is preferable to include at least one phthalocyanine pigment selected from the group consisting of C. I. Pigment Blue 15:3 and C. I. Pigment Blue 15:4. Hereinafter, C. I. Pigment Blue 15:3 and C. I. Pigment Blue 15:4 are also collectively referred to as a specific phthalocyanine pigment.

From the reason that it is easy to obtain a cured film having spectral characteristics suitable for cyan color by increasing transmittance of visible light, the average secondary particle diameter of the specific phthalocyanine pigment is preferably 50 nm to 100 nm. From the viewpoint of light resistance, the lower limit is preferably 55 nm or more, and more preferably 60 nm or more. From the viewpoint of spectral characteristics, the upper limit is preferably 95 nm or less, and more preferably 90 nm or less.

In the present specification, the average secondary particle diameter of the pigment is measured by directly measuring the size of the secondary particle of the pigment from an electron micrograph using a transmission electron microscope (TEM). Specifically, the minor axis diameter and the major axis diameter of the secondary particle of each pigment are measured, and the average thereof is defined as the particle diameter of the pigment. Next, for each of the 100 pigments, the volume of each pigment is obtained by approximating it to a cube having the obtained particle diameter, and the volume average particle diameter is defined as the average secondary particle diameter.

In a case of a cyan-colored curable composition, the colorant contains the specific phthalocyanine pigment in an amount of preferably 50 mass % or more, more preferably 55 mass % or more, still more preferably 60 mass % or more, and particularly preferably 65 mass % or more with respect to the total mass of the colorant. The upper limit may be 100 mass %, 95 mass % or less, or 90 mass % or less.

In a case where the colorant used in the curable composition according to the embodiment of the present disclosure includes C. I. Pigment Blue 15:3 and C. I. Pigment Blue 15:4, the mass ratio of C. I. Pigment Blue 15:3 and C. I. Pigment Blue 15:4 is preferably 10 parts by mass to 1,000 parts by mass of C. I. Pigment Blue 15:4, more preferably 25 parts by mass to 400 parts by mass of C. I. Pigment Blue 15:4, and still more preferably 50 parts by mass to 200 parts by mass of C. I. Pigment Blue 15:4 with respect to 100 parts by mass of C. I. Pigment Blue 15:3.

—White Pigment—

Examples of the white pigment include titanium oxide, strontium titanate, barium titanate, zinc oxide, magnesium oxide, zirconium oxide, aluminum oxide, barium sulfate, silica, talc, mica, aluminum hydroxide, calcium silicate, aluminum silicate, hollow resin particles, and zinc sulfide. The white pigment is preferably particles having a titanium atom, more preferably titanium oxide. In addition, the white pigment is preferably a particle having a refractive index of 2.10 or more with respect to light having a wavelength of 589 nm. The above-mentioned refractive index is preferably 2.10 to 3.00 and more preferably 2.50 to 2.75.

In addition, as the white pigment, the titanium oxide described in "Titanium Oxide-Physical Properties and Applied Technology, written by Manabu Kiyono, pages 13 to 45, published in Jun. 25, 1991, published by Gihodo Shuppan Co., Ltd." can also be used.

The white pigment is not limited to a compound formed of a single inorganic substance, and may be particles combined with other materials. For example, it is preferable to use a particle having a pore or other materials therein, a particle having a number of inorganic particles attached to a core particle, or a core-shell composite particle composed of a core particle formed of polymer particles and a shell layer formed of inorganic nanoparticles. With regard to the core-shell composite particle composed of a core particle formed of polymer particles and a shell layer formed of inorganic nanoparticles, reference can be made to, for example, the descriptions in paragraphs 0012 to 0042 of JP2015-047520A, the contents of which are incorporated herein by reference.

As the white pigment, hollow inorganic particles can also be used. The hollow inorganic particles refer to inorganic particles having a structure with a cavity therein, and the cavity is enclosed by an outer shell. As the hollow inorganic particles, hollow inorganic particles described in JP2011-075786A, WO2013/061621A, JP2015-164881A, and the like can be used, the contents of which are incorporated herein by reference.

—Black Pigment—

The black pigment is not particularly limited, and a known black pigment can be used. Examples thereof include carbon black, titanium black, and graphite, and carbon black or titanium black is preferable and titanium black is more preferable. The titanium black is black particles containing a titanium atom, and is preferably lower titanium oxide or titanium oxynitride. The surface of the titanium black can be modified, as necessary, according to the purpose of improving dispersibility, suppressing aggregating properties, and the like. For example, the surface of the titanium black can be coated with silicon oxide, titanium oxide, germanium oxide, aluminum oxide, magnesium oxide, or zirconium oxide. In addition, a treatment with a water-repellent substance as described in JP2007-302836A can be performed. Examples of the black pigment include Color Index (C. I.) Pigment Black 1 and 7. It is preferable that the titanium black has a small primary particle diameter of the individual particles and has a small average primary particle diameter. Specifically, the average primary particle diameter thereof is preferably 10 to 45 nm. The titanium black can be used as a dispersion. Examples thereof include a dispersion which includes titanium black particles and silica particles and in which the content ratio of Si atoms to Ti atoms is adjusted to a range of 0.20 to 0.50. With regard to the dispersion, reference can be made to the description in paragraphs 0020 to 0105 of JP2012-169556A, the contents of which are incorporated herein by reference. Examples of a commercially available product of the titanium black include Titanium black 10S, 12S, 13R, 13M, 13M-C, 13R-N, 13M-T (trade name; manufactured by Mitsubishi Materials Corporation) and Tilack D (trade name; manufactured by Akokasei Co., Ltd.).

—Near-Infrared Absorbing Pigment—

The near-infrared absorbing pigment is preferably an organic pigment. In addition, the near-infrared absorbing pigment preferably has a maximal absorption wavelength in a wavelength range of more than 700 nm and 1,400 nm or less. In addition, the maximal absorption wavelength of the near-infrared absorbing pigment is preferably 1,200 nm or less, more preferably 1,000 nm or less, and still more preferably 950 nm or less. In addition, in the near-infrared absorbing pigment, $A_{550}/A_{max}$, which is a ratio of an absorbance $A_{550}$ at a wavelength of 550 nm to an absorbance $A_{max}$ at the maximal absorption wavelength, is preferably 0.1 or less, more preferably 0.05 or less, still more preferably 0.03 or less, and particularly preferably 0.02 or less. The lower limit is not particularly limited, but for example, may be 0.0001 or more or may be 0.0005 or more. In a case where the ratio of the above-described absorbance is within the above-described range, a near-infrared absorbing pigment excellent in visible transparency and near-infrared shielding properties can be obtained. In the present disclosure, the maximal absorption wavelength of the near-infrared absorbing pigment and values of absorbance at each wavelength are values obtained from an absorption spectrum of a film formed by using a curable composition including the near-infrared absorbing pigment.

The near-infrared absorbing pigment is not particularly limited, and examples thereof include a pyrrolopyrrole compound, a rylene compound, an oxonol compound, a squarylium compound, a cyanine compound, a croconium compound, a phthalocyanine compound, a naphthalocyanine compound, a pyrylium compound, an azurenium compound, an indigo compound, and a pyrromethene compound. Among these, at least one compound selected from the group consisting of a pyrrolopyrrole compound, a squarylium compound, a cyanine compound, a phthalocyanine compound, and a naphthalocyanine compound is preferable, and a pyrrolopyrrole compound or a squarylium compound is more preferable, and a pyrrolopyrrole compound is particularly preferable.

In addition, preferred examples of the pigment used in the present disclosure include a pigment having an X-ray diffraction pattern by a specific CuKα ray. Specific examples thereof include phthalocyanine pigments described in JP6561862B, diketopyrrolopyrrole pigments described in JP6413872B, and azo pigments (C. I. Pigment Red 269) described in JP6281345B.

The content of the pigment in the total solid content of the curable composition is preferably 5 mass % or more, more preferably 10 mass % or more, still more preferably 20 mass % or more, and even more preferably 30 mass % or more, and particularly preferably 40 mass % or more. The upper limit is preferably 80 mass % or less, more preferably 70 mass % or less, and still more preferably 60 mass % or less.

<<Dye>>

The curable composition according to the embodiment of the present disclosure can contain a dye. The dye is not particularly limited and a known dye can be used. The dye may be a chromatic dye or may be a near-infrared absorbing dye. Examples of the chromatic dye include a pyrazoleazo compound, an anilinoazo compound, a triarylmethane compound, an anthraquinone compound, an anthrapyridone compound, a benzylidene compound, an oxonol compound, a pyrazolotriazoleazo compound, a pyridoneazo compound, a cyanine compound, a phenothiazine compound, a pyrrolopyrazoleazomethine compound, a xanthene compound, a phthalocyanine compound, a benzopyran compound, an indigo compound, and a pyrromethene compound. In addition, the thiazole compound described in JP2012-158649A, the azo compound described in JP2011-184493A, or the azo compound described in JP2011-145540A can also be used. In addition, as yellow dyes, the quinophthalone compounds described in paragraphs 0011 to 0034 of JP2013-054339A, or the quinophthalone compounds described in paragraphs 0013 to 0058 of JP2014-026228A can be used. Examples of the near-infrared absorbing dye include a pyrrolopyrrole compound, a rylene compound, an oxonol compound, a squarylium compound, a cyanine compound, a croconium compound, a phthalocyanine compound, a naphthalocyanine compound, a pyrylium compound, an azurenium compound, an indigo compound, and a pyrromethene compound. In addition, the squarylium compounds described in JP2017-197437A, the squarylium compounds described in paragraphs 0090 to 0107 of WO2017/213047A, the pyrrole ring-containing compounds described in paragraphs 0019 to 0075 of JP2018-054760A, the pyrrole ring-containing compounds described in paragraphs 0078 to 0082 of JP2018-040955A, the pyrrole ring-containing compounds described in paragraphs 0043 to 0069 of JP2018-002773A, the squarylium compounds having an aromatic ring at the α-amide position described in paragraphs 0024 to 0086 of JP2018-041047A, the amide-linked squarylium compounds described in JP2017-179131A, the compounds having a pyrrole bis-type squarylium skeleton or a croconium skeleton described in JP2017-141215A, the dihydrocarbazole bis-type squarylium compounds described in JP2017-082029, the asymmetric compounds described in paragraphs 0027 to 0114 of JP2017-068120A, the pyrrole ring-containing compounds (carbazole type) described in JP2017-067963A, the phthalocyanine compounds described in JP6251530B, and the like can be used.

In addition, as the dye, methine dyes described in JP2019-073695A, methine dyes described in JP2019-073696A, methine dyes described in JP2019-073697A, and methine dyes described in JP2019-073698A can also be used.

The content of the dye in the total solid content of the curable composition is preferably 1 mass % or more, more preferably 5 mass % or more, and particularly preferably 10 mass % or more. The upper limit is not particularly limited, but is preferably 70 mass % or less, more preferably 65 mass % or less, and still more preferably 60 mass % or less.

In addition, the content of the dye is preferably 5 to 50 parts by mass with respect to 100 parts by mass of the pigment. The upper limit is preferably 45 parts by mass or less and more preferably 40 parts by mass or less. The lower limit is preferably 10 parts by mass or more and still more preferably 15 parts by mass or more.

In addition, it is also possible that the curable composition according to the embodiment of the present disclosure does not substantially contain the dye. The case where the curable composition according to the embodiment of the present disclosure does not substantially include the dye means that the content of the dye in the total solid content of the curable composition according to the embodiment of the present disclosure is preferably 0.1 mass % or less, more preferably 0.05 mass % or less, and particularly preferably 0 mass %.

In the curable composition according to the embodiment of the present disclosure, a coloring agent multimer can also be used. The coloring agent multimer is preferably a dye which is used after being dissolved in a solvent. In addition, the coloring agent multimer may form a particle. In a case where the coloring agent multimer is a particle, the coloring agent multimer is usually used in a state of being dispersed in a solvent. The coloring agent multimer in the particle state can be obtained by, for example, emulsion polymerization, and specific examples thereof include the compounds and production methods described in JP2015-214682A. The coloring agent multimer has two or more coloring agent structures in one molecule, and preferably has three or more coloring agent structures in one molecule. The upper limit is particularly not limited, but may be 100 or less. A plurality of coloring agent structures included in one molecule may be the same coloring agent structure or different coloring agent structures. The weight-average molecular weight (Mw) of the coloring agent multimer is preferably 2,000 to 50,000. The lower limit is more preferably 3,000 or more and still more preferably 6,000 or more. The upper limit is more preferably 30,000 or less and still more preferably 20,000 or less. As the coloring agent multimer, the compounds described in JP2011-213925A, JP2013-041097A, JP2015-028144A, JP2015-030742A, WO2016/031442A, or the like can also be used.

<Resin>

The curable composition according to the embodiment of the present disclosure includes a resin.

Suitable examples of the resin include a dispersant and a binder polymer.

The curable composition according to the embodiment of the present disclosure preferably includes a dispersant as the resin, and preferably includes a dispersant and a binder polymer.

The binder polymer in the present disclosure is blended in, for example, an application for dispersing particles such as a pigment in a composition or an application as a binder. Mainly, a resin which is used for dispersing particles such as a pigment is also referred to as a dispersant. However, such applications of the resin are only exemplary, and the resin can also be used for other purposes in addition to such applications.

The weight-average molecular weight (Mw) of the binder polymer is preferably 2,000 to 2,000,000. The upper limit is preferably 1,000,000 or less and more preferably 500,000 or less. The lower limit is preferably 3,000 or more and more preferably 5,000 or more.

Examples of the binder polymer include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamidoimide resin, a polyolefin resin, a cyclic olefin resin, a polyester resin, and a styrene resin. These resins may be used singly or as a mixture of two or more kinds thereof.

The binder polymer may have an acid group. Examples of the acid group include a carboxy group, a phosphoric acid group, a sulfo group, and a phenolic hydroxy group, and a carboxy group is preferable. Among these acid groups, one kind may be used alone, or two or more kinds may be used in combination. The resin having an acid group can also be used as an alkali-soluble resin.

The resin having an acid group is preferably a polymer having a carboxy group in the side chain. Specific examples thereof include methacrylic acid copolymers, acrylic acid copolymers, itaconic acid copolymers, crotonic acid copolymers, maleic acid copolymers, partially esterified maleic acid copolymers, alkali-soluble phenol resins such as novolak resin, acidic cellulose derivatives having a carboxy group in the side chain, and resins in which an acid anhydride is added to a polymer having a hydroxy group. In particular, a copolymer of a (meth)acrylic acid and another monomer copolymerizable therewith is suitable.

Preferred examples of the resin having an acid group also include polymers described in paragraphs 0153 to 0167 of JP2018-173660A.

With regard to the resin having an acid group, reference can be made to the description in paragraphs 0558 to 0571 of JP2012-208494A (paragraphs 0685 to 0700 of the corresponding US2012/0235099A) and the description in paragraphs 0076 to 0099 of JP2012-198408A, the contents of which are incorporated herein by reference. A commercially available product can also be used as the resin having an acid group.

The acid value of the resin having an acid group is preferably 30 mgKOH/g to 200 mgKOH/g. The lower limit is preferably 50 mgKOH/g or more and more preferably 70 mgKOH/g or more. The upper limit is preferably 150 mgKOH/g or less and more preferably 120 mgKOH/g or less.

The curable composition according to the embodiment of the present disclosure preferably includes a resin as a dispersant.

Examples of the dispersant include an acidic dispersant (acidic resin) and a basic dispersant (basic resin). Here, the acidic dispersant (acidic resin) represents a resin in which the amount of the acid group is larger than the amount of the basic group. The acidic dispersant (acidic resin) is preferably a resin in which the amount of the acid group occupies 70 mol % or more in a case where the total amount of the acid group and the basic group is 100 mol %, and more preferably a resin substantially consisting of only an acid group. The acid group included in the acidic dispersant (acidic resin) is preferably a carboxy group. The acid value of the acidic dispersant (acidic resin) is preferably 40 mgKOH/g to 105 mgKOH/g, more preferably 50 mgKOH/g to 105 mgKOH/g, and still more preferably 60 mgKOH/g to 105 mgKOH/g. In addition, the basic dispersant (basic resin) represents a resin in which the amount of the basic group is larger than the amount of the acid group. The basic dispersant (basic resin) is preferably a resin in which the amount of the basic group is more than 50 mol % in a case where the total amount of the acid group and the basic group is 100 mol %. The basic group included in the basic dispersant is preferably an amino group.

The resin used as the dispersant preferably includes a structural repeating unit having an acid group. By the resin, which is used as the dispersant, including the structural repeating unit having an acid group, in a case where a pattern is formed using a photolithography method, the amount of residues generated in a base of a pixel can be reduced.

It is also preferable that the resin used as a dispersant is a graft resin.

It is preferable that a graft chain included in the graft resin includes at least one structural repeating unit selected from the group consisting of a polyester structural repeating unit, a polyether structural repeating unit, a poly(meth)acrylic structural repeating unit, a polyurethane structural repeating unit, a polyurea structural repeating unit, and a polyamide structural repeating unit, it is more preferable that the graft chain includes at least one structural repeating unit selected from the group consisting of a polyester structural repeating unit, a polyether structural repeating unit, and a poly(meth) acrylic structural repeating unit, and it is still more preferable that the graft chain includes a poly(meth) acrylic structural repeating unit.

With regard to details of the graft resin, reference can be made to the description in paragraphs 0025 to 0094 of JP2012-255128A, the contents of which are incorporated herein by reference.

It is also preferable that the resin used as a dispersant is a polyimine-based dispersant including a nitrogen atom in at least one of the main chain or the side chain. As the polyimine-based dispersant, a resin having a main chain which has a partial structure having a functional group of pKa14 or less, and a side chain which has 40 to 10,000 atoms, in which at least one of the main chain or the side chain has a basic nitrogen atom, is preferable. The basic nitrogen atom is not particularly limited as long as it is a nitrogen atom exhibiting basicity. With regard to the polyimine-based dispersant, reference can be made to the description in paragraphs 0102 to 0166 of JP2012-255128A, the contents of which are incorporated herein by reference.

It is also preferable that the resin used as a dispersant is a resin having a structure in which a plurality of polymer chains are bonded to a core portion. Examples of such a resin include dendrimers (including star polymers). In addition, specific examples of the dendrimer include polymer compounds C-1 to C-31 described in paragraphs 0196 to 0209 of JP2013-043962A.

In addition, from the viewpoint of the edge shape of the patterned cured product to be obtained, adhesiveness, and defect suppression, the above-described resin, preferably the resin used as the dispersant, preferably includes a resin having a carboxy group and a graft chain, and more preferably includes a polyester resin having a carboxy group and a graft chain. In addition, from the viewpoint of the edge shape of the patterned cured product to be obtained, adhesiveness, and defect suppression, the above-described resin preferably includes a resin which has a carboxy group directly bonded to a main chain and has a graft chain in a side chain, and particularly preferably includes a polyester resin which has a carboxy group directly bonded to a main chain and has a graft chain in a side chain.

Further, from the viewpoint of the edge shape of the patterned cured product to be obtained, adhesiveness, and defect suppression, the above-described graft chain is preferably an addition polymerization-type resin chain and more preferably an acrylic resin chain.

From the viewpoint of the edge shape of the patterned cured product to be obtained, adhesiveness, and defect suppression, the resin used as the dispersant preferably includes a resin having an aromatic carboxy group (carboxy group directly bonded to an aromatic ring). The above-described resin having an aromatic carboxy group may include the aromatic carboxy group in the main chain of the structural repeating unit, or in the side chain of the structural repeating unit, but it is preferable that the aromatic carboxy group is included in the main chain of the structural repeating unit. In the above-described aromatic carboxy group, the number of carboxy groups bonded to the aromatic ring is preferably 1 to 4 and more preferably 1 or 2.

As the resin having an aromatic carboxy group, from the viewpoint of the edge shape of the patterned cured product to be obtained, adhesiveness, and defect suppression, a resin obtained by reacting a hydroxy group in a vinyl polymer (a) which is produced by a radical polymerization of an ethylenically unsaturated monomer in the presence of a compound (a1) having two hydroxy groups and one thiol group in a molecule, and has two hydroxy groups in one terminal region, with an acid anhydride group in a tetracarboxylic acid anhydride (b), is preferable. Suitable examples of the compound (a1) having two hydroxy groups and one thiol group in a molecule, the vinyl polymer (a) having two hydroxy groups in one terminal region, and the tetracarboxylic acid anhydride (b) include each compound described later.

In addition, from the viewpoint of the edge shape of the patterned cured product to be obtained, adhesiveness, and defect suppression, the resin having an aromatic carboxy group is preferably a resin having a structural repeating unit represented by Formula (b-10).

In Formula (b-10), $Ar^{10}$ represents a group including an aromatic carboxy group, $L^{11}$ represents —COO— or —CONH—, $L^{12}$ represents a trivalent linking group, and $P^{10}$ represents a polymer chain having an ethylenically unsaturated group.

In Formula (b-10), examples of the group including an aromatic carboxy group, represented by $Ar^{10}$, include a structure derived from an aromatic tricarboxylic acid anhydride and a structure derived from an aromatic tetracarboxylic acid anhydride. Examples of the aromatic tricarboxylic acid anhydride and the aromatic tetracarboxylic acid anhydride include compounds having the following structures.

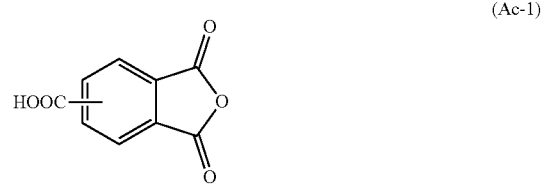

(Ac-1)

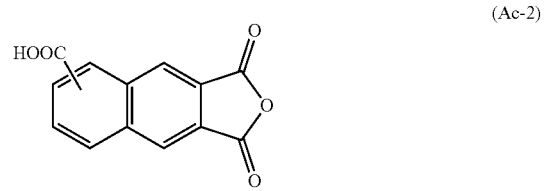

(Ac-2)

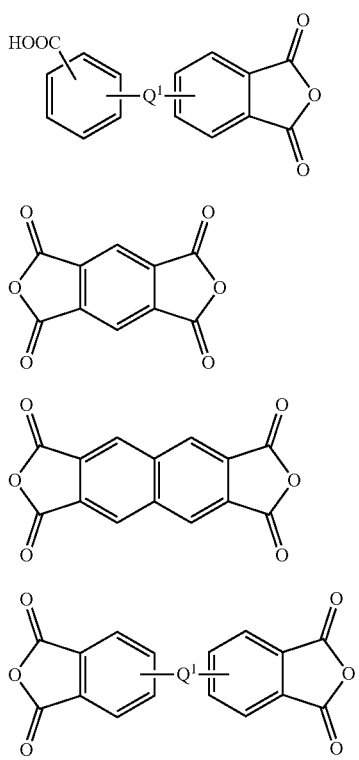

(Ac-3)

(Ac-4)

(Ac-5)

(Ac-6)

In the formulae, $Q^1$ represents a single bond, —O—, —CO—, —COOCH$_2$CH$_2$OCO—, —SO$_2$—, —C(CF$_3$)$_2$— a group represented by Formula (Q-1), or a group represented by Formula (Q-2).

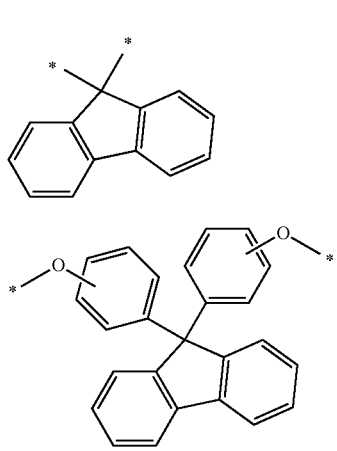

(Q-1)

(Q-2)

Specific examples of the aromatic tricarboxylic acid anhydride include a benzenetricarboxylic acid anhydride (1,2,3-benzenetricarboxylic acid anhydride, trimellitic acid anhydride [1,2,4-benzenetricarboxylic acid anhydride], and the like), a naphthalenetricarboxylic acid anhydride (1,2,4-naphthalenetricarboxylic acid anhydride, 1,4,5-naphthalenetricarboxylic acid anhydride, 2,3,6-naphthalenetricarboxylic acid anhydride, 1,2,8-naphthalenetricarboxylic acid anhydride, and the like), 3,4,4'-benzophenonetricarboxylic acid anhydride, 3,4,4'-biphenylethertricarboxylic acid anhydride, 3,4,4'-biphenyltricarboxylic acid anhydride, 2,3,2'-biphenyltricarboxylic acid anhydride, 3,4,4'-biphenylmethanetricarboxylic acid anhydride, and 3,4,4'-biphenylsulfonetricarboxylic acid anhydride.

Specific examples of the aromatic tetracarboxylic acid anhydride include pyromellitic acid dianhydride, ethylene glycol dianhydrous trimellitic acid ester, propylene glycol dianhydrous trimellitic acid ester, butylene glycol dianhydrous trimellitic acid ester, 3,3',4,4'-benzophenonetetracarboxylic acid dianhydride, 3,3',4,4'-biphenylsulfonetetracarboxylic acid dianhydride, 1,4,5,8-naphthalenetetracarboxylic acid dianhydride, 2,3,6,7-naphthalenetetracarboxylic acid dianhydride, 3,3',4,4'-biphenylethertetracarboxylic acid dianhydride, 3,3',4,4'-dimethyldiphenylsilanetetracarboxylic acid dianhydride, 3,3',4,4'-tetraphenylsilanetetracarboxylic acid dianhydride, 1,2,3,4-frantetracarboxylic acid dianhydride, 4,4'-bis(3,4-dicarboxyphenoxy)diphenylsulfide dianhydride, 4,4'-bis(3,4-dicarboxyphenoxy)diphenylsulfone dianhydride, 4,4'-bis(3,4-dicarboxyphenoxy) diphenylpropane dianhydride, 3,3',4,4'-perfluoroisopropyridendiphtalic acid dianhydride, 3,3',4,4'-biphenyltetracarboxylic acid dianhydride, bis(phthalic acid) phenylphosphineoxide dianhydride, p-phenylene-bis(triphenylphthalic acid) dianhydride, m-phenylene-bis(triphenylphthalic acid) dianhydride, bis(triphenylphthalic acid)-4,4'-diphenylether dianhydride, bis(triphenylphthalic acid)-4,4'-diphenylmethane dianhydride, 9,9-bis(3,4-dicarboxyphenyl)fluorene dianhydride, 9,9-bis[4-(3,4-dicarboxyphenoxy)phenyl]fluorene dianhydride, 3,4-dicarboxy-1,2,3,4-tetrahydro-1-naphthalenesuccinic acid dianhydride, and 3,4-dicarboxy-1,2,3,4-tetrahydro-6-methyl-1-naphthalenesuccinic acid dianhydride.

Specific examples of the group including an aromatic carboxy group represented by $Ar^{10}$ include a group represented by Formula (Ar-1), a group represented by Formula (Ar-2), and a group represented by Formula (Ar-3).

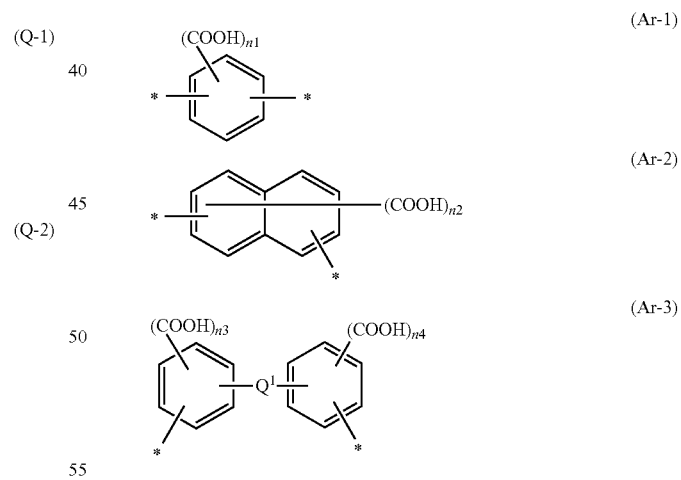

(Ar-1)

(Ar-2)

(Ar-3)

In Formula (Ar-1), n1 represents an integer of 1 to 4, and is preferably an integer of 1 or 2 and more preferably 2.

In Formula (Ar-2), n2 represents an integer of 1 to 8, and is preferably an integer of 1 or 4, more preferably 1 or 2, and still more preferably 2.

In Formula (Ar-3), n3 and n4 each independently represent an integer of 0 to 4, and are preferably an integer of 0 or 2, more preferably 1 or 2, and still more preferably 1. However, at least one of n3 or n4 is an integer of 1 or more.

In Formula (Ar-3), $Q^1$ represents a single bond, —O—, —CO—, —COOCH$_2$CH$_2$OCO—, —SO$_2$—, —C(CF$_3$)$_2$—, the above-described group represented by Formula (Q-1), or the above-described group represented by Formula (Q-2).

In Formula (b-10), $L^{11}$ represents —COO— or —CONH—, preferably —COO—.

In Formula (b-10), examples of the trivalent linking group represented by $L^{12}$ include a hydrocarbon group, —O—, —CO—, —COO—, —OCO—, —NH—, —S—, and a group formed by a combination of two or more of these groups. Examples of the hydrocarbon group include an aliphatic hydrocarbon group and an aromatic hydrocarbon group. The number of carbon atoms in the aliphatic hydrocarbon group is preferably 1 to 30, more preferably 1 to 20, and still more preferably 1 to 15. The aliphatic hydrocarbon group may be linear, branched, or cyclic. The number of carbon atoms in the aromatic hydrocarbon group is preferably 6 to 30, more preferably 6 to 20, and still more preferably 6 to 10. The hydrocarbon group may have a substituent. Examples of the substituent include a hydroxy group.

In Formula (b-10), $P^{10}$ represents a polymer chain having a (meth)acryloyl group. It is preferable that the polymer chain represented by $P^{10}$ has at least one repeating unit selected from the group consisting of a poly(meth)acrylic structural repeating unit, a polyether structural repeating unit, a polyester structural repeating unit, and a polyol structural repeating unit. The weight-average molecular weight of the polymer chain $P^{10}$ is preferably 500 to 20,000. The lower limit is preferably 600 or more and more preferably 1,000 or more. The upper limit is preferably 10,000 or less, more preferably 5,000 or less, and still more preferably 3,000 or less. In a case where the weight-average molecular weight of $P^{10}$ is within the above-described range, dispersibility of the pigment in the composition is good. This resin is preferably used as a dispersant.

In Formula (b-10), the polymer chain represented by $P^{10}$ is preferably a polymer chain including a structural repeating unit represented by Formulae (P-1) to (P-5), and more preferably a polymer chain including a structural repeating unit represented by Formula (P-5).

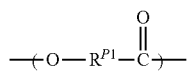

(P-1)

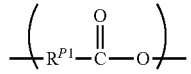

(P-2)

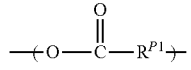

(P-3)

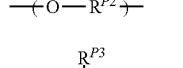

(P-4)

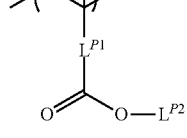

(P-5)

In the formulae, $R^{P1}$ and $R^{P2}$ each represent an alkylene group. As the alkylene group represented by $R^{P1}$ and $R^{P2}$, a linear or branched alkylene group having 1 to 20 carbon atoms is preferable, a linear or branched alkylene group having 2 to 16 carbon atoms is more preferable, and a linear or branched alkylene group having 3 to 12 carbon atoms is still more preferable.

In the formulae, $R^{P3}$ represents a hydrogen atom or a methyl group.

In the formulae, $L^{P1}$ represents a single bond or an arylene group and $L^{PZ}$ represents a single bond or a divalent linking group. $L^{P1}$ is preferably a single bond. Examples of the divalent linking group represented by $L^{P2}$ include an alkylene group (preferably an alkylene group having 1 to 12 carbon atoms), an arylene group (preferably an arylene group having 6 to 20 carbon atoms), —NH—, —SO—, —SO$_2$—, —CO—, —O—, —COO—, —OCO—, —S—, —NHCO—, —CONH—, and a group formed by a combination of two or more these groups.

$R^{P4}$ represents a hydrogen atom or a substituent. Examples of the substituent include a hydroxy group, a carboxy group, an alkyl group, an aryl group, a heteroaryl group, an alkoxy group, an aryloxy group, a heteroaryloxy group, an alkylthioether group, an arylthioether group, a heteroarylthioether group, and an ethylenically unsaturated group.

In addition, the polymer chain represented by $P^{10}$ is more preferably a polymer chain having a structural repeating unit including an ethylenically unsaturated group in the side chain. In addition, the proportion of the structural repeating unit including an ethylenically unsaturated group in the side chain with respect to total structural repeating units constituting $P^{10}$ is preferably 5 mass % or more, more preferably 10 mass % or more, and still more preferably 20 mass % or more. The upper limit may be 100 mass %, and is preferably 90 mass % or less and still more preferably 60 mass % or less.

In addition, it is also preferable that the polymer chain represented by $P^{10}$ has a structural repeating unit having an acid group. Examples of the acid group include a carboxy group, a phosphoric acid group, a sulfo group, and a phenolic hydroxy group. According to this aspect, the dispersibility of the pigment in the composition can be further improved. Furthermore, developability can also be further improved. The proportion of the structural repeating unit having an acid group is preferably 1 mass % to 30 mass %, more preferably 2 mass % to 20 mass %, and still more preferably 3 mass % to 10 mass %.

In addition, the resin having the structural repeating unit represented by Formula (b-10) can be produced by reacting at least one acid anhydride selected from the group consisting of an aromatic tetracarboxylic acid anhydride and an aromatic tricarboxylic acid anhydride with a hydroxy group-containing compound.

Examples of the aromatic tetracarboxylic acid anhydride and the aromatic tricarboxylic acid anhydride include those described above. The hydroxy group-containing compound is not particularly limited as long as it has a hydroxy group in the molecule, but is preferably a polyol having two or more hydroxy groups in the molecule.

In addition, as the hydroxy group-containing compound, it is also preferable to use a compound having two hydroxy groups and one thiol group in the molecule. Examples of the compound having two hydroxy groups and one thiol group in the molecule include 1-mercapto-1,1-methanediol, 1-mercapto-1,1-ethanediol, 3-mercapto-1,2-propanediol (thioglycerin), 2-mercapto-1,2-propanediol, 2-mercapto-2-methyl-1,3-propanediol, 2-mercapto-2-ethyl-1,3-propanediol, 1-mercapto-2,2-propanediol, 2-mercaptoethyl-2-methyl-1,3-propanediol, and 2-mercaptoethyl-2-ethyl-1,3-propanediol. Examples of other hydroxy group-containing compounds include compounds described in paragraphs 0084 to 0095 of JP2018-101039A, the contents of which are incorporated herein by reference.

The molar ratio (acid anhydride group/hydroxy group) of the acid anhydride group in the acid anhydride to the hydroxy group in the hydroxy group-containing compound is preferably 0.5 to 1.5.

In addition, the resin having the structural repeating unit represented by Formula (b-10) can be synthesized by the methods shown in the following synthesis method (1) or (2).

[Synthesis Method (1)]

Producing method of radically polymerizing a polymerizable monomer having an ethylenically unsaturated group in the presence of a hydroxy group-containing thiol compound (preferably a compound having two hydroxy groups and one thiol group in the molecule) to synthesize a vinyl polymer having two hydroxy groups in one terminal region, and reacting the synthesized vinyl polymer with one or more aromatic acid anhydride selected from the aromatic tetracarboxylic acid anhydride and the aromatic tricarboxylic acid anhydride.

[Synthesis Method (2)]

Producing method of reacting a hydroxy group-containing compound (preferably a compound having two hydroxy groups and one thiol group in the molecule) with one or more aromatic acid anhydride selected from the aromatic tetracarboxylic acid anhydride and the aromatic tricarboxylic acid anhydride, and radically polymerizing a polymerizable monomer having an ethylenically unsaturated group in the presence of the obtained reactant. In the synthesis method (2), after radically polymerizing the polymerizable monomer having a hydroxy group, the reactant may be further reacted with a compound having an isocyanate group (for example, a compound having an isocyanate group and the above-described functional group A). As a result, the functional group A can be introduced into the polymer chain $P^{10}$.

In addition, the resin having the structural repeating unit represented by Formula (b-10) can also be synthesized according to the method described in paragraphs 0120 to 0138 of JP2018-101039A.

The weight-average molecular weight of the resin having the structural repeating unit represented by Formula (b-10) is preferably 2,000 to 35,000. The upper limit is preferably 25,000 or less, more preferably 20,000 or less, and still more preferably 15,000 or less. The lower limit is preferably 4,000 or more, more preferably 6,000 or more, and still more preferably 7,000 or more.

The acid value of the resin having the structural repeating unit represented by Formula (b-10) is preferably 5 to 200 mgKOH/g. The upper limit is preferably 150 mgKOH/g or less, more preferably 100 mgKOH/g or less, and still more preferably 80 mgKOH/g or less. The lower limit is preferably 10 mgKOH/g or more, more preferably 15 mgKOH/g or more, and still more preferably 20 mgKOH/g or more.

The above-described resin having an aromatic carboxy group may be used alone or in combination of two or more kinds thereof.

The content of the above-described resin having an aromatic carboxy group is preferably 1 mass % to 50 mass % with respect to the total solid content of the curable composition. The lower limit is preferably 3 mass % or more, more preferably 5 mass % or more, and still more preferably 10 mass % or more. The upper limit is preferably 45 mass % or less and more preferably 40 mass % or less.

In addition, specific examples of the above-described resin having an aromatic carboxy group include compounds described in JP2017-156652, the content of which is incorporated herein by reference.

In addition, the curable composition according to the embodiment of the present disclosure preferably includes a resin (specific resin) which satisfies at least one of the following requirement 1 or the following requirement 2.

Requirement 1: the resin includes a constitutional unit having, in the same side chain, an anionic structure, a quaternary ammonium cationic structure which is ionically bonded to the anionic structure, and a radically polymerizable group.

Requirement 2: the resin includes a constitutional unit having, in a side chain, a quaternary ammonium cationic structure and a group to which a radically polymerizable group is linked.

The specific resin may be a linear polymer compound, a star polymer compound, or a comb-shaped polymer compound. In addition, the form of the resin does not matter, and the resin may be a star polymer compound having a plurality of branching points and having a specific terminal group, which is described in JP2007-277514A.

The molecular weight (in a case of having a molecular weight distribution, weight-average molecular weight) of the side chain in the requirement 1 or the requirement 2 is preferably 50 to 1,500 and more preferably 100 to 1,000.

In addition, the specific resin is preferably an addition polymerization-type resin and more preferably an acrylic resin. In a case where the specific resin is an addition polymerization-type resin, examples of the specific resin include an aspect in which the side chain in the requirement 1 or the requirement 2 is a molecular chain bonded to a molecular chain formed by the addition polymerization, and is a molecular chain formed by a method other than addition polymerization.

In addition, the specific resin may be a dispersant. In the present specification, a resin which mainly is used for dispersing particles such as a pigment is also referred to as a dispersant. However, such applications of the specific resin are only exemplary, and the specific resin can also be used for other purposes in addition to such applications.

[Other Constitutional Units]

The specific resin may have a constitutional unit other than those described above.

The other constitutional units are not particularly limited, and a known constitutional unit may be used.

The weight-average molecular weight (Mw) of the specific resin is preferably 1,000 or more, more preferably 1,000 to 200,000, and particularly preferably 1,000 to 100,000.

From the viewpoint of deep portion curing properties, formation of a pattern shape, and substrate adhesiveness, the ethylenically unsaturated bonding value (C=C value) of the specific resin is preferably 0.01 mmol/g to 2.5 mmol/g, more preferably 0.05 mmol/g to 2.3 mmol/g, still more preferably 0.1 mmol/g to 2.2 mmol/g, and particularly preferably 0.1 mmol/g to 2.0 mmol/g.

The ethylenically unsaturated bonding value of the specific resin refers to a molar amount of ethylenically unsaturated groups per 1 g of the solid content of the specific resin, and is measured by the method described in Examples.

From the viewpoint of developability, the acid value of the specific resin is preferably 30 mgKOH/g to 110 mgKOH/g and more preferably 40 mgKOH/g to 90 mgKOH/g. The acid value is measured by the method described above.

From the viewpoint of adhesiveness with the support, the amine value of the specific resin is preferably 0.03 mmol/g to 0.8 mmol/g and more preferably 0.1 mmol/g to 0.5 mmol/g.

The above-described amine value is measured by the following method.

Approximately 0.5 g of the sample was precisely weighed and dissolved in 50 mL of acetic acid, and the mixture was titrated with a 0.1 mol/L acetic acid perchlorate solution using an electric titration method (potentiometric titration) and an automatic potentiometric titrator (AT-710M; manufactured by KYOTO ELECTRONICS MANUFACTURING CO., LTD.). In addition, a blank test was performed in the same manner as described above to make corrections.

Amine value (mmol/g)=$a$×5.611/$c$ a: consumption amount (mL) of 0.1 mol/L perchloric acid
c: amount (g) of sample A commercially available product is also available as the dispersant, and specific examples thereof include DISPERBYK series (for example, DISPERBYK-111, 161, and the like) manufactured by BYK Chemie, and Solsperse series (for example, Solsperse 76500) manufactured by Lubrizol Corporation. The dispersing agents described in paragraphs 0041 to 0130 of JP2014-130338A can also be used, the contents of which are incorporated herein by reference. In addition, as the dispersant, compounds described in JP2018-150498A, JP2017-100116A, JP2017-100115A, JP2016-108520A, JP2016-108519A, and JP2015-232105A may be used. The resin described as a dispersant can be used for an application other than the dispersant. For example, the resin can also be used as a binder.

The curable composition according to the embodiment of the present disclosure may include only one kind of binder polymer or two or more kinds thereof.

In addition, the content of the binder polymer is preferably 1 mass % to 50 mass % with respect to the total solid content of the curable composition. The lower limit is preferably 3 mass % or more, more preferably 5 mass % or more, and still more preferably 10 mass % or more. The upper limit is preferably 45 mass % or less and more preferably 40 mass % or less.

<Polymerizable Compound>

From the viewpoint of film hardness and pattern formability, the curable composition according to the embodiment of the present disclosure preferably further includes a polymerizable compound, and more preferably further includes a polymerizable compound and a photopolymerization initiator described later.

The reaction mechanism in the curing of the polymerizable compound is not particularly limited. Examples thereof include a radical polymerization reaction, a cationic polymerization reaction, a condensation polymerization reaction, a nucleophilic addition reaction, and a crosslinking reaction by a substitution reaction. The polymerizable compound is preferably a compound which is cured by a radical polymerization reaction.

Examples of the polymerizable group include an ethylenically unsaturated group and an epoxy group. Examples of the ethylenically unsaturated group include a vinyl group, a vinyloxy group, an allyl group, a methallyl group, a (meth)acryloyl group, a styrene group, a cinnamoyl group, and a maleimide group. Among these, a (meth)acryloyl group, a styrene group, or a maleimide group is preferable, a (meth)acryloyl group is more preferable, and an acryloyl group is particularly preferable.

The polymerizable compound may be either a monomer or a resin such as a polymer. It is also possible to use a monomer type polymerizable compound and a resin type polymerizable compound in combination.

However, with regard to the content, the polymer having a polymerizable group is treated as the above-described binder polymer.

The molecular weight of the polymerizable compound is preferably less than 3,000. The upper limit is more preferably 2,000 or less and still more preferably 1,500 or less. The lower limit is preferably 100 or more, more preferably 150 or more, and still more preferably 250 or more. The polymerizable compound is preferably a compound having 3 or more ethylenically unsaturated groups, more preferably a compound having 3 to 15 ethylenically unsaturated groups, and still more preferably a compound having 3 to 6 ethylenically unsaturated groups. In addition, the polymerizable compound is preferably a trifunctional to pentadecafunctional (meth)acrylate compound and more preferably a trifunctional to hexafunctional (meth)acrylate compound. Specific examples of the polymerizable monomer include the compounds described in paragraphs 0095 to 0108 of JP2009-288705A, paragraph 0227 of JP2013-029760A, paragraphs 0254 to 0257 of JP2008-292970A, paragraphs 0034 to 0038 of JP2013-253224A, paragraph 0477 of JP2012-208494A, JP2017-048367A, JP6057891B, and JP6031807B, the contents of which are incorporated herein by reference.

As the polymerizable compound, dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa (meth)acrylate (as a commercially available product, KAYARAD DPHA manufactured by Nippon Kayaku Co., Ltd., NK ESTER A-DPH-12E manufactured by Shin-Nakamura Chemical Co., Ltd.), or a compound having a structure in which these (meth)acryloyl groups are bonded through an ethylene glycol and/or a propylene glycol residue (for example, SR454 and SR499 which are commercially available products from Sartomer) is preferable.

As the polymerizable compound, a compound having an acid group can also be used. By using a polymerizable compound having an acid group, the curable composition layer in a non-exposed portion is easily removed during development and the generation of the development residue can be suppressed.

Examples of the acid group include a carboxy group, a sulfo group, and a phosphoric acid group, and a carboxy group is preferable. Examples of the polymerizable compound having an acid group include succinic acid-modified dipentaerythritol penta(meth)acrylate. Examples of a commercially available product of the polymerizable monomer having an acid group include ARONIX M-510, M-520, and ARONIX TO-2349 (manufactured by TOAGOSEI CO., LTD). The acid value of the polymerizable monomer having an acid group is preferably 0.1 mgKOH/g to 40 mgKOH/g and more preferably 5 mgKOH/g to 30 mgKOH/g. In a case where the acid value of the polymerizable compound is 0.1 mgKOH/g or more, solubility in a developer is good, and in a case where the acid value of the polymerizable compound is 40 mgKOH/g or less, it is advantageous in production and handling.

The polymerizable compound is also preferably a compound having a caprolactone structure. Examples of the polymerizable compound having a caprolactone structure include DPCA-20, DPCA-30, DPCA-60, and DPCA-120, each of which is commercially available as KAYARAD DPCA series from Nippon Kayaku Co., Ltd.

As the polymerizable compound, a compound having an alkyleneoxy group can also be used. The polymerizable compound having an alkyleneoxy group is preferably a compound having an ethyleneoxy group and/or a propyleneoxy group, more preferably a compound having an ethyleneoxy group, and still more preferably a trifunctional to hexafunctional (meth)acrylate compound having 4 to 20 ethyleneoxy groups. Examples of a commercially available product of the polymerizable compound having an alkyleneoxy group include SR-494 manufactured by Sartomer, which is a tetrafunctional (meth)acrylate having 4 ethyleneoxy groups, and KAYARAD TPA-330 manufactured by Nippon Kayaku Co., Ltd., which is a trifunctional (meth) acrylate having 3 isobutyleneoxy groups.

As the polymerizable compound, it is also preferable to use a compound which does not substantially include environmentally regulated substances such as toluene. Examples of a commercially available product of such a compound include KAYARAD DPHA LT and KAYARAD DPEA-12 LT (manufactured by Nippon Kayaku Co., Ltd.).

As a compound having an epoxy group (hereinafter, also referred to as an epoxy compound) which is used as the polymerizable compound, a compound having two or more epoxy groups in one molecule is preferably used. The upper limit of epoxy groups of the epoxy compound is preferably 100 or less, more preferably 10 or less, and still more preferably 5 or less.

The epoxy equivalent (=the molecular weight of the compound having an epoxy group/the number of epoxy groups) of the epoxy compound is preferably 500 g/eq or less, more preferably 100 g/eq to 400 g/eq, and still more preferably 100 g/eq to 300 g/eq.

The epoxy compound may be a low-molecular-weight compound (for example, molecular weight: less than 1,000) or a high-molecular weight compound (macromolecule; for example, molecular weight: 1,000 or more, and in the case of a polymer, weight-average molecular weight: 1,000 or more). The molecular weight (in a case of the polymer, the weight-average molecular weight) of the epoxy compound is preferably 200 to 100,000 and more preferably 500 to 50,000. The upper limit of the molecular weight (in a case of the polymer, the weight-average molecular weight) is preferably 3,000 or less, more preferably 2,000 or less, and still more preferably 1,500 or less.

The polymerizable compound may be used alone or in combination of two or more kinds thereof.

The content of the polymerizable compound is preferably 0.1 mass % to 40 mass % with respect to the total solid content of the curable composition. The lower limit is preferably 1 mass % or more and more preferably 2 mass % or more. The upper limit is preferably 30 mass % or less, more preferably 20 mass % or less, and still more preferably 10 mass % or less.

In addition, in a case where the epoxy compound is used as the polymerizable compound, the content of the epoxy compound is preferably 0.1 mass % to 40 mass % with respect to the total solid content of the curable composition. The lower limit is, for example, more preferably 1 mass % or more and still more preferably 2 mass % or more. The upper limit is, for example, more preferably 30 mass % or less and still more preferably 20 mass % or less.

The epoxy compound may be used singly or in combination of two or more thereof.

In addition, in a case where the ethylenically unsaturated compound and the compound having an epoxy group are used in combination, the proportion (mass ratio) between the compounds is preferably the mass of the ethylenically unsaturated compound:the mass of the compound having an epoxy group=100:1 to 100:400, more preferably 100:1 to 100:100, and still more preferably 100:1 to 100:50.

A preferred aspect of the curable composition according to the embodiment of the present disclosure is as follows.

The curable composition includes an ethylenically unsaturated compound and a resin, in which $M^1/B^1$, which is a ratio of a mass $M^1$ of the ethylenically unsaturated compound included in the curable composition to a mass $B^1$ of the binder polymer included in the curable composition, is preferably 0.35 or less, more preferably 0.25 or less, and particularly preferably 0.15 or less. Within the above-described range, a cured film having more excellent moisture resistance can be formed. Furthermore, it is also possible to suppress film contraction in a case of forming a cured film. In particular, in a case where a polymerizable resin is used as the resin, the above-described effects are obtained more significantly. The lower limit of the value of $M^1/B^1$ described above is preferably 0.01 or more, more preferably 0.04 or more, and still more preferably 0.07 or more.

In addition, in the above-described aspect, the total content of the polymerizable compound and the binder polymer is preferably 1 mass % to 50 mass % with respect to the total solid content of the curable composition. The lower limit is preferably 3 mass % or more, more preferably 5 mass % or more, and still more preferably 10 mass % or more. The upper limit is preferably 45 mass % or less and more preferably 40 mass % or less.

<Polymerization Initiator>

The curable composition according to the embodiment of the present disclosure preferably further includes a polymerization initiator, and more preferably further includes a photopolymerization initiator. In particular, in a case where the ethylenically unsaturated compound is used as the curable compound, it is particularly preferable that the curable composition according to the embodiment of the present disclosure further includes a photopolymerization initiator. The polymerization initiator is not particularly limited, and can be appropriately selected from known photopolymerization initiators and thermal polymerization initiators. As the photopolymerization initiator, a compound having photosensitivity to light in a range from an ultraviolet range to a visible range is preferable. In addition, the photopolymerization initiator is preferably a photoradical polymerization initiator.

Examples of the photopolymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. From the viewpoint of exposure sensitivity, the photopolymerization initiator preferably includes at least one compound selected from the group consisting of a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, and a 3-aryl-substituted coumarin compound, more preferably includes at least one compound selected from the group consisting of an oxime compound, an α-hydroxyketone compound, an α-aminoketone compound, and an acylphosphine compound, and still more preferably includes an oxime compound. Examples of the photopolymerization initiator include photopolymerization initiators described in paragraphs 0065 to 0111 of JP2014-130173A, photopolymerization initiators described in JP6301489B, peroxide-based photopolymerization initiators described in MATERIAL STAGE, pp. 37 to 60, vol. 19, No. 3, 2019, photopolymerization initiators described in WO2018/221177A, photopolymerization initiators described in WO2018/110179A, photopolymerization initiators described in JP2019-043864A, photopolymerization initiators described in JP2019-044030A, and organic peroxides described in JP2019-167313A, the contents of which are incorporated herein by reference.

Examples of a commercially available product of the α-hydroxyketone compound include IRGACURE-184, DAROCUR-1173, IRGACURE-500, IRGACURE-2959, and IRGACURE-127 (all manufactured by BASF). Examples of a commercially available product of the α-aminoketone compound include IRGACURE-907, IRGACURE-369, IRGACURE-379, and IRGACURE-379EG (all manufactured by BASF). Examples of a commercially available product of the acylphosphine compound include IRGACURE-819 and DAROCUR-TPO (both manufactured by BASF).

Examples of the oxime compound include the compounds described in JP2001-233842A, the compounds described in JP2000-080068A, the compounds described in JP2006-342166A, the compounds described in J. C. S. Perkin II (1979, pp. 1653-1660), the compounds described in J. C. S. Perkin II (1979, pp. 156-162), the compounds described in Journal of Photopolymer Science and Technology (1995, pp. 202-232), the compounds described in JP2000-066385A, the compounds described in JP2004-534797A, the compounds described in JP2006-342166A, the compounds described in JP2017-019766A, the compounds described in JP6065596B, the compounds described in WO2015/152153A, the compounds described in WO2017/051680A, the compounds described in JP2017-198865A, the compounds described in paragraphs 0025 to 0038 of WO2017/164127A, and the compounds described in WO2013/167515A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one. Examples of a commercially available product include IRGACURE OXE01, IRGACURE OXE02, IRGACURE OXE03, and IRGACURE OXE04 (all of which are manufactured by BASF), TR-PBG-304 (manufactured by TRONLY), and ADEKA OPTOMER N-1919 (manufactured by ADEKA Corporation; photopolymerization initiator 2 described in JP2012-014052A). In addition, as the oxime compound, it is also preferable to use a compound having no colorability or a compound having high transparency and being resistant to discoloration. Examples of a commercially available product include ADEKA ARKLS NCI-730, NCI-831, and NCI-930 (all of which are manufactured by ADEKA Corporation).

In addition, an oxime compound having a fluorene ring can also be used as the photopolymerization initiator. Specific examples of the oxime compound having a fluorene ring include the compounds described in JP2014-137466A. The contents of the publications are incorporated herein by reference.

In addition, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compound (C-3) described in JP2013-164471A. The contents of the publications are incorporated herein by reference.

Further, an oxime compound having a nitro group can be used as the photopolymerization initiator. The oxime compound having a nitro group is also preferably used in the form of a dimer. Specific examples of the oxime compound having a nitro group include the compounds described in paragraphs 0031 to 0047 of JP2013-114249A and paragraphs 0008 to 0012 and 0070 to 0079 of JP2014-137466A, the compounds described in paragraphs 0007 to 0025 of JP4223071B, and ADEKA ARKLS NCI-831 (manufactured by ADEKA Corporation).

An oxime compound having a benzofuran skeleton can also be used as the photopolymerization initiator. Specific examples thereof include OE-01 to OE-75 described in WO2015/036910A.

Specific examples of the oxime compound preferably used are shown below, but the oxime compound is not limited thereto.

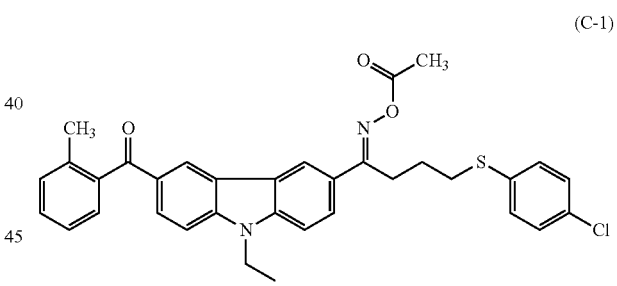

(C-1)

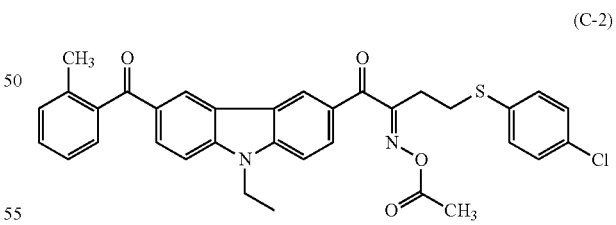

(C-2)

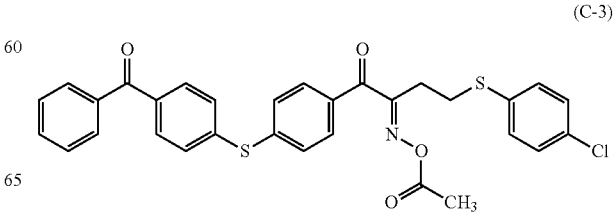

(C-3)

-continued
(C-4)
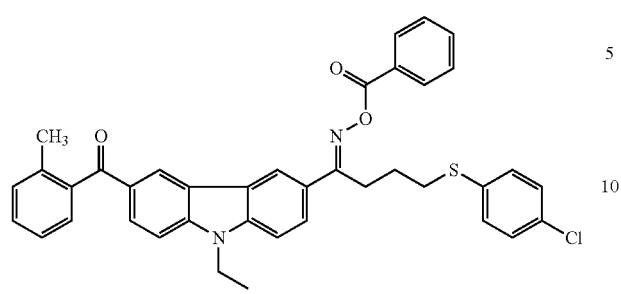
(C-5)
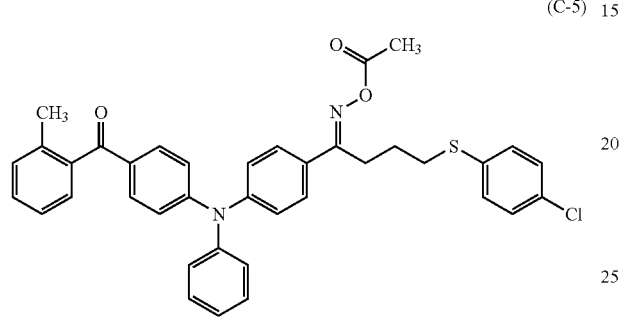
(C-6)
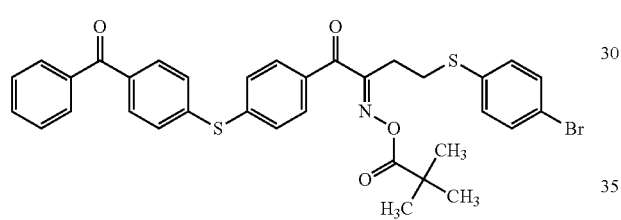
(C-7)
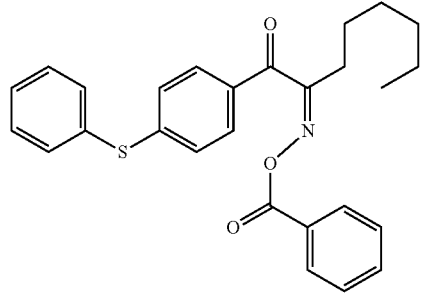
(C-8)
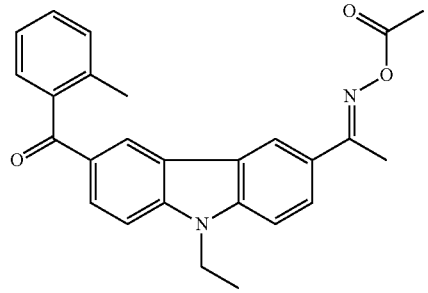
-continued
(C-9)
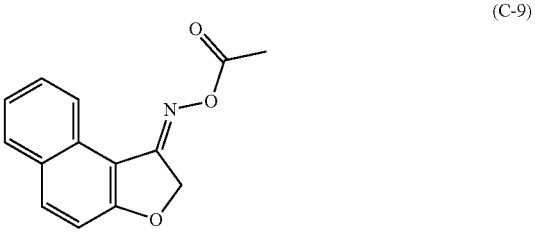
(C-10)
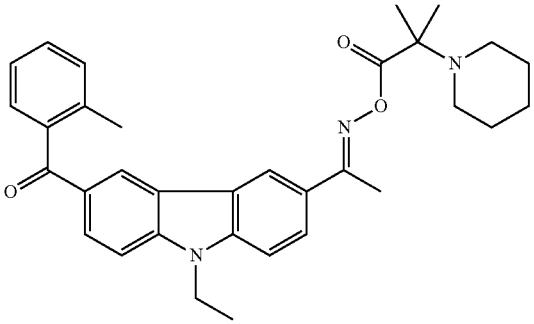
(C-11)
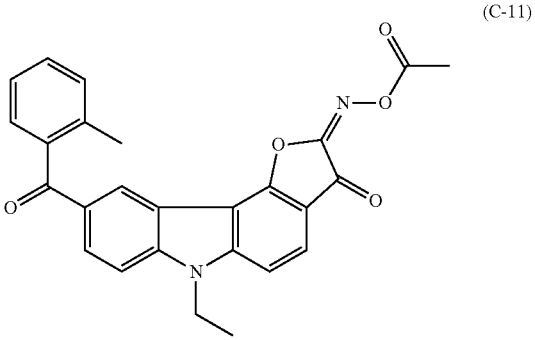
(C-12)
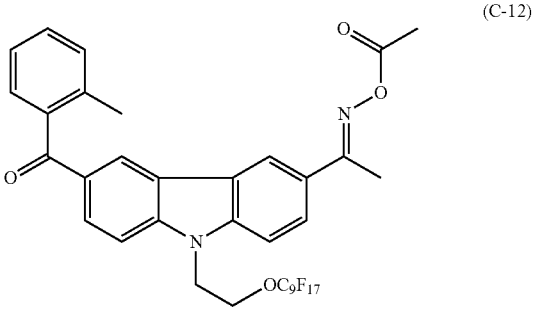
(C-13)
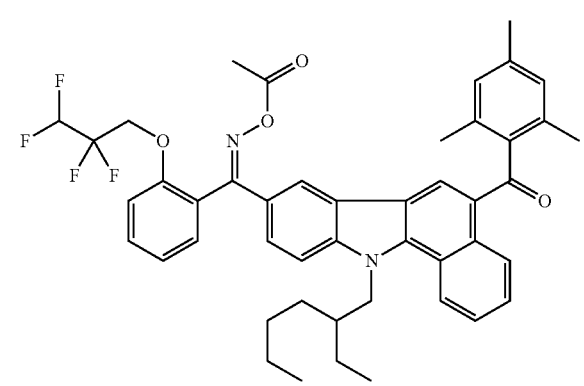

-continued (C-14)

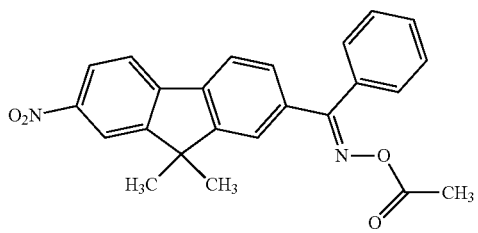

(C-15)

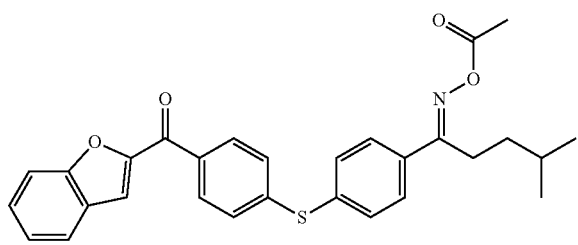

(C-16)

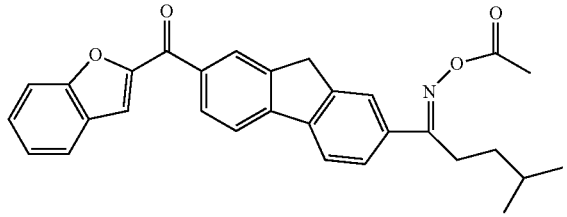

The oxime compound is preferably a compound having a maximal absorption wavelength in a wavelength range of 350 nm to 500 nm and more preferably a compound having a maximal absorption wavelength in a wavelength range of 360 nm to 480 nm. In addition, from the viewpoint of sensitivity, the molar absorption coefficient of the oxime compound at a wavelength of 365 nm or 405 nm is preferably high, more preferably 1,000 to 300,000, still more preferably 2,000 to 300,000, and particularly preferably 5,000 to 200,000. The molar absorption coefficient of a compound can be measured using a known method. For example, the molar absorption coefficient is preferably measured by a spectrophotometer (Cary-5 spectrophotometer, manufactured by Varian) using an ethyl acetate solvent at a concentration of 0.01 g/L.

In addition, examples of the thermal polymerization initiator or a polymerization initiator which can be polymerized with both light and heat include peroxide compounds described in MATERIAL STAGE p. 37 to 60, vol. 19, No. 3, 2019, WO2018/221177A, WO2018/110179A, or JP2019-43864A.

As the photopolymerization initiator, a bifunctional or tri- or higher functional photoradical polymerization initiator may be used. By using such a photoradical polymerization initiator, two or more radicals are generated from one molecule of the photoradical polymerization initiator, and as a result, good sensitivity is obtained. In addition, in a case of using a compound having an asymmetric structure, crystallinity is reduced so that solubility in a solvent or the like is improved, precipitation is to be difficult over time, and temporal stability of the curable composition can be improved. Specific examples of the bifunctional or tri- or higher functional photoradical polymerization initiator include dimers of the oxime compounds described in JP2010-527339A, JP2011-524436A, WO2015/004565A, paragraphs 0407 to 0412 of JP2016-532675A, and paragraphs 0039 to 0055 of WO2017/033680A; the compound (E) and compound (G) described in JP2013-522445A; Cmpd 1 to 7 described in WO2016/034963A; the oxime ester photoinitiators described in paragraph 0007 of JP2017-523465A; the photoinitiators described in paragraphs 0020 to 0033 of JP2017-167399A; the photopolymerization initiator (A) described in paragraphs 0017 to 0026 of JP2017-151342A; and the oxime ester photoinitiators described in JP6469669B.

The content of the polymerization initiator in the total solid content of the curable composition according to the embodiment of the present disclosure is preferably 0.1 mass % to 30 mass %. The lower limit is preferably 0.5 mass % or more and more preferably 1 mass % or more. The upper limit is preferably 20 mass % or less and more preferably 15 mass % or less. In the curable composition according to the embodiment of the present disclosure, the polymerization initiator may be used singly or in combination of two or more kinds thereof. In a case where two or more kinds thereof are used, the total amount thereof is preferably within the above-described range.

<Pigment Derivative>

The curable composition according to the embodiment of the present disclosure can contain a pigment derivative.

Examples of the pigment derivative include a compound having a structure in which a portion of a pigment is substituted with an acid group, a basic group, or a phthalimidomethyl group.

As the pigment derivative, compounds described in JP1981-118462A (JP-S56-118462A), JP1988-264674A (JP-S63-264674A), JP1989-217077A (JP-H01-217077A), JP1991-009961A (JP-H03-009961A), JP1991-026767A (JP-H03-026767A), JP1991-153780A (JP-H03-153780A), JP1991-045662A (JP-H03-045662A), JP1992-285669A (JP-H04-285669A), JP1994-145546A (JP-H06-145546A), JP1994-212088A (JP-H06-212088A), JP1994-240158A (JP-H06-240158A), JP1998-030063A (JP-H10-030063A), JP1998-195326A (JP-H10-195326A), paragraphs 0086 to 0098 of WO2011/024896A, paragraphs 0063 to 0094 of WO2012/102399A, paragraph 0082 of WO2017/038252A, paragraph 0171 of JP2015-151530A, JP2019-133154A, and the like can be used, the contents of which are incorporated herein by reference.

In addition, the pigment derivative preferably has, as a chromophore, a coloring agent skeleton such as a quinoline-based skeleton, a benzimidazolone-based skeleton, a diketopyrrolopyrrole-based skeleton, an azo-based skeleton, a phthalocyanine-based skeleton, an anthraquinone-based skeleton, a quinacridone-based skeleton, a dioxazine-based skeleton, a perinone-based skeleton, a perylene-based skeleton, a thioindigo-based skeleton, an isoindoline-based skeleton, an isoindolinone-based skeleton, a quinophthalone-based skeleton, a threne-based skeleton, and a metal complex-based skeleton. Among these, a quinoline-based skeleton, a benzimidazolone-based skeleton, a diketopyrrolopyrrole-based skeleton, an azo-based skeleton, a quinophthalone-based skeleton, an isoindoline-based skeleton, or a phthalocyanine-based skeleton is preferable, and an azo-based skeleton or a benzimidazolone-based skeleton is more preferable. As the acid group included in the pigment derivative, a sulfo group or a carboxy group is preferable and a sulfo group is more preferable. As the basic group included in the pigment derivative, an amino group is preferable and a tertiary amino group is more preferable.

The pigment derivative preferably includes a pigment derivative having a basic group (also referred to as a "basic pigment derivative"). In addition, from the viewpoint of developability and dispersion stability, the curable compound according to the embodiment of the present disclosure more preferably includes a binder polymer (dispersant) having an acid group and the pigment derivative having a basic group.

The content of the pigment derivative is preferably 1 part by mass to 50 parts by mass with respect to 100 parts by mass of the pigment. The lower limit value is preferably 3 parts by mass or more and more preferably 5 parts by mass or more. The upper limit value is preferably 40 parts by mass or less and more preferably 30 parts by mass or less. In a case where the content of the pigment derivative is within the above-described range, dispersibility of the pigment can be enhanced, and aggregation of the pigment can be efficiently suppressed. The pigment derivative may be used singly or in combination of two or more kinds thereof. In a case of using two or more kinds thereof, the total amount thereof is preferably within the above-described range.

<Silane Coupling Agent>

The curable composition according to the embodiment of the present disclosure can contain a silane coupling agent. According to this aspect, adhesiveness of a cured film to be obtained with a support can be improved. The silane coupling agent means a silane compound having a hydrolyzable group and other functional groups. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group, and an alkoxy group is preferable. That is, it is preferable that the silane coupling agent is a compound having an alkoxysilyl group. Examples of the functional group other than the hydrolyzable group include a vinyl group, a (meth)allyl group, a (meth)acryloyl group, a mercapto group, an epoxy group, an oxetanyl group, an amino group, a ureido group, a sulfide group, an isocyanate group, and a phenyl group, and an amino group, a (meth)acryloyl group, or an epoxy group is preferable. Specific examples of the silane coupling agent include the compounds described in paragraphs 0018 to 0036 of JP2009-288703A and the compounds described in paragraphs 0056 to 0066 of JP2009-242604A, the contents of which are incorporated herein by reference.

The content of the silane coupling agent in the total solid content of the curable composition is preferably 0.1 mass % to 5 mass %. The upper limit is preferably 3 mass % or less and more preferably 2 mass % or less. The lower limit is preferably 0.5 mass % or more and more preferably 1 mass % or more. The silane coupling agent may be used singly or in combination of two or more kinds thereof. In a case of using two or more kinds thereof, the total amount thereof is preferably within the above-described range.

<Solvent>

The curable composition according to the embodiment of the present disclosure can contain a solvent.

Examples of the solvent include an organic solvent. Basically, the solvent is not particularly limited as long as it satisfies solubility of the respective components or application properties of the curable composition. Examples of the organic solvent include an ester-based solvent, a ketone-based solvent, an alcohol-based solvent, an amide-based solvent, an ether-based solvent, and a hydrocarbon-based solvent. With regard to details thereof, reference can be made to the description in paragraph 0223 of WO2015/166779A, the contents of which are incorporated herein by reference. In addition, an ester-based solvent substituted with a cyclic alkyl group or a ketone-based solvent substituted with a cyclic alkyl group can also be preferably used. Specific examples of the organic solvent include polyethylene glycol monomethyl ether, dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, propylene glycol monomethyl ether acetate, 3-methoxy-N,N-dimethylpropanamide, and 3-butoxy-N,N-dimethylpropanamide. However, it may be preferable that the content of aromatic hydrocarbons (such as benzene, toluene, xylene, and ethylbenzene) as the solvent is low (for example, 50 parts per million (ppm) by mass or less, 10 ppm by mass or less, or 1 ppm by mass or less with respect to the total amount of the organic solvent) in consideration of environmental aspects and the like.

In the curable composition according to the embodiment of the present disclosure, a solvent having a low metal content is preferably used. For example, the metal content in the solvent is preferably 10 ppb (parts per billion) by mass or less. A solvent in which the metal content is at a level of ppt (parts per trillion) by mass may be used as desired, and such a high-purity solvent is provided by, for example, Toyo Kasei Kogyo Co., Ltd. (The Chemical Daily, Nov. 13, 2015).

Examples of a method for removing impurities such as a metal from the solvent include distillation (such as molecular distillation and thin-film distillation) and filtration using a filter. The filter pore size of the filter used for the filtration is preferably 10 μm or less, more preferably 5 μm or less, and still more preferably 3 μm or less. As a material of the filter, polytetrafluoroethylene, polyethylene, or nylon is preferable.

The solvent may include isomers (compounds having the same number of atoms and different structures). In addition, only one kind of isomers may be included, or a plurality of isomers may be included.

The organic solvent preferably has the content of peroxides of 0.8 mmol/L or less, and more preferably, the organic solvent does not substantially include peroxides.

The content of the solvent in the curable composition is preferably 10 mass % to 95 mass %, more preferably 20 mass % to 90 mass %, and still more preferably 30 mass % to 90 mass %.

In addition, from the viewpoint of environmental regulation, it is preferable that the curable composition according to the embodiment of the present disclosure does not substantially contain environmentally regulated substances. In the present disclosure, the description "does not substantially contain environmentally regulated substances" means that the content of the environmentally regulated substances in the coloring composition is 50 ppm by mass or less, preferably 30 ppm by mass or less, still more preferably 10 ppm by mass or less, and particularly preferably 1 ppm by mass or less.

<Polymerization Inhibitor>

The curable composition according to the embodiment of the present disclosure preferably further includes a polymerization inhibitor.

Examples of the polymerization inhibitor include hydroquinone, p-methoxyphenol, di-tert-butyl-p-cresol, 2,2,6,6-tetramethylpiperidin-1-oxyl, 2,2,6,6-tetramethyl-4-hydroxypiperidin-1-oxyl, pyrogallol, tert-butyl catechol, benzoquinone, 4,4'-thiobis(3-methyl-6-tert-butylphenol), 2,2'-methylenebis(4-methyl-6-t-butylphenol), and an N-nitrosophenylhydroxylamine salt (an ammonium salt, a cerous salt, or the like). Among these, it is preferable to include at least one compound selected from the group consisting of 2,2,6,6-tetramethylpiperidin-1-oxyl and 2,2,6,6-tetramethyl-4-hydroxypiperidin-1-oxyl. The content of the polymerization inhibitor in the total solid content of the curable composition is preferably 0.0001 mass % to 5 mass %.

<Surfactant>

The curable composition according to the embodiment of the present disclosure can contain a surfactant.

As the surfactant, various surfactants such as a fluorine-based surfactant, a nonionic surfactant, a cationic surfactant, an anionic surfactant, and a silicon-based surfactant can be used. With regard to the surfactant, reference can be made to the description in paragraphs 0238 to 0245 of WO2015/166779A and paragraphs 0253 to 0260 of JP2018-173660A, the contents of which are incorporated herein by reference.

It is preferable that the surfactant is a fluorine-based surfactant. By containing a fluorine-based surfactant in the curable composition, liquid characteristics (particularly, fluidity) are further improved, and liquid saving properties can be further improved. In addition, it is possible to form a film with a small thickness unevenness.

The fluorine atom content in the fluorine-based surfactant is preferably 3 mass % to 40 mass %, more preferably 5 mass % to 30 mass %, and particularly preferably 7 mass % to 25 mass %. The fluorine-based surfactant in which the fluorine atom content is within the above-described range is effective in terms of the evenness of the thickness of the coating film or liquid saving properties and the solubility of the surfactant in the curable composition is also good.

The content of the surfactant in the total solid content of the curable composition is preferably 0.001 mass % to 5.0 mass % and more preferably 0.005 mass % to 3.0 mass %. The surfactant may be used singly or in combination of two or more kinds thereof. In a case of using two or more kinds thereof, the total content thereof is preferably within the above-described range.

<Ultraviolet Absorber>

The curable composition according to the embodiment of the present disclosure preferably includes an ultraviolet absorber.

As the ultraviolet absorber, a conjugated diene compound, an aminodiene compound, a salicylate compound, a benzophenone compound, a benzotriazole compound, an acrylonitrile compound, a hydroxyphenyltriazine compound, an indole compound, a triazine compound, or the like can be used. With regard to details thereof, reference can be made to the description in paragraphs 0052 to 0072 of JP2012-208374A, paragraphs 0317 to 0334 of JP2013-068814A, and paragraphs 0061 to 0080 of JP2016-162946A, the contents of which are incorporated herein by reference. Examples of a commercially available product of the ultraviolet absorber include UV-503 (manufactured by Daito Chemical Co., Ltd). In addition, examples of the benzotriazole compound include MYUA series manufactured by Miyoshi Oil & Fat Co., Ltd. (The Chemical Daily, Feb. 1, 2016). In addition, as the ultraviolet absorber, compounds described in paragraphs 0049 to 0059 of JP6268967B can also be used.

The content of the ultraviolet absorber in the total solid content of the curable composition is preferably 0.01 mass % to 10 mass % and more preferably 0.01 mass % to 5 mass %. The ultraviolet absorber may be used singly or in combination of two or more kinds thereof. In a case where two or more kinds thereof are used, it is preferable that the total amount thereof is within the above-described range.

<Antioxidant>

The curable composition according to the embodiment of the present disclosure can contain an antioxidant.

Examples of the antioxidant include a phenol compound, a phosphite ester compound, and a thioether compound. As the phenol compound, any phenol compound which is known as a phenol-based antioxidant can be used. Preferred examples of the phenol compound include a hindered phenol compound. A compound having a substituent at a site (ortho position) adjacent to a phenolic hydroxy group is preferable. As the above-described substituent, a substituted or unsubstituted alkyl group having 1 to 22 carbon atoms is preferable. In addition, as the antioxidant, a compound having a phenol group and a phosphite ester group in the same molecule is also preferable. In addition, as the antioxidant, a phosphorus antioxidant can also be suitably used. Examples of the phosphorus antioxidant include tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl)oxy]ethyl]amine, and ethyl bis(2,4-di-tert-butyl-6-methylphenyl) phosphite. Examples of a commercially available product of the antioxidant include ADK STAB AO-20, ADK STAB AO-30, ADK STAB AO-40, ADK STAB AO-50, ADK STAB AO-50F, ADK STAB AO-60, ADK STAB AO-60G, ADK STAB AO-80, and ADK STAB AO-330 (all of which are manufactured by ADEKA Corporation). In addition, as the antioxidant, compounds described in paragraphs 0023 to 0048 of JP6268967B, compounds described in KR10-2019-0059371A, and the like can also be used.

The content of the antioxidant in the total solid content of the curable composition is preferably 0.01 mass % to 20 mass % and more preferably 0.3 mass % to 15 mass %. The antioxidant may be used singly or in combination of two or more kinds thereof. In a case where two or more kinds thereof are used, the total content thereof is preferably within the above-described range.

<Other Components>

Optionally, the curable composition according to the embodiment of the present disclosure may further contain a sensitizer, a curing accelerator, a filler, a thermal curing accelerator, a plasticizer, and other auxiliary agents (for example, conductive particles, an antifoaming agent, a flame retardant, a leveling agent, a peeling accelerator, an aromatic chemical, a surface tension adjuster, or a chain transfer agent). By appropriately containing these components, properties such as film properties can be adjusted. The details of the components can be found in, for example, paragraphs 0183 and later of JP2012-003225A (corresponding to paragraph 0237 of US2013/0034812A) and paragraphs 0101 to 0104 and 0107 to 0109 of JP2008-250074A, the contents of which are incorporated herein by reference.

In addition, optionally, the curable composition according to the embodiment of the present disclosure may contain a potential antioxidant. Examples of the potential antioxidant include a compound in which a site functioning as an antioxidant is protected by a protective group, and the protective group is eliminated by heating the compound at 100° C. to 250° C. or heating the compound at 80° C. to 200° C. in the presence of an acid or base catalyst so that the compound functions as an antioxidant. Examples of the potential antioxidant include the compounds described in WO2014/021023A, WO2017/030005A, and JP2017-

008219A. Examples of a commercially available product thereof include ADEKA ARKLS GPA-5001 (manufactured by ADEKA Corporation).

In addition, in order to adjust the refractive index of a film to be obtained, the curable composition according to the embodiment of the present disclosure may contain a metal oxide. Examples of the metal oxide include $TiO_2$, $ZrO_2$, $Al_2O_3$, and $SiO_2$. The primary particle diameter of the metal oxide is preferably 1 nm to 100 nm, more preferably 3 nm to 70 nm, and most preferably 5 nm to 50 nm. The metal oxide may have a core-shell structure, and in this case, the core portion may be hollow.

In addition, the curable composition according to the embodiment of the present disclosure may include a light-resistance improver.

For example, in a case where a film is formed by application, the viscosity (25° C.) of the curable composition according to the embodiment of the present disclosure is preferably 1 mPa·s to 100 mPa·s. The lower limit is more preferably 2 mPa·s or more and still more preferably 3 mPa·s or more. The upper limit is more preferably 50 mPa·s or less, still more preferably 30 mPa·s or less, and particularly preferably 15 mPa·s or less.

In the curable composition according to the embodiment of the present disclosure, the content of liberate metal which is not bonded to or coordinated with a pigment or the like is preferably 100 ppm or less, more preferably 50 ppm or less, and still more preferably 10 ppm or less, it is particularly preferable to not contain the liberate metal substantially. According to this aspect, effects such as stabilization of pigment dispersibility (restraint of aggregation), improvement of spectral characteristics due to improved dispersibility, restraint of conductivity fluctuation due to stabilization of curable components or elution of metal atoms and metal ions, and improvement of display characteristics can be expected.

It is also preferable that the curable composition according to the embodiment of the present disclosure does not substantially include terephthalic acid ester. Here, the "does not substantially include" means that the content of terephthalic acid ester is 1,000 mass ppb or less in the total mass of the curable composition, and it is more preferable to be 100 mass ppb or less and particularly preferable to be 0.

The moisture content of the curable composition in the present disclosure is preferably 3 mass % or less, more preferably 0.01 mass % to 1.5 mass %, and particularly preferably 0.1 mass % to 1.0 mass %. The moisture content can be measured by a Karl Fischer method.

<Storage Container>

A storage container of the curable composition according to the embodiment of the present disclosure is not particularly limited, and a known storage container can be used. In addition, as the storage container, it is also preferable to use a multilayer bottle having a container interior wall constituted with six layers from six kinds of resins or a bottle having a 7-layer structure from 6 kinds of resins for the purpose of suppressing infiltration of impurities into raw materials or curable compositions. Examples of such a container include the containers described in JP2015-123351A.

In addition, for the curable composition according to the embodiment of the present disclosure or a composition used for manufacturing an image sensor, for the purpose of preventing metal elution from the container interior wall, improving storage stability of the composition, and suppressing the alteration of components, it is also preferable that the interior wall of the storage container is formed of glass, stainless steel, or the like.

<Method for Producing Curable Composition>

The curable composition according to the embodiment of the present disclosure can be produced by mixing the above-described components. During the production of the curable composition, all the components may be dissolved and/or dispersed in a solvent at the same time to produce the curable composition. Optionally, two or more solutions or dispersion liquids in which the respective components are appropriately blended may be prepared, and the solutions or dispersion liquids may be mixed with each other during use (during application) to produce the curable composition.

In addition, in the production of the curable composition, a process of dispersing the pigment is preferably included. In the process for dispersing the pigment, examples of a mechanical force which is used for dispersing the pigment include compression, pressing, impact, shear, and cavitation. Specific examples of these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. In addition, in the pulverization of the pigment in a sand mill (beads mill), it is preferable to perform a treatment under the condition for increasing a pulverization efficiency by using beads having small diameters; increasing the filling rate of the beads; or the like. Incidentally, it is preferable to remove coarse particles by filtration, centrifugation, or the like after the pulverization treatment.

During the production of the curable composition, it is preferable that the curable composition is filtered through a filter, for example, in order to remove foreign matters or to reduce defects. As the filter, any filters that have been used in the related art for filtration use and the like may be used without particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including a high-density polypropylene) and nylon are preferable.

The pore size of the filter is preferably 0.01 µm to 7.0 µm, more preferably 0.01 µm to 3.0 µm, and still more preferably 0.05 µm to 0.5 µm. In a case where the pore size of the filter is within the above-described range, fine foreign matters can be reliably removed. With regard to the pore size value of the filter, reference can be made to a nominal value of filter manufacturers. As the filter, various filters provided by Nihon Pall Corporation (DFA4201NIEY and the like), Advantec Toyo Kaisha., Ltd., Nihon Entegris G.K. (formerly Nippon Microlith Co., Ltd.), Kitz Microfilter Corporation, and the like can be used.

In addition, it is preferable that a fibrous filter material is used as the filter. Examples of the fibrous filter material include a polypropylene fiber, a nylon fiber, and a glass fiber. Examples of a commercially available product include SBP type series (SBP008 and the like), TPR type series (TPR002, TPR005, and the like), or SHPX type series (SHPX003 and the like), all manufactured by Roki Techno Co., Ltd.

In a case of using a filter, different filters (for example, a first filter, a second filter, and the like) may be combined. In this case, the filtration with each of the filters may be performed once or may be performed twice or more times. In addition, filters having different pore sizes within the above-described range may be combined. In addition, the filtration through the first filter may be performed with only a dispersion liquid, the other components may be mixed therewith, and then the filtration through the second filter may be performed.

(Cured Product)

The cured product according to the embodiment of the present disclosure is a cured product obtained by curing the curable composition according to the embodiment of the present disclosure.

The cured product according to the embodiment of the present disclosure can be suitably used in a color filter or the like. Specifically, the cured product according to the embodiment of the present invention can be preferably used as a colored layer (pixel) of a color filter.

The cured product according to the embodiment of the present disclosure is preferably a film-like cured product (cured film), and the film thickness thereof can be appropriately adjusted depending on the purposes. For example, the film thickness is preferably 20 µm or less, more preferably 10 µm or less, and still more preferably 5 µm or less. The lower limit of the film thickness is preferably 0.1 µm or more, more preferably 0.2 µm or more, and still more preferably 0.3 µm or more.

(Color Filter)

Next, the color filter according to an embodiment of the present disclosure will be described.

The color filter according to the embodiment of the present disclosure has the cured product according to the embodiment of the present disclosure, and it is preferable to have the cured product according to the embodiment of the present disclosure as a pixel of the color filter. The color filter according to the embodiment of the present disclosure can be used for a solid-state imaging element such as a charge coupled device (CCD) and a complementary metal-oxide semiconductor (CMOS), an image display device, or the like.

The above-described pixel of the color filter is not particularly limited, and examples thereof include a red pixel, a green pixel, a blue pixel, a cyan pixel, a yellow pixel, and a magenta pixel.

In the color filter according to the embodiment of the present disclosure, the thickness of a film consisting of the cured product according to the embodiment of the present disclosure can be appropriately adjusted depending on the purposes. The film thickness is preferably 20 µm or less, more preferably 10 µm or less, and still more preferably 5 µm or less. The lower limit of the film thickness is preferably 0.1 µm or more, more preferably 0.2 µm or more, and still more preferably 0.3 µm or more.

In the color filter according to the embodiment of the present disclosure, the width of the pixel is preferably 0.5 µm to 20.0 µm. The lower limit is preferably 1.0 µm or more and more preferably 2.0 µm or more. The upper limit is preferably 15.0 µm or less and more preferably 10.0 µm or less. In addition, the Young's modulus of the pixel is preferably 0.5 GPa to 20 GPa and more preferably 2.5 GPa to 15 GPa.

Each pixel included in the color filter according to the embodiment of the present disclosure preferably has high flatness. Specifically, the surface roughness Ra of the pixel is preferably 100 nm or less, more preferably 40 nm or less, and still more preferably 15 nm or less. The lower limit is not specified, but is preferably, for example, 0.1 nm or more. The surface roughness of the pixel can be measured, for example, using an atomic force microscope (AFM) Dimension 3100 manufactured by Veeco Instruments, Inc. In addition, the contact angle of water on the pixel can be appropriately set to a preferred value and is typically in the range of 500 to 110°. The contact angle can be measured, for example, using a contact angle meter CV-DT-A Model (manufactured by Kyowa Interface Science Co., Ltd.). In addition, it is preferable that the volume resistivity value of the pixel is high. Specifically, the volume resistivity value of the pixel is preferably $10^9$ Ω·cm or more and more preferably $10^{11}$ Ω·cm or more. The upper limit is not specified, but is, for example, preferably $10^{14}$ Ω·cm or less. The volume resistivity value of the pixel can be measured, for example, using an ultra-high resistance meter 5410 (manufactured by Advantest Corporation).

In addition, the pixel obtained by curing the curable composition according to the embodiment of the present disclosure can also be suitably used in a pixel configuration described in WO2019/102887A.

In addition, in the color filter according to the embodiment of the present disclosure, a protective layer may be provided on a surface of the cured product according to the embodiment of the present disclosure. By providing the protective layer, various functions such as oxygen shielding, low reflection, hydrophilicity/hydrophobicity, and shielding of light (ultraviolet rays, near-infrared rays, and the like) having a specific wavelength can be imparted. The thickness of the protective layer is preferably 0.01 µm to 10 µm and more preferably 0.1 µm to 5 µm. Examples of a method for forming the protective layer include a method of forming the protective layer by applying a resin composition dissolved in an organic solvent, a chemical vapor deposition method, and a method of attaching a molded resin with an adhesive. Examples of components constituting the protective layer include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamidoimide resin, a polyolefin resin, a cyclic olefin resin, a polyester resin, a styrene resin, a polyol resin, a polyvinylidene chloride resin, a melamine resin, a urethane resin, an aramid resin, a polyamide resin, an alkyd resin, an epoxy resin, a modified silicone resin, a fluororesin, a polycarbonate resin, a polyacrylonitrile resin, a cellulose resin, Si, C, W, $Al_2O_3$, Mo, $SiO_2$, and $Si_2N_4$, and two or more kinds of these components may be contained. For example, in a case of a protective layer for oxygen shielding, it is preferable that the protective layer contains a polyol resin, $SiO_2$, and $Si_2N_4$. In addition, in a case of a protective layer for low reflection, it is preferable that the protective layer contains a (meth)acrylic resin and a fluororesin.

In a case of forming the protective layer by applying a resin composition, as a method for applying the resin composition, a known method such as a spin coating method, a casting method, a screen printing method, and an ink jet method can be used. As the organic solvent included in the resin composition, a known organic solvent (for example, propylene glycol 1-monomethylether-2-acetate, cyclopentanone, ethyl lactate, and the like) can be used. In a case of forming the protective layer by a chemical vapor deposition method, as the chemical vapor deposition method, a known chemical vapor deposition method (thermochemical vapor deposition method, plasma chemical vapor deposition method, and photochemical vapor deposition method) can be used.

The protective layer may contain, as desired, an additive such as organic or inorganic particles, an absorber of a specific wavelength (for example, ultraviolet rays, near-infrared rays, and the like), a refractive index adjusting agent, an antioxidant, an adhesive agent, and a surfactant. Examples of the organic or inorganic particles include polymer fine particles (for example, silicone resin particles, polystyrene particles, and melamine resin particles), titanium oxide, zinc oxide, zirconium oxide, indium oxide, aluminum oxide, titanium nitride, titanium oxynitride, magnesium fluoride, hollow silica, silica, calcium carbonate, and barium sulfate. As the absorber of a specific wavelength, a known absorber can be used. Examples of the ultraviolet absorber and near-infrared absorber include the above-described materials. The content of these additives can be appropriately adjusted, but is preferably 0.1 mass % to 70 mass % and more preferably 1 mass % to 60 mass % with respect to the total weight of the protective layer.

In addition, as the protective layer, the protective layers described in paragraphs 0073 to 0092 of JP2017-151176A can also be used.

The color filter may have a base layer. The base layer can be formed, for example, of a composition obtained by removing the colorant from the above-described curable composition according to the embodiment of the present disclosure, and the composition forming the base layer preferably includes at least one selected from the group consisting of the above-described binder polymer, surfactant, and polymerizable compound.

Further, a surface contact angle of the base layer in the color filter, preferably in a color filter having red, green, and blue (RGB) pixels, is preferably 200 to 700 in a case of being measured with diiodomethane, and preferably 300 to 800 in a case of being measured with water. Within the above-described range of contact angle, coating properties in a case of forming the color filter are appropriate, and application properties of the composition forming the base layer are also excellent. In order to set the contact angle within the above-described range, a method such as addition of a surfactant can be mentioned.

<Method for Manufacturing Color Filter>

Next, a method for manufacturing the color filter according to the embodiment of the present disclosure will be described.

The color filter according to the embodiment of the present disclosure can be suitably manufactured through a step of forming a curable composition layer on a support using the curable composition according to the embodiment of the present disclosure, and a step of forming a pattern on the curable composition layer by a photolithography method or a dry etching method.

—Photolithography Method—

First, a case of forming a pattern by a photolithography method to manufacture a color filter will be described.

Pattern formation by a photolithography method preferably includes a step of forming a curable composition layer on a support using the curable composition according to the embodiment of the present disclosure, a step of exposing the curable composition layer in a patterned manner, and a step of removing a non-exposed portion of the curable composition layer by development to form a pattern (pixel). A step (pre-baking step) of baking the curable composition layer and a step (post-baking step) of baking the developed pattern (pixel) may be provided, as desired.

In the step of forming a curable composition layer, a coloring composition layer is formed on a support using the curable composition according to the embodiment of the present disclosure. The support is not particularly limited, and can be appropriately selected depending on applications. Examples thereof include a glass substrate and a silicon substrate, and a silicon substrate is preferable. In addition, a charge coupled device (CCD), a complementary metal-oxide semiconductor (CMOS), a transparent conductive film, or the like may be formed on the silicon substrate. In some cases, a black matrix for isolating each pixel is formed on the silicon substrate. In addition, an undercoat layer may be provided on the silicon substrate so as to improve adhesiveness to an upper layer, prevent the diffusion of materials, or planarize the surface of the substrate.

As a method for applying the curable composition, a known method can be used. Examples thereof include a dropping method (drop casting); a slit coating method; a spray method; a roll coating method; a spin coating method (spin coating); a cast coating method; a slit and spin method; a pre-wet method (for example, a method described in JP2009-145395A), various printing methods such as an ink jet (for example, on-demand type, piezo type, thermal type), a discharge printing such as nozzle jet, a flexo printing, a screen printing, a gravure printing, a reverse offset printing, and a metal mask printing; a transfer method using molds and the like; and a nanoimprinting method. A method for applying the ink jet is not particularly limited, and examples thereof include a method described in "Extension of Use of Ink Jet—Infinite Possibilities in Patent—" (February, 2005, S. B. Research Co., Ltd.) (particularly, pp. 115 to 133) and methods described in JP2003-262716A, JP2003-185831A, JP2003-261827A, JP2012-126830A, and JP2006-169325A. In addition, with regard to the method for applying the curable composition, reference can be made to the description in WO2017/030174A and WO2017/018419A, the contents of which are incorporated herein by reference.

The curable composition layer formed on the support may be dried (pre-baked). In a case of producing a film by a low-temperature process, pre-baking may not be performed. In a case of performing the pre-baking, the pre-baking temperature is preferably 150° C. or lower, more preferably 120° C. or lower, and still more preferably 110° C. or lower. The lower limit may be set to, for example, 50° C. or higher, or to 80° C. or higher. The pre-baking time is preferably 10 seconds to 300 seconds, more preferably 40 seconds to 250 seconds, and still more preferably 80 seconds to 220 seconds. The pre-baking can be performed using a hot plate, an oven, or the like.

<<Exposing Step>>

Next, the curable composition layer is exposed in a patterned manner (exposing step). For example, the curable composition layer can be exposed in a patterned manner using a stepper exposure device or a scanner exposure device through a mask having a predetermined mask pattern. Thus, the exposed portion can be cured.

Examples of the radiation (light) which can be used during the exposure include g-rays and i-rays. In addition, light (preferably light having a wavelength of 180 nm to 300 nm) having a wavelength of 300 nm or less can be used. Examples of the light having a wavelength of 300 nm or less include KrF-rays (wavelength: 248 nm) and ArF-rays (wavelength: 193 nm), and KrF-rays (wavelength: 248 nm) are preferable. In addition, a long-wave light source of 300 nm or more can be used.

The irradiation amount (exposure amount) is, for example, preferably 0.03 $J/cm^2$ to 2.5 $J/cm^2$ and more preferably 0.05 $J/cm^2$ to 1.0 $J/cm^2$. The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to an atmospheric air. In addition, the exposure illuminance can be appropriately set, and can be preferably selected from a range of 1,000 W/m$^2$ to 100,000 W/m$^2$ (for example, 5,000 W/m$^2$, 15,000 W/m$^2$, or 35,000 W/m$^2$). Appropriate conditions of each of the oxygen concentration and the exposure illuminance may be combined, and for example, a combination of the oxygen concentration of 10% by volume and the illuminance of 10,000 W/m$^2$, a combination of the oxygen concentration of 35% by volume and the illuminance of 20,000 W/m$^2$, or the like is available.

Next, the non-exposed portion of the curable composition layer is removed by development to form a pattern (pixel). The non-exposed portion of the coloring composition layer can be removed by development using a developer. Thus, the curable composition layer of the non-exposed portion in the exposing step is eluted into the developer, and as a result, only a photocured portion remains. As the developer, an organic alkali developer causing no damage on a base of element, circuit, or the like is desirable. The temperature of the developer is preferably, for example, 20° C. to 30° C. The development time is preferably 20 seconds to 180 seconds. In addition, in order to improve residue removing properties, a step of removing the developer by shaking off per 60 seconds and supplying a fresh developer may be repeated multiple times.

As the developer, an aqueous alkaline solution (alkali developer) obtained by diluting an alkali agent with pure water is preferable. Examples of the alkali agent include organic alkaline compounds such as ammonia, ethylamine, diethylamine, dimethylethanolamine, diglycol amine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethylbis(2-hydroxyethyl)ammonium hydroxide, choline, pyrrole, piperidine, and 1,8-diazabicyclo[5.4.0]-7-undecene, and inorganic alkaline compounds such as sodium hydroxide, potassium hydroxide, sodium carbonate, sodium hydrogen carbonate, sodium silicate, and sodium metasilicate. In consideration of environmental aspects and safety aspects, the alkali agent is preferably a compound having a high molecular weight. The concentration of the alkali agent in the alkaline solution is preferably 0.001 to 10 mass % and more preferably 0.01 to 1 mass %. In addition, the developer may further contain a surfactant. Examples of the surfactant include the surfactants described above, and the surfactant is preferably a nonionic surfactant.

After the development, it is preferable to carry out an additional exposure treatment or a heating treatment (post-baking) after carrying out drying. The additional exposure treatment or the post-baking is a curing treatment after development in order to complete curing. The heating temperature in the post-baking is preferably, for example, 100° C. to 240° C. and more preferably 200° C. to 240° C. The post-baking can be performed continuously or batchwise by using a heating unit such as a hot plate, a convection oven (hot-air circulation dryer), and a high-frequency heater so that the film after development satisfies the conditions. In a case of carrying out the additional exposure treatment, light used for the exposure is preferably light having a wavelength of 400 nm or less. In addition, the additional exposure treatment may be carried out by the method described in KR2017-0122130A.

—Dry Etching Method—

Next, a case of forming a pattern by a dry etching method to manufacture a color filter will be described. Pattern formation by a dry etching method preferably includes a step of forming a curable composition layer on a support using the curable composition according to the embodiment of the present disclosure and curing the entire curable composition layer to form a cured composition layer, a step of forming a photoresist layer on the cured composition layer, a step of exposing the photoresist layer in a patterned manner and then developing the photoresist layer to form a resist pattern, and a step of dry-etching the cured composition layer through this resist pattern as a mask and using an etching gas. It is preferable that pre-baking treatment is further performed in order to form the photoresist layer. In particular, as the forming process of the photoresist layer, it is desirable that a heating treatment after exposure and a heating treatment after development (post-baking treatment) are performed. The details of the pattern formation by the dry etching method can be found in paragraphs 0010 to 0067 of JP2013-064993A, the content of which is incorporated herein by reference.

<Solid-State Imaging Element>

It is preferable that the solid-state imaging element according to the embodiment of the present disclosure includes the cured product according to the embodiment of the present disclosure and has the color filter according to the embodiment of the present disclosure.

Examples of a preferred aspect of the solid-state imaging element according to the embodiment of the present disclosure include an aspect in which at least one pixel selected from the group consisting of a red pixel, a green pixel, and a blue pixel is the cured product according to the embodiment of the present disclosure (RGB pixels).

In addition, examples of another preferred aspect of the solid-state imaging element according to the embodiment of the present disclosure include an aspect in which at least one pixel selected from the group consisting of a cyan pixel, a yellow pixel, and a magenta pixel is the cured product according to the embodiment of the present disclosure (CMY pixels).

The configuration of the solid-state imaging element according to the embodiment of the present disclosure is not particularly limited as long as the solid-state imaging element is configured to include the cured product according to the embodiment of the present disclosure and functions as a solid-state imaging element. Examples of the configuration include the following configurations.

The solid-state imaging element is configured to have a plurality of photodiodes constituting a light receiving area of the solid-state imaging element (a charge coupled device (CCD) image sensor, a complementary metal-oxide semiconductor (CMOS) image sensor, or the like), and a transfer electrode formed of polysilicon or the like on a substrate; have a light-shielding film having openings only over the light receiving section of the photodiodes on the photodiodes and the transfer electrodes; have a device-protective film formed of silicon nitride or the like, which is formed to coat the entire surface of the light-shielding film and the light receiving section of the photodiodes, on the light-shielding film; and have a color filter on the device-protective film. Further, the solid-state imaging element may also be configured, for example, such that it has a light collecting unit (for example, a microlens, which is the same hereinafter) on a device-protective film under a color filter (a side closer to the substrate), or has a light collecting unit on a color filter. In addition, the color filter may have a structure in which each colored pixel is embedded in a space partitioned in, for example, a lattice shape by a partition wall. The partition wall in this case preferably has a low refractive index for each colored pixel. Examples of an imaging device having such a structure include the devices described in JP2012-227478A, JP2014-179577A, and WO2018/043654A. An imaging device including the solid-state imaging element according to the embodiment of the present disclosure can also be used as a vehicle camera or a surveillance camera, in addition to a digital camera or electronic apparatus (mobile phones or the like) having an imaging function.

In addition, in the solid-state imaging element according to the embodiment of the present disclosure, by providing an ultraviolet absorbing layer (UV cut filter) in the structure of the solid-state imaging element, as described in JP2019-211559A, light resistance of the color filter may be improved.

(Image Display Device)

It is preferable that the image display device according to the embodiment of the present disclosure includes the cured product according to the embodiment of the present disclosure and has the color filter according to the embodiment of the present disclosure. Examples of the image display device include a liquid crystal display device or an organic electroluminescent display device. The definitions of image display devices or the details of the respective image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd.)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device is not particularly limited, and examples thereof include various liquid crystal display devices described in "Liquid Crystal Display Technology for Next Generation".

EXAMPLES

Hereinafter, the present disclosure will be described in detail with reference to examples, but the present disclosure is not limited thereto.

In the examples, "%" and "parts" respectively indicate "mass %" and "parts by mass" unless otherwise specified. In a polymer compound, the molecular weight indicates the weight-average molecular weight (Mw) and the proportion of constitutional units indicates mole percentage unless otherwise specified.

—Measuring Method of Thiol Value—

1. Preparation of color solution: an acetone solution having 2.5 mM of 5,5'-dithiobis(2-nitrobenzoic acid) (DTNB) and 2.7 mM of triethylamine was prepared.
2. Preparation of sample for calibration curve: a solution diluted with an eluent for high performance liquid chromatography (HPLC) was prepared so that 3-mercaptopropionic acid was 0.1 M (=0.1 mol/l).
3. Using the solution prepared in 2. to the solution prepared in 1., the sample added so that 3-mercaptopropionic acid was 0.2 mM was stirred at room temperature for 20 minutes. A sample for calibration curve was prepared by diluting 3-mercaptopropionic acid to which the above-described sample was added so as to be 0.1 ppm, 1 ppm, 10 ppm, and 100 ppm.
4. A mixed solution of 10 g of each sample of Examples and 50 mL of the solution prepared in 1. was stirred at room temperature for 20 minutes, and the reaction solution was put into a 100 mL volumetric flask, washed with 5 mL of acetone, and diluted in the volumetric flask with the eluent for HPLC.
5. The sample obtained in 4. was filtered and used as a measurement sample.
6. 2-nitro-5-mercaptobenzoic acid was quantified by the following HPLC measurement. From the result of the sample for calibration curve, a calibration curve was obtained, and based on this, the mol amount of the thiol group included in the sample of Examples was calculated and used as the thiol value.

<<HPLC Measurement Conditions>>

Eluent: an aqueous solution containing 0.2% of phosphoric acid and 0.2% of triethylamine was prepared, mixed with methanol, and adjusted to a ratio of 90/10 (aqueous solution/methanol)

Measuring equipment: Agilent-1200 (manufactured by Agilent Technologies, Inc.)

Column: Synergi 4u Polar-RP 80A manufactured by Phenomenex; 250 mm×4.60 mm (inner diameter)+guard column Column temperature: 40° C.

Analysis time: 15 minutes

Flow rate: 1.0 mL/min (maximum liquid feeding pressure: 182 bar (18.2 MPa))

Injection amount: 5 μL

Detection wavelength: 412 nm

μMeasuring Method of Weight-Average Molecular Weight—

The weight-average molecular weight (Mw) of each macromonomer and resin was calculated by Gel permeation chromatography (GPC) measurement under the following measurement conditions.

Device: HLC-8220GPC (manufactured by Tosoh Corporation)

Detector: differential refractometer (RI detector)

Pre-column: TSKGUARD COLUMN SUPERAW-H 4.6 mm×35 mm (manufactured by Tosoh Corporation)

Sample-side column: following 4 columns are directly connected in series (all manufactured by Tosoh Corporation)

TSK-GEL SuperAW-4000 6.0 mm×150 mm
TSK-GEL SuperAW-3000 6.0 mm×150 mm
TSK-GEL SuperAW-2500 6.0 mm×150 mm
TSK-GEL SuperAW-2500 6.0 mm×150 mm Reference-side column: same as the sample-side column Constant-temperature tank temperature: 40° C.

Mobile phase: N-methylpyrrolidone solution with lithium bromide added to 10 mmol/L Sample-side mobile phase flow rate: 0.5 mL/min Reference-side mobile phase flow rate: 0.1 mL/min Sample concentration: 0.1 mass %

Sample injection amount: 100 μL

Data collection time: 16 minutes to 60 minutes after sample injection

Sampling pitch: 300 ms (milliseconds)

—Measuring Method of Acid Value—

The acid value of each resin was determined by a neutralization titration using a sodium hydroxide aqueous solution. Specifically, the obtained resin was dissolved in a solvent, the solution was titrated with a sodium hydroxide aqueous solution using a potential difference measurement method to calculate the number of millimoles of the acid included in 1 g of the solid resin, and then the acid value was determined by multiplying the calculated value by 56.1 as a molecular weight of potassium hydroxide (KOH). The unit of the acid value is mgKOH/g.

<Synthesis of Resin>
(Synthesis of Resin B-1)

50 parts by mass of methyl methacrylate, 50 parts by mass of n-butyl methacrylate, and 45.4 parts by mass of propylene glycol monomethyl ether acetate (PGMEA) were charged into a reaction container, and the atmosphere gas was replaced with nitrogen gas. The inside of the reaction container was heated to 70° C., 6 parts by mass of 3-mercapto-1,2-propanediol was added thereto, 0.12 parts by mass of azobisisobutyronitrile (AIBN) was further added thereto, and the mixture was reacted for 12 hours. It was confirmed by solid content measurement that 95% thereof was reacted. Next, 9.7 parts by mass of pyromellitic acid anhydride, 70.3 parts by mass of PGMEA, and 0.20 parts by mass of 1,8-diazabicyclo-[5.4.0]-7-undecene (DBU) as a catalyst were added thereto, and the mixture was reacted at 120° C. for 7 hours. It was confirmed by acid value measurement that 98% or more of the acid anhydride was half-esterified, and the reaction was terminated. PGMEA was added thereto to adjust non-volatile content (concentration of solid contents) to be 20 mass %, thereby obtaining a resin solution of a resin B-1 having an acid value of 43 mgKOH/g and a weight-average molecular weight (Mw) of 9,000.

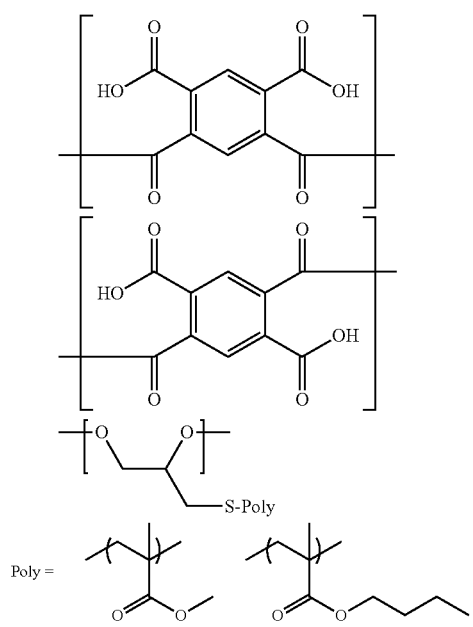

(B-1)

(Synthesis of Resin B-2)

50 parts by mass of methyl methacrylate, 30 parts by mass of n-butyl methacrylate, 20 parts by mass of t-butyl methacrylate, and 45.4 parts by mass of PGMEA were charged into a reaction container, and the atmosphere gas was replaced with nitrogen gas. The inside of the reaction container was heated to 70° C., 6 parts by mass of 3-mercapto-1,2-propanediol was added thereto, 0.12 parts by mass of AIBN was further added thereto, and the mixture was reacted for 12 hours. It was confirmed by solid content measurement that 95% thereof was reacted. Next, 9.7 parts by mass of pyromellitic acid anhydride, 70.3 parts by mass of PGMEA, and 0.20 parts by mass of DBU as a catalyst were added thereto, and the mixture was reacted at 120° C. for 7 hours. It was confirmed by acid value measurement that 98% or more of the acid anhydride was half-esterified, and the reaction was terminated. PGMEA was added thereto to adjust non-volatile content (concentration of solid contents) to be 20 mass %, thereby obtaining a resin solution of a resin B-2 having an acid value of 43 mgKOH/g and a weight-average molecular weight (Mw) of 9,000.

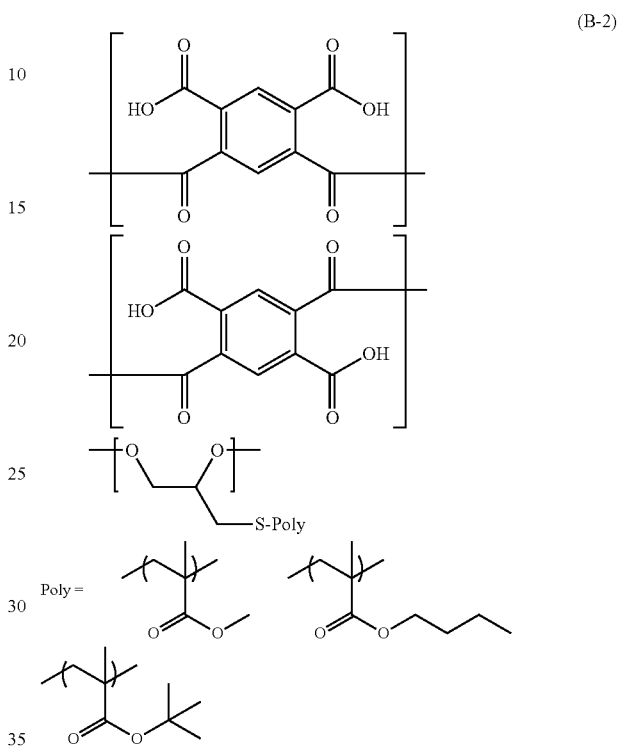

(B-2)

(Synthesis of Resin B-3)

A resin solution of a resin B-3 having an acid value of 43 mgKOH/g and a weight-average molecular weight (Mw) of 9,000 was obtained in the same manner as in the synthesis of the resin B-2, except that 20 parts by mass of t-butyl methacrylate was changed to (3-ethyloxetan-3-yl)methyl methacrylate.

(B-3)

-continued

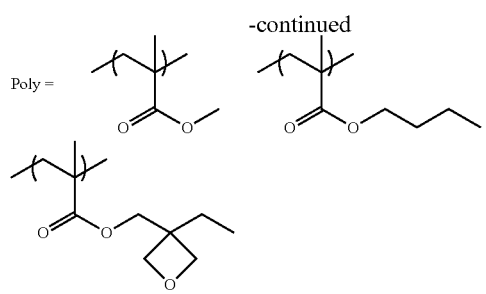

(Synthesis of Resin B-4)

A resin solution of a resin B-4 having an acid value of 43 mgKOH/g and a weight-average molecular weight (Mw) of 9,000 was obtained in the same manner as in the synthesis of the resin B-2, except that 20 parts by mass of t-butyl methacrylate was changed to "Karenz MOI-BM" manufactured by SHOWA DENKO K.K.

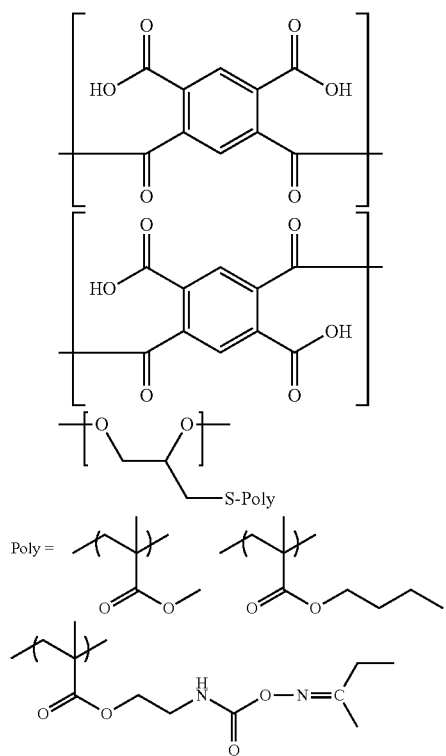

(B-4)

(Synthesis of Resin B-5)

6.0 parts by mass of 3-mercapto-1,2-propanediol, 9.5 parts by mass of pyromellitic acid anhydride, 62 parts by mass of PGMEA, and 0.2 parts by mass of 1,8-diazabicyclo-[5.4.0]-7-undecene were charged into a reaction container, and the atmosphere gas was replaced with nitrogen gas. The inside of the reaction container was heated to 100° C., and the mixture was reacted for 7 hours. After confirming by acid value measurement that 98% or more of the acid anhydride was half-esterified, the temperature in the system was lowered to 70° C., 53.5 parts by mass of PGMEA solution in which 65 parts by mass of methyl methacrylate, 5.0 parts by mass of ethyl acrylate, 15 parts by mass of t-butyl acrylate, 5.0 parts by mass of methacrylic acid, 10 parts by mass of hydroxyethyl methacrylate, and 0.1 parts by mass of 2,2'-azobisisobutyronitrile were dissolved was added thereto, and the mixture was reacted for 10 hours. It was confirmed by solid content measurement that the polymerization had proceeded by 95%, and the reaction was terminated. PGMEA was added thereto to adjust non-volatile content (concentration of solid contents) to be 20 mass %, thereby obtaining a resin solution of a resin B-5 having an acid value of 70.5 mgKOH/g and a weight-average molecular weight (Mw) of 10,000.

(B-5)

(Synthesis of Resin B-6)

108 parts by mass of 1-thioglycerol, 174 parts by mass of pyromellitic acid anhydride, 650 parts by mass of methoxypropyl acetate, and 0.2 parts by mass of monobutyltin oxide as a catalyst were charged into a reaction container, the atmosphere gas was replaced with nitrogen gas, and the mixture was reacted at 120° C. for 5 hours (first step). It was confirmed by acid value measurement that 95% or more of the acid anhydride was half-esterified. Next, 160 parts by mass of the compound obtained in the first step expressed in terms of solid contents, 200 parts by mass of 2-hydroxypropyl methacrylate, 200 parts by mass of ethyl acrylate, 150 parts by mass of t-butyl acrylate, 200 parts by mass of 2-methoxyethyl acrylate, 200 parts by mass of methyl acrylate, 50 parts by mass of methacrylic acid, and 663 parts by mass of PGMEA were charged to a reaction container, the inside of the reaction container was heated to 80° C., 1.2 parts by mass of 2,2'-azobis(2,4-dimethylvaleronitrile) was added thereto, and the mixture was reacted for 12 hours (second step). It was confirmed by solid content measurement that 95% thereof was reacted. Finally, 500 parts by mass of PGMEA solution of 50 mass % of the compound obtained in the second step, 27.0 parts by mass of 2-methacryloyloxyethyl isocyanate (MOI), 0.1 parts by mass of hydroquinone were charged to a reaction container, the reaction was performed until the disappearance of the peak of 2,270 cm$^{-1}$ based on the isocyanate group was confirmed (third step). After confirming the disappearance of the peak, the reaction solution was cooled, and PGMEA was added thereto to adjust non-volatile content (concentration of solid contents) to be 20 mass %, thereby obtaining a resin solution of a resin B-6 having an acid value of 68 mgKOH/g, an ethylenically unsaturated bonding value of 0.62 mmol/g, and a weight-average molecular weight (Mw) of 13,000.

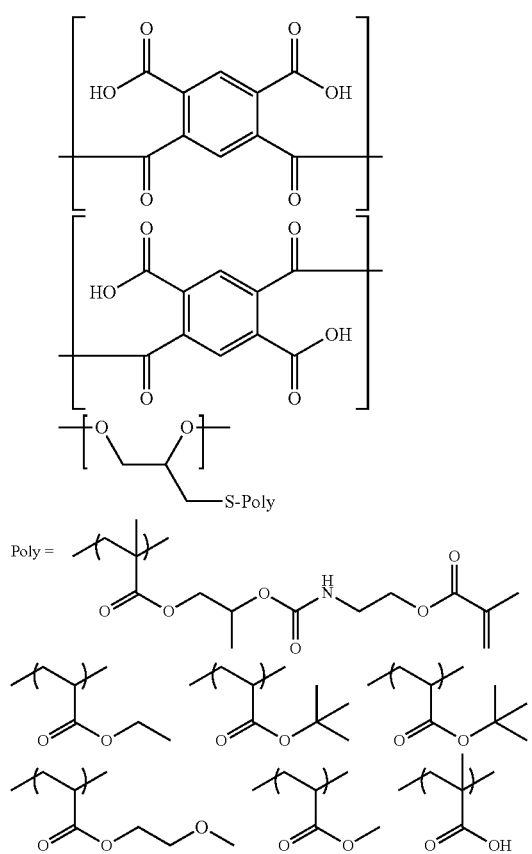

(B-6)

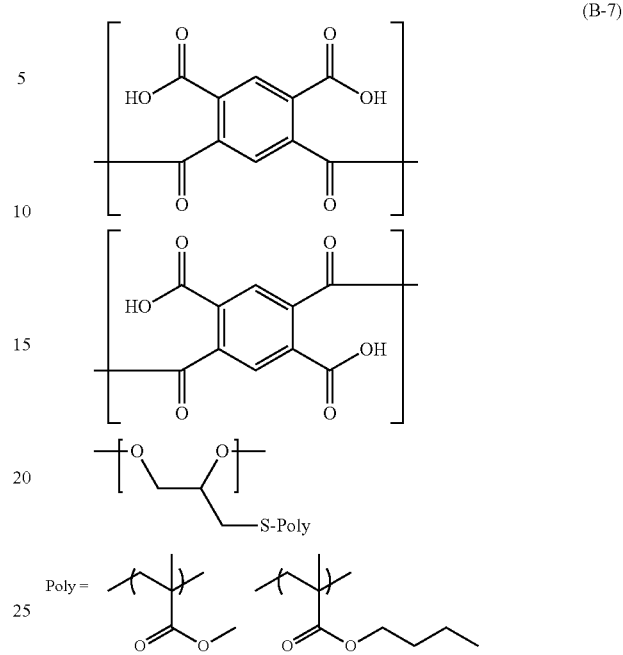

(B-7)

(Synthesis of Resin B-7)

40 parts by mass of methyl methacrylate, 60 parts by mass of n-butyl methacrylate, and 45.4 parts by mass of propylene glycol monomethyl ether acetate (PGMEA) were charged into a reaction container, and the atmosphere gas was replaced with nitrogen gas. The inside of the reaction container was heated to 70° C., 8 parts by mass of 3-mercapto-1,2-propanediol was added thereto, 0.12 parts by mass of AIBN was further added thereto, and the mixture was reacted for 12 hours. It was confirmed by solid content measurement that 95% thereof was reacted. Next, 13 parts by mass of pyromellitic acid anhydride, 70.3 parts by mass of PGMEA, and 0.20 parts by mass of DBU as a catalyst were added thereto, and the mixture was reacted at 120° C. for 7 hours. It was confirmed by acid value measurement that 98% or more of the acid anhydride was half-esterified, and the reaction was terminated. PGMEA was added thereto to adjust non-volatile content (concentration of solid contents) to be 20 mass %, thereby obtaining a resin solution of a resin B-7 having an acid value of 55 mgKOH/g and a weight-average molecular weight (Mw) of 10,000.

(Synthesis of Resin B-8)

50 parts by mass of methyl methacrylate, 50 parts by mass of n-butyl methacrylate, and 45.4 parts by mass of PGMEA were charged into a reaction container, and the atmosphere gas was replaced with nitrogen gas. The inside of the reaction container was heated to 70° C., 4.3 parts by mass of 2-mercaptoethanol was added thereto, 0.12 parts by mass of AIBN was further added thereto, and the mixture was reacted for 12 hours. It was confirmed by solid content measurement that 95% thereof was reacted. Next, 8.3 parts by mass of 2-methacryloyloxyethyl isocyanate (MOI) and 0.1 parts by mass of hydroquinone were charged to a reaction container, and the reaction was performed at 70° C. until the disappearance of the peak of 2,270 cm$^{-1}$ based on the isocyanate group was confirmed. Further, 10 parts by mass of methacrylic acid and 250 parts by mass of PGMEA were added thereto, 1 part by mass of dodecyl mercaptan and 0.12 parts by mass of AIBN were added thereto, and the mixture was reacted at 70° C. for 12 hours. PGMEA was added thereto to adjust non-volatile content (concentration of solid contents) to be 20 mass %, thereby obtaining a resin solution of a resin B-8 having an acid value of 53 mgKOH/g and a weight-average molecular weight (Mw) of 10,000.

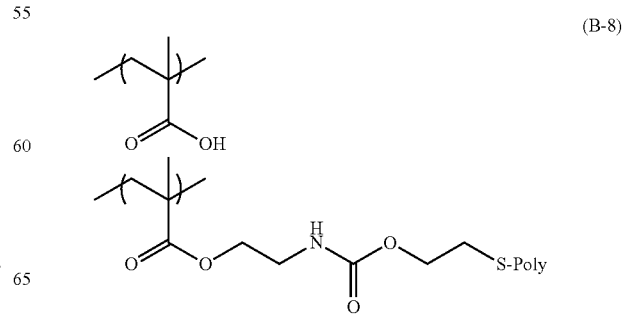

(B-8)

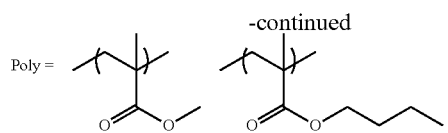

(Synthesis of Resin B-9)
<Synthesis of Macromonomer B9-1>

The method for synthesizing a macromonomer B9-1 is shown below.

ε-caprolactone (1,044.2 parts), 6-valerolactone (184.3 parts), and 2-ethyl-1-hexanol (71.6 parts) were charged into a three-neck flask to obtain a mixture. Next, the above-described mixture was stirred while blowing nitrogen.

Next, monobutyltin oxide (0.61 parts) was added to the mixture and the obtained mixture was heated to 90° C. After 6 hours, using $^1$H-nuclear magnetic resonance (NMR), it was confirmed that a signal derived from 2-ethyl-1-hexanol in the mixture had disappeared, and then the mixture was heated to 110° C. After continuing the polymerization reaction at 110° C. for 12 hours under nitrogen, it was confirmed by $^1$H-NMR that a signal derived from ε-caprolactone and 6-valerolactone had disappeared. Thereafter, the obtained compound was subjected to molecular weight measurement by a gel permeation chromatography (GPC) method (according to measurement conditions described later). After confirming that the molecular weight of the compound had reached the desired value, 2,6-di-t-butyl-4-methylphenol (0.35 parts) was added to the mixture containing the above-described compound, and 2-methacryloyloxyethyl isocyanate (87.0 parts) was added dropwise to the obtained mixture over 30 minutes. After 6 hours from the completion of the dropwise addition, it was confirmed by $^1$H-NMR that a signal derived from 2-methacryloyloxyethyl isocyanate (MOI) had disappeared, and then propylene glycol monomethyl ether acetate (PGMEA) (1,387.0 parts) was added to the mixture to obtain a macromonomer B9-1 solution (2,770 parts) having a concentration of 50 mass %. The structure of the macromonomer B9-1 was confirmed by $^1$H-NMR. The weight-average molecular weight of the obtained macromonomer B9-1 was 3,000.

(B9-1)

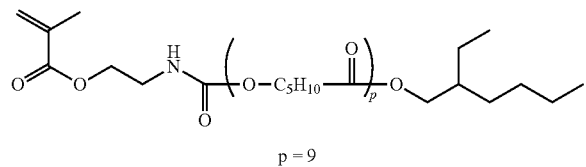

p = 9

<Synthesis of Resin B-9>

71.37 parts of ω-carboxy-polycaprolactone monoacrylate and 268.2 parts of PGMEA were charged into a three-neck flask, and the mixture was heated to 75° C. while flowing nitrogen into the flask. Separately, a dropping solution in which 71.37 parts of ω-carboxy-polycaprolactone monoacrylate, 229.4 parts of a macromonomer B-1 solution (114.7 parts of PGMEA and 114.7 parts of a macromonomer B-1) having a concentration (solid content) of 50 mass %, 182.0 parts of PGMEA, 2.54 parts of dodecyl mercaptan, and 1.73 parts of 2,2'-azobis(methyl 2-methylpropionate) (hereinafter, referred to as "V-601") were mixed was prepared. After adding a mixed solution of 0.89 parts of dodecyl mercaptan and 8.5 parts of PGMEA into the flask, the previously prepared dropping solution was added dropwise thereto over 4 hours. After completion of the dropwise addition, 21.1 parts of PGMEA was added thereto, and the mixture was further heated at 75° C. for 2 hours. Further, a mixed solution of 0.87 parts of V-601 and 8.4 parts of PGMEA was added thereto, the temperature was increased to 90° C., the mixture was heated for 3 hours, and the polymerization reaction was terminated.

After replacing the inside of the flask with air, 0.2 parts of 2,2,6,6-tetramethylpiperidinl-oxyl, 24.9 parts of 4-hydroxybutyl acrylate glycidyl ether, 7.7 parts of dimethyl dodecylamine, and 20.3 parts of PGMEA were added thereto, the mixture was heated at 90° C. for 48 hours, and the reaction was terminated. 7.81 parts of 2,2,6,6-tetramethylpiperidinl-oxyl and 27.8 parts of PGMEA were added to the obtained mixture to obtain a 30 mass % solution of a resin B-9.

The weight-average molecular weight of the obtained resin B-9 was 18,500, and the acid value thereof was 68 mgKOH/mg.

(Synthesis of Resin C-1)

70 parts by mass of cyclohexanone was charged into a reaction container and was heated to 80° C. while injecting nitrogen gas into the container, and at the same temperature, a mixture of 50 parts by mass of cyclohexyl maleimide as N-substituted maleimide, 15 parts by mass of hydroxyethyl methacrylate, 12 parts by mass of methacrylic acid, 23 parts by mass of methyl methacrylate, and 0.4 parts by mass of azobisisobutyronitrile was added dropwise thereto over 2 hours to perform a polymerization reaction. After completion of the dropwise addition, the mixture was further reacted at 80° C. for 3 hours, and then a solution in which 0.2 parts by mass of azobisisobutyronitrile was dissolved in 10 parts by mass of cyclohexanone was added thereto. Thereafter, the reaction was further continued at 80° C. for 1 hour to obtain a resin solution. After cooling to room temperature, approximately 2 g of the resin solution was sampled and heated and dried at 130° C. for 2 hours to measure non-volatile content, and cyclohexanone was added thereto so that the non-volatile content (concentration of solid contents) of the previously synthesized resin solution was 20 mass %, thereby obtaining a resin solution of a resin C-1. The acid value of the obtained resin C-1 was 78 mgKOH/g, and the weight-average molecular weight (Mw) thereof was 14,000. In the following structural formula, the numerical value added to the main chain is a mass ratio.

(C-1)

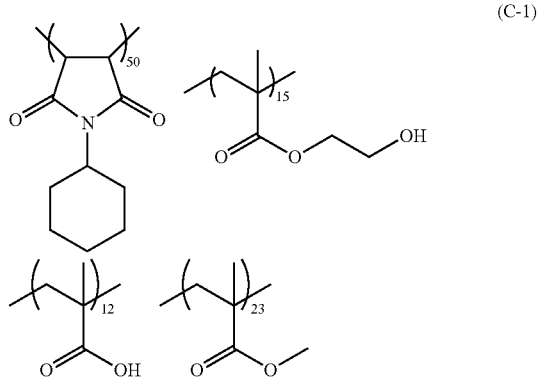

(Synthesis of Resin C-3)

70 parts by mass of cyclohexanone was charged into a reaction container and was heated to 80° C. while injecting nitrogen gas into the container, and at the same temperature, a mixture of 50 parts by mass of phenylmaleimide as N-substituted maleimide, 16.5 parts by mass of methacrylic acid, 23 parts by mass of methyl methacrylate, and 0.4 parts by mass of azobisisobutyronitrile was added dropwise thereto over 2 hours to perform a polymerization reaction. After completion of the dropwise addition, the mixture was further reacted at 80° C. for 3 hours, and then a solution in which 0.2 parts by mass of azobisisobutyronitrile was dissolved in 10 parts by mass of cyclohexanone was added thereto. Thereafter, the reaction was further continued at 80° C. for 1 hour. Next, 10.5 parts by mass of 4-hydroxybutyl acrylate glycidyl ether and 0.5 parts by mass of tetrabutylammonium bromide were added thereto, and the reaction was continued at 90° C. for 24 hours under air. After confirming the completion of the reaction by acid value measurement, the resin solution was cooled to room temperature, approximately 2 g of the resin solution was sampled and heated and dried at 130° C. for 2 hours to measure non-volatile content, and cyclohexanone was added thereto so that the non-volatile content (concentration of solid contents) of the previously synthesized resin solution was 20 mass %, thereby obtaining a resin solution of a resin C-3. The acid value of the obtained resin C-3 was 78 mgKOH/g, and the weight-average molecular weight (Mw) thereof was 16,000. In the following structural formula, the numerical value added to the main chain is a mass ratio.

(C-3)

(Synthesis of Resin C-4)

A resin solution of a resin C-4 having an acid value of 52 mgKOH/g and a weight-average molecular weight (Mw) of 13,000 was obtained in the same manner as in the synthesis of the resin C-4, except that the amount of cyclohexyl maleimide was changed to 55 parts by mass, the amount of hydroxyethyl methacrylate was changed to 10 parts by mass, the amount of methacrylic acid was changed to 8 parts by mass, and the amount of methyl methacrylate was changed to 27 parts by mass. In the following structural formula, the numerical value added to the main chain is a mass ratio.

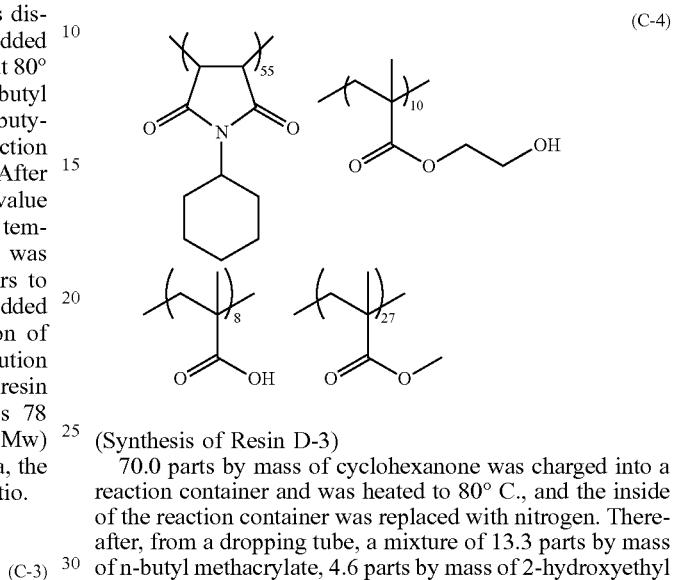

(C-4)

(Synthesis of Resin D-3)

70.0 parts by mass of cyclohexanone was charged into a reaction container and was heated to 80° C., and the inside of the reaction container was replaced with nitrogen. Thereafter, from a dropping tube, a mixture of 13.3 parts by mass of n-butyl methacrylate, 4.6 parts by mass of 2-hydroxyethyl methacrylate, 4.3 parts by mass of methacrylic acid, 7.4 parts by mass of ethylene oxide-modified acrylate of para-cumylphenol ("ARONIX M110" manufactured by TOAGO-SEI CO., LTD.), and 0.4 parts by mass of 2,2'-azobisisobutyronitrile was added dropwise thereto over 2 hours. After completion of the dropwise addition, the reaction was continued for another 3 hours to obtain a solution of an acrylic resin having a weight-average molecular weight (Mw) of 26,000. After cooling to room temperature, approximately 2 g of the resin solution was sampled and heated and dried at 180° C. for 20 minutes to measure non-volatile content, and methoxypropyl acetate was added thereto so that the non-volatile content of the previously synthesized resin solution was 0 mass %, thereby preparing a resin solution of a resin D-3.

<Preparation of Dispersion Liquid>

Raw materials described in Tables 1 to 3 below were mixed, and then 230 parts by mass of zirconia beads having a diameter of 0.3 mm were added thereto to perform a dispersion treatment for 5 hours using a paint shaker. The beads were separated by filtration, and a dispersion liquid was produced. The numerical values described in the following tables indicate parts by mass. Each value of the blending amounts of the resins (dispersants) is the value of the blending amount in the resin solution having a solid content of 20 mass %.

TABLE 1

| Pigment dispersion liquid | Colorant | | | | | | | | | | |
|---|---|---|---|---|---|---|---|---|---|---|---|
| | Pigment | | | | | | Pigment derivative | | | Resin (dispersant) | |
| | PR254 | PR264 | PR272 | PR122 | PY139 | PO71 | Derivative 1 | Derivative 2 | Derivative 3 | B-1 | B-2 |
| Dispersion liquid R1 | 9 | — | — | — | 4.5 | — | 1.5 | — | — | 25 | — |
| Dispersion liquid R2 | 9 | — | — | — | 4.5 | — | 1.5 | — | — | — | 25 |

TABLE 1-continued

| Pigment dispersion liquid | | | | | | | | | | | |
|---|---|---|---|---|---|---|---|---|---|---|---|
| Dispersion liquid R3 | 9 | — | — | — | 4.5 | — | 1.5 | — | — | — | — |
| Dispersion liquid R4 | 9 | — | — | — | 4.5 | — | 1.5 | — | — | — | — |
| Dispersion liquid R5 | 9 | — | — | — | 4.5 | — | 1.5 | — | — | — | — |
| Dispersion liquid R6 | 9 | — | — | — | 4.5 | — | 1.5 | — | — | — | — |
| Dispersion liquid R7 | 9 | — | — | — | 3 | 1.5 | 1.5 | — | — | — | 25 |
| Dispersion liquid R8 | — | — | 10 | — | 3.5 | — | — | 1.5 | — | — | 25 |
| Dispersion liquid R9 | — | — | — | 13.5 | — | — | — | — | 1.5 | — | 25 |
| Dispersion liquid R10 | 14 | — | — | — | — | — | — | 1 | — | — | 25 |
| Dispersion liquid R11 | — | 9 | — | — | 4.5 | — | 1.5 | — | — | — | 25 |
| Dispersion liquid R12 | 9 | — | — | — | 4.5 | — | 1.5 | — | — | 15 | — |
| Dispersion liquid R13 | 9 | — | — | — | 4.5 | — | 1.5 | — | — | — | — |
| Dispersion liquid R14 | 9 | — | — | — | 4.5 | — | 1.5 | — | — | — | — |

| Pigment dispersion liquid | Resin (dispersant) | | | | | | | Solvent (PGMEA) | Concentration of colorant (mass %) | Concentration of solid contents (mass %) |
|---|---|---|---|---|---|---|---|---|---|---|
| | B-3 | B-4 | B-5 | B-6 | B-7 | B-8 | B-9 | | | |
| Dispersion liquid R1 | — | — | — | — | — | — | — | 60 | 15 | 20 |
| Dispersion liquid R2 | — | — | — | — | — | — | — | 60 | 15 | 20 |
| Dispersion liquid R3 | 25 | — | — | — | — | — | — | 60 | 15 | 20 |
| Dispersion liquid R4 | — | 25 | — | — | — | — | — | 60 | 15 | 20 |
| Dispersion liquid R5 | — | — | 25 | — | — | — | — | 60 | 15 | 20 |
| Dispersion liquid R6 | — | — | — | 25 | — | — | — | 60 | 15 | 20 |
| Dispersion liquid R7 | — | — | — | — | — | — | — | 60 | 15 | 20 |
| Dispersion liquid R8 | — | — | — | — | — | — | — | 60 | 15 | 20 |
| Dispersion liquid R9 | — | — | — | — | — | — | — | 60 | 15 | 20 |
| Dispersion liquid R10 | — | — | — | — | — | — | — | 60 | 15 | 20 |
| Dispersion liquid R11 | — | — | — | — | — | — | — | 60 | 15 | 20 |
| Dispersion liquid R12 | — | — | — | — | 10 | — | — | 60 | 15 | 20 |
| Dispersion liquid R13 | — | — | — | — | — | 25 | — | 60 | 15 | 20 |
| Dispersion liquid R14 | — | — | — | — | — | — | 25 | 60 | 15 | 20 |

TABLE 2

| Pigment dispersion liquid | Colorant | | | | | | | | | | | |
|---|---|---|---|---|---|---|---|---|---|---|---|---|
| | Pigment | | | | | | | | | Pigment derivative | | |
| | PG58 | PG36 | PB153 | PG59 | PG62 | PG63 | PY139 | PY150 | PY185 | Derivative 1 | Derivative 4 | Derivative 5 |
| Dispersion liquid G1 | 9 | — | — | — | — | — | — | 4.5 | — | — | — | 1.5 |
| Dispersion liquid G2 | 9 | — | — | — | — | — | — | 4.5 | — | — | — | 1.5 |
| Dispersion liquid G3 | 9 | — | — | — | — | — | — | 4.5 | — | — | — | 1.5 |
| Dispersion liquid G4 | 9 | — | — | — | — | — | — | 4.5 | — | — | — | 1.5 |
| Dispersion liquid G5 | 9 | — | — | — | — | — | — | 4.5 | — | — | — | 1.5 |

TABLE 2-continued

| Dispersion liquid | C1 | C2 | C3 | C4 | C5 | C6 | C7 | C8 | C9 | C10 | C11 | C12 |
|---|---|---|---|---|---|---|---|---|---|---|---|---|
| Dispersion liquid G6 | 9 | — | — | — | — | — | — | 4.5 | — | — | — | 1.5 |
| Dispersion liquid G7 | 9 | — | — | — | — | — | 4.5 | — | — | 1.5 | — | — |
| Dispersion liquid G8 | 9 | — | — | — | — | — | — | — | 4.5 | — | 1.5 | — |
| Dispersion liquid G9 | — | 9 | — | — | — | — | — | 4.5 | — | — | — | 1.5 |
| Dispersion liquid G10 | — | — | 13.5 | — | — | — | — | — | — | — | 1.5 | — |
| Dispersion liquid G11 | — | — | — | 9 | — | — | — | 4.5 | — | 1.5 | — | — |
| Dispersion liquid G12 | — | — | — | — | 9 | — | — | 2.5 | 2 | 1.5 | — | — |
| Dispersion liquid G13 | — | — | — | — | — | 9 | — | 2.5 | 2 | 1.5 | — | — |
| Dispersion liquid G14 | 9 | — | — | — | — | — | — | 4.5 | — | — | — | 1.5 |
| Dispersion liquid G15 | 7 | 2 | — | — | — | — | — | 4.5 | — | 1.5 | — | — |
| Dispersion liquid G16 | 7 | 2 | 1 | — | — | — | — | 1.5 | 2 | — | — | 1.5 |
| Dispersion liquid G17 | 9 | — | — | — | — | — | — | 4.5 | — | — | — | 1.5 |

| Pigment dispersion liquid | Resin (dispersant) | | | | | | | | Solvent (PGMEA) | Concentration of colorant (mass %) | Concentration of solid contents (mass %) |
|---|---|---|---|---|---|---|---|---|---|---|---|
| | B-1 | B-2 | B-3 | B-4 | B-5 | B-6 | B-8 | B-9 | | | |
| Dispersion liquid G1 | 25 | — | — | — | — | — | — | — | 60 | 15.0 | 20.0 |
| Dispersion liquid G2 | — | 25 | — | — | — | — | — | — | 60 | 15.0 | 20.0 |
| Dispersion liquid G3 | — | — | 25 | — | — | — | — | — | 60 | 15.0 | 20.0 |
| Dispersion liquid G4 | — | — | — | 25 | — | — | — | — | 60 | 15.0 | 20.0 |
| Dispersion liquid G5 | — | — | — | — | 25 | — | — | — | 60 | 15.0 | 20.0 |
| Dispersion liquid G6 | — | — | — | — | — | 25 | — | — | 60 | 15.0 | 20.0 |
| Dispersion liquid G7 | 25 | — | — | — | — | — | — | — | 60 | 15.0 | 20.0 |
| Dispersion liquid G8 | 25 | — | — | — | — | — | — | — | 60 | 15.0 | 20.0 |
| Dispersion liquid G9 | 25 | — | — | — | — | — | — | — | 60 | 15.0 | 20.0 |
| Dispersion liquid G10 | 25 | — | — | — | — | — | — | — | 60 | 15.0 | 20.0 |
| Dispersion liquid G11 | — | 25 | — | — | — | — | — | — | 60 | 15.0 | 20.0 |
| Dispersion liquid G12 | — | 25 | — | — | — | — | — | — | 60 | 15.0 | 20.0 |
| Dispersion liquid G13 | — | 25 | — | — | — | — | — | — | 60 | 15.0 | 20.0 |
| Dispersion liquid G14 | — | — | — | — | — | — | — | 25 | 60 | 15.0 | 20.0 |
| Dispersion liquid G15 | 25 | — | — | — | — | — | — | — | 60 | 15.0 | 20.0 |
| Dispersion liquid G16 | 25 | — | — | — | — | — | — | — | 60 | 15.0 | 20.0 |
| Dispersion liquid G17 | — | — | — | — | — | — | 25 | — | 60 | 15.0 | 20.0 |

TABLE 3

| Pigment dispersion liquid | Colorant Pigment PB15:6 | PV23 | Pigment derivative Derivative 4 | Resin (dispersant) B-1 | B-2 | B-6 | B-9 | Solvent (PGMEA) | Concentration of colorant (mass %) | Concentration of solid contents (mass %) |
|---|---|---|---|---|---|---|---|---|---|---|
| Dispersion liquid B1 | 9 | 4.5 | 1.5 | 25 | — | — | — | 60 | 15.0 | 20.0 |
| Dispersion liquid B2 | 9 | 4.5 | 1.5 | — | 25 | — | — | 60 | 15.0 | 20.0 |
| Dispersion liquid B3 | 9 | 4.5 | 1.5 | — | — | 25 | — | 60 | 15.0 | 20.0 |
| Dispersion liquid B4 | 9 | 4.5 | 1.5 | — | — | — | 25 | 60 | 15.0 | 20.0 |

The abbreviations described in Tables 1 to 3 are as follows.
(Pigment)
PR254: C. I. Pigment Red 254
PR264: C. I. Pigment Red 264
PR272: C. I. Pigment Red 272
PR122: C. I. Pigment Red 122
PO71: C. I. Pigment Orange 71
PG58: C. I. Pigment Green 58
PG36: C. I. Pigment Green 36
PG59: C. I. Pigment Green 59
PG62: C. I. Pigment Green 62
PG63: C. I. Pigment Green 63
PY139: C. I. Pigment Yellow 139
PY150: C. I. Pigment Yellow 150
PY185: C. I. Pigment Yellow 185
PB15:3: C. I. Pigment Blue 15:3
PB15:6: C. I. Pigment Blue 15:6
PV23: C. I. Pigment Violet 23
(Pigment Derivative)
Derivatives 1 to 5: compounds having the following structures

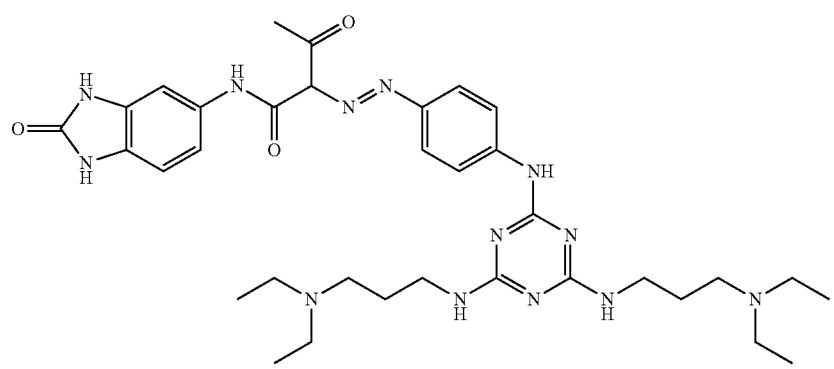

Derivative 1

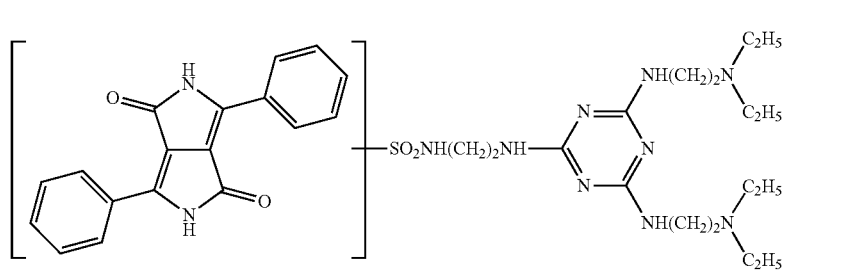

Derivative 2

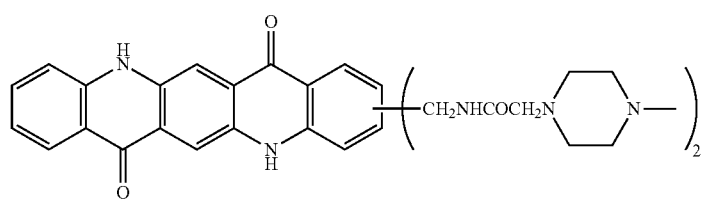

Derivative 3

-continued

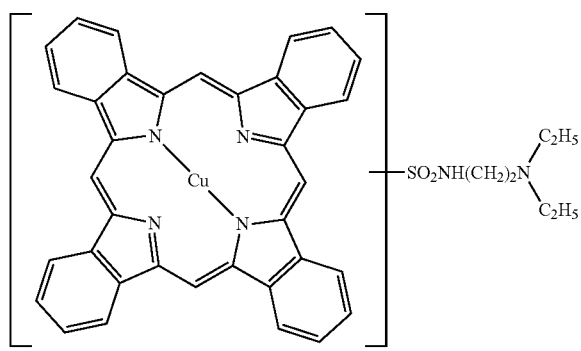

Derivative 4

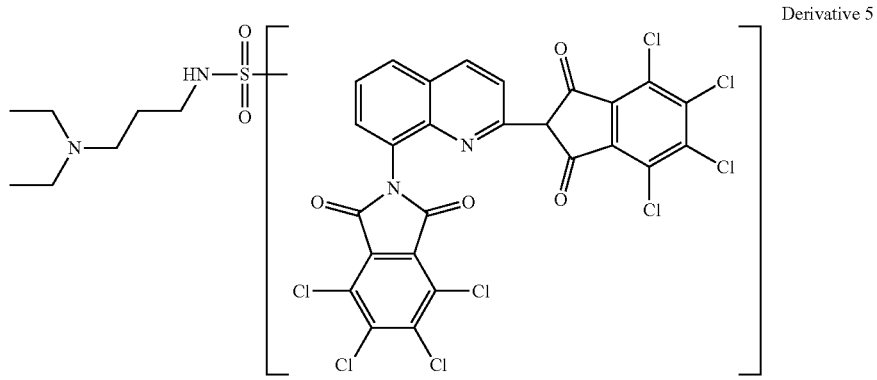

Derivative 5

(Resin (Dispersant))

B-1 to B-9: resin solutions of the above-described resins B-1 to B-9

Examples 1 to 71 and Comparative Examples 1 to 12

<Preparation of Coloring Composition>

Raw materials described in Tables 4 to 6 below were mixed to prepare a curable composition. The value of colorant concentration in Tables 4 to 6 below is the value of the content of the colorant (total content of the pigment and the pigment derivative) in the total solid content of the curable composition. In addition, each value of the blending amounts of the resins C-1 to C-4 and D-3 is the value of the blending amount in the resin solution having a solid content of 20 mass %.

TABLE 4

|  | Pigment dispersion liquid | | Resin | | Resin | | Polymerizable compound | | Photopolymerization initiator | | Additive | |
| --- | --- | --- | --- | --- | --- | --- | --- | --- | --- | --- | --- | --- |
|  | Type | Part by mass | Type | Part by mass | Type | Part by mass | Type | Part by mass | Type | Part by mass | Type | Part by mass |
| Example 1 | Dispersion liquid R2 | 60 | C-1 | 10.0 | — | — | E-1 | 3.1 | G-1 | 0.8 | — | — |
| Example 2 | Dispersion liquid R2 | 45 | C-1 | 10.0 | — | — | E-1 | 3.1 | G-1 | 0.7 | — | — |
| Example 3 | Dispersion liquid R2 | 70 | C-1 | 5.6 | — | — | E-1 | 1.7 | G-1 | 0.6 | — | — |
| Example 4 | Dispersion liquid R2 | 75 | C-1 | 2.0 | — | — | E-1 | 1.5 | G-1 | 0.4 | — | — |
| Example 5 | Dispersion liquid R6 | 80 | C-3 | 2.0 | — | — | E-1 | 0.4 | G-1 | 0.4 | — | — |
| Example 6 | Dispersion liquid R2 | 65 | C-1 | 4.0 | D-2 | 0.6 | E-1 | 2.6 | G-1 | 0.7 | — | — |
| Example 7 | Dispersion liquid R2 | 65 | C-1 | 7.0 | — | — | E-2 | 2.6 | G-1 | 0.7 | — | — |
| Example 8 | Dispersion liquid R2 | 65 | C-1 | 7.0 | — | — | E-3 | 2.6 | G-1 | 0.7 | — | — |
| Example 9 | Dispersion liquid R2 | 65 | C-1 | 5.0 | — | — | E-1 | 2.6 | G-1 | 0.7 | H-1 | 0.4 |
| Example 10 | Dispersion liquid R2 | 65 | C-1 | 3.0 | D-2 | 0.4 | E-3 | 2.6 | G-1 | 0.7 | H-1 | 0.4 |

TABLE 4-continued

| | | | | | | | | | | | |
|---|---|---|---|---|---|---|---|---|---|---|---|
| Example 11 | Dispersion liquid R2 | 65 | C-1 | 4.0 | D-3 | 3.0 | E-1 | 2.6 | G-1 | 0.7 | — | — |
| Example 12 | Dispersion liquid R2 | 65 | C-2 | 7.0 | — | — | E-1 | 2.6 | G-1 | 0.7 | — | — |
| Example 13 | Dispersion liquid R2 | 65 | C-3 | 7.0 | — | — | E-1 | 2.6 | G-1 | 0.7 | — | — |
| Example 14 | Dispersion liquid R1 | 65 | C-1 | 7.0 | — | — | E-1 | 2.6 | G-1 | 0.7 | — | — |
| Example 15 | Dispersion liquid R3 | 65 | C-1 | 7.0 | — | — | E-1 | 2.6 | G-1 | 0.7 | — | — |
| Example 16 | Dispersion liquid R4 | 65 | C-1 | 7.0 | — | — | E-1 | 2.6 | G-1 | 0.7 | — | — |
| Example 17 | Dispersion liquid R5 | 65 | C-1 | 7.0 | — | — | E-1 | 2.6 | G-1 | 0.7 | H-2 | 0.4 |
| Example 18 | Dispersion liquid R6 | 65 | C-1 | 7.0 | — | — | E-1 | 2.6 | G-1 | 0.7 | H-2 | 0.4 |
| Example 19 | Dispersion liquid R7 | 65 | C-1 | 7.0 | — | — | E-1 | 2.6 | G-1 | 0.7 | — | — |
| Example 20 | Dispersion liquid R8 | 65 | C-1 | 7.0 | — | — | E-1 | 2.6 | G-1 | 0.7 | — | — |
| Example 21 | Dispersion liquid R9 | 65 | C-1 | 7.0 | — | — | E-1 | 2.6 | G-1 | 0.7 | — | — |
| Example 22 | Dispersion liquid R10 | 65 | C-1 | 7.0 | — | — | E-1 | 2.6 | G-1 | 0.7 | — | — |
| Example 23 | Dispersion liquid R11 | 65 | C-1 | 7.0 | — | — | E-1 | 2.6 | G-1 | 0.7 | — | — |
| Example 24 | Dispersion liquid R12 | 65 | C-1 | 7.0 | — | — | E-1 | 2.6 | G-1 G-2 | 0.35 0.35 | — | — |
| Example 25 | Dispersion liquid R2 | 65 | C-1 | 7.0 | — | — | E-1 | 2.6 | G-1 | 0.7 | — | — |
| Example 26 | Dispersion liquid R1 Dispersion liquid R2 | 32.5 32.5 | C-1 | 7.0 | — | — | E-1 | 2.6 | G-1 | 0.7 | — | — |
| Example 27 | Dispersion liquid R2 | 65 | C-1 | 4.0 | C-2 | 3.0 | E-1 | 2.6 | G-1 | 0.7 | — | — |
| Example 28 | Dispersion liquid R13 | 65 | C-1 | 4.0 | C-4 | 3.0 | E-1 | 2.6 | G-1 | 0.7 | — | — |
| Example 29 | Dispersion liquid R2 | 65 | C-1 | 7.0 | — | — | E-1 E-3 | 1.3 1.3 | G-1 | 0.7 | — | — |
| Example 30 | Dispersion liquid R2 | 65 | C-1 | 7.0 | — | — | E-1 | 2.6 | G-2 | 0.7 | — | — |
| Example 31 | Dispersion liquid R2 | 65 | C-1 | 7.0 | — | — | E-1 | 2.6 | G-3 | 0.7 | — | — |
| Example 32 | Dispersion liquid R14 | 60 | C-1 | 10.0 | — | — | E-1 | 3.1 | G-1 | 0.8 | — | — |
| Comparative example 1 | Dispersion liquid R2 | 60 | — | — | D-1 | 2.0 | E-1 | 3.1 | G-1 | 0.8 | — | — |
| Comparative example 2 | Dispersion liquid R2 | 65 | — | — | D-1 | 1.4 | E-1 | 2.6 | G-1 | 0.7 | — | — |
| Comparative example 3 | Dispersion liquid R2 | 60 | — | — | D-1 | 2.0 | E-1 | 3.1 | G-1 | 0.8 | — | — |
| Comparative example 4 | Dispersion liquid R2 | 60 | — | — | D-1 | 2.0 | E-1 | 3.1 | G-1 | 0.8 | — | — |
| Comparative example 5 | Dispersion liquid R2 | 60 | — | — | D-1 | 2.0 | E-1 | 3.1 | G-1 | 0.8 | — | — |
| Comparative example 6 | Dispersion liquid R2 | 60 | — | — | D-1 | 2.0 | E-1 | 3.1 | G-1 | 0.8 | — | — |

| | Surfactant | | Polymerization inhibitor | | Solvent | | Concentration of colorant (mass %) | Thiol compound | | Thiol value ($\times 10^{-4}$ mmol/g) | Content of thiol compound (ppm) |
|---|---|---|---|---|---|---|---|---|---|---|---|
| | Type | Part by mass | Type | Part by mass | Type | Part by mass | | Type | Part by mass | | |
| Example 1 | I-1 | 5.0 | J-1 | 0.01 | K-1 | 21.1 | 50 | T1-1 | 0.0035 | 5.97 | 51 |
| Example 2 | I-1 | 5.0 | J-1 | 0.01 | K-1 | 36.2 | 45 | T1-2 | 0.0035 | 3.46 | 58 |
| Example 3 | I-1 | 5.0 | J-1 | 0.01 | K-1 | 17.1 | 60 | T2-1 | 0.0035 | 5.41 | 45 |
| Example 4 | I-1 | 5.0 | J-1 | 0.01 | K-1 | 16.1 | 65 | T2-2 | 0.0035 | 4.30 | 42 |
| Example 5 | I-1 | 5.0 | J-1 | 0.01 | K-1 | 12.2 | 70 | T2-3 | 0.0035 | 5.71 | 40 |
| Example 6 | I-1 | 5.0 | J-1 | 0.01 | K-1 | 22.1 | 55 | T2-4 | 0.0035 | 2.69 | 48 |
| Example 7 | I-1 | 5.0 | J-1 | 0.01 | K-1 | 19.7 | 55 | T2-5 | 0.0035 | 2.62 | 48 |
| Example 8 | I-1 | 5.0 | J-1 | 0.01 | K-1 | 19.7 | 55 | T3-1 | 0.0035 | 3.99 | 48 |
| Example 9 | I-1 | 5.0 | J-1 | 0.01 | K-1 | 21.3 | 55 | T3-2 | 0.0035 | 3.65 | 48 |
| Example 10 | I-1 | 5.0 | J-1 | 0.01 | K-1 | 22.9 | 55 | T3-3 | 0.0035 | 2.65 | 48 |
| Example 11 | I-1 | 5.0 | J-1 | 0.01 | K-1 | 19.7 | 48 | T4-1 | 0.0035 | 4.50 | 51 |
| Example 12 | I-1 | 5.0 | J-1 | 0.01 | K-1 | 19.7 | 55 | T5-1 | 0.0035 | 4.99 | 48 |
| Example 13 | I-1 | 5.0 | J-1 | 0.01 | K-1 | 19.7 | 55 | T2-4 | 0.0072 | 5.89 | 99 |
| Example 14 | I-1 | 5.0 | J-1 | 0.01 | K-1 | 19.7 | 55 | T2-4 | 0.0001 | 0.08 | 1 |
| Example 15 | I-1 | 5.0 | J-2 | 0.01 | K-1 | 19.7 | 55 | T2-4 | 0.0035 | 2.86 | 48 |

TABLE 4-continued

| Example | | | | | | | | | | | | |
|---|---|---|---|---|---|---|---|---|---|---|---|---|
| Example 16 | I-1 | 5.0 | J-1 | 0.01 | K-1 | 19.7 | 55 | T2-4 | 0.0035 | 2.86 | 48 | |
| Example 17 | I-1 | 5.0 | J-1 | 0.01 | K-1 | 19.3 | 54 | T2-4 | 0.0035 | 2.86 | 49 | |
| Example 18 | I-1 | 5.0 | J-1 | 0.01 | K-1 | 19.3 | 54 | T2-4 | 0.0035 | 2.86 | 49 | |
| Example 19 | I-1 | 5.0 | J-1 | 0.01 | K-1 | 19.7 | 55 | T2-4 | 0.0035 | 2.86 | 48 | |
| Example 20 | I-1 | 5.0 | J-1 | 0.01 | K-1 | 19.7 | 55 | T2-4 | 0.0035 | 2.86 | 48 | |
| Example 21 | I-1 | 5.0 | J-1 | 0.01 | K-1 | 19.7 | 55 | T2-4 | 0.0035 | 2.86 | 48 | |
| Example 22 | I-1 | 5.0 | J-1 | 0.01 | K-1 | 19.7 | 55 | T2-4 | 0.0035 | 2.86 | 48 | |
| Example 23 | I-1 | 5.0 | J-1 | 0.01 | K-1 | 19.7 | 55 | T2-4 | 0.0035 | 2.86 | 48 | |
| Example 24 | I-1 | 5.0 | J-1 | 0.01 | K-1 | 19.7 | 55 | T2-4 | 0.0035 | 2.86 | 48 | |
| Example 25 | I-1 | 5.0 | J-1 | 0.01 | K-1 | 9.85 | 55 | T1-1 | 0.0005 | 3.34 | 48 | |
| | | | | | K-2 | 9.85 | | T2-4 | 0.003 | | | |
| Example 26 | I-1 | 5.0 | J-1 | 0.01 | K-1 | 19.7 | 55 | T2-4 | 0.0035 | 2.86 | 48 | |
| Example 27 | I-1 | 5.0 | J-1 | 0.01 | K-1 | 19.7 | 48 | T2-4 | 0.0035 | 2.69 | 51 | |
| Example 28 | I-1 | 5.0 | J-1 | 0.01 | K-1 | 19.7 | 48 | T2-4 | 0.0035 | 2.69 | 51 | |
| Example 29 | I-1 | 5.0 | J-1 | 0.01 | K-1 | 19.7 | 55 | T2-4 | 0.0035 | 2.86 | 48 | |
| Example 30 | I-1 | 5.0 | J-1 | 0.01 | K-1 | 19.7 | 55 | T2-4 | 0.0035 | 2.86 | 48 | |
| Example 31 | I-1 | 5.0 | J-1 | 0.01 | K-1 | 19.7 | 55 | T2-4 | 0.0035 | 2.86 | 48 | |
| Example 32 | I-1 | 5.0 | J-1 | 0.01 | K-1 | 21.1 | 50 | T1-1 | 0.0035 | 5.97 | 51 | |
| Comparative example 1 | I-1 | 5.0 | J-1 | 0.01 | K-1 | 29.1 | 50 | — | — | — | — | |
| Comparative example 2 | I-1 | 5.0 | J-1 | 0.01 | K-1 | 25.3 | 55 | T2-4 | 0.01 | 7.12 | 137 | |
| Comparative example 3 | I-1 | 5.0 | J-1 | 0.01 | K-1 | 29.1 | 50 | TR-1 | 0.007 | 14.02 | 103 | |
| Comparative example 4 | I-1 | 5.0 | J-1 | 0.01 | K-1 | 29.1 | 50 | TR-2 | 0.0075 | 10.34 | 110 | |
| Comparative example 5 | I-1 | 5.0 | J-1 | 0.01 | K-1 | 29.1 | 50 | TR-3 | 0.009 | 14.65 | 132 | |
| Comparative example 6 | I-1 | 5.0 | J-1 | 0.01 | K-1 | 29.1 | 50 | TR-4 | 0.01 | 15.60 | 147 | |

TABLE 5

| | Pigment dispersion liquid | | Resin | | Resin | | Polymerizable compound | | Photopolymerization initiator | | Additive | |
|---|---|---|---|---|---|---|---|---|---|---|---|---|
| | Type | Part by mass | Type | Part by mass | Type | Part by mass | Type | Part by mass | Type | Part by mass | Type | Part by mass |
| Example 33 | Dispersion liquid G2 | 60 | C-1 | 10.0 | — | — | E-1 | 3.1 | G-1 | 0.8 | — | — |
| Example 34 | Dispersion liquid G2 | 65 | C-1 | 7.0 | — | — | E-1 | 2.6 | G-1 | 0.7 | — | — |
| Example 35 | Dispersion liquid G2 | 70 | C-1 | 5.6 | — | — | E-1 | 1.7 | G-1 | 0.6 | — | — |
| Example 36 | Dispersion liquid G2 | 75 | C-1 | 2.0 | — | — | E-1 | 1.5 | G-1 | 0.4 | — | — |
| Example 37 | Dispersion liquid G6 | 80 | C-3 | 2.0 | — | — | E-1 | 0.4 | G-1 | 0.4 | — | — |
| Example 38 | Dispersion liquid G2 | 65 | C-1 | 4.0 | D-2 | 0.6 | E-1 | 2.6 | G-1 | 0.7 | — | — |
| Example 39 | Dispersion liquid G2 | 65 | C-1 | 7.0 | — | — | E-2 | 2.6 | G-1 | 0.7 | — | — |
| Example 40 | Dispersion liquid G2 | 65 | C-1 | 7.0 | — | — | E-3 | 2.6 | G-1 | 0.7 | — | — |
| Example 41 | Dispersion liquid G2 | 65 | C-1 | 5.0 | — | — | E-1 | 2.6 | G-1 | 0.7 | H-1 | 0.4 |
| Example 42 | Dispersion liquid G2 | 65 | C-1 | 3.0 | D-2 | 0.4 | E-3 | 2.6 | G-1 | 0.7 | H-1 | 0.4 |
| Example 43 | Dispersion liquid G2 | 65 | C-1 | 4.0 | D-3 | 3.0 | E-1 | 2.6 | G-1 | 0.7 | — | — |
| Example 44 | Dispersion liquid G2 | 65 | C-2 | 7.0 | — | — | E-1 | 2.6 | G-1 | 0.7 | — | — |
| Example 45 | Dispersion liquid G2 | 65 | C-3 | 7.0 | — | — | E-1 | 2.6 | G-1 | 0.7 | — | — |
| Example 46 | Dispersion liquid G1 | 65 | C-1 | 7.0 | — | — | E-1 | 2.6 | G-1 | 0.7 | — | — |
| Example 47 | Dispersion liquid G3 | 65 | C-1 | 7.0 | — | — | E-1 | 2.6 | G-1 | 0.7 | — | — |
| Example 48 | Dispersion liquid G4 | 65 | C-1 | 7.0 | — | — | E-1 | 2.6 | G-1 | 0.7 | — | — |
| Example 49 | Dispersion liquid G5 | 65 | C-1 | 7.0 | — | — | E-1 | 2.6 | G-1 | 0.7 | H-2 | 0.4 |
| Example 50 | Dispersion liquid G6 | 65 | C-1 | 7.0 | — | — | E-1 | 2.6 | G-1 | 0.7 | H-2 | 0.4 |

TABLE 5-continued

| | | | | | | | | | | | | |
|---|---|---|---|---|---|---|---|---|---|---|---|---|
| Example 51 | Dispersion liquid G7 | 65 | C-1 | 7.0 | — | — | E-1 | 2.6 | G-1 | 0.7 | — | — |
| Example 52 | Dispersion liquid G8 | 65 | C-1 | 7.0 | — | — | E-1 | 2.6 | G-1 | 0.7 | — | — |
| Example 53 | Dispersion liquid G9 | 65 | C-1 | 7.0 | — | — | E-1 | 2.6 | G-1 | 0.7 | — | — |
| Example 54 | Dispersion liquid G10 | 65 | C-1 | 7.0 | — | — | E-1 | 2.6 | G-1 | 0.7 | — | — |
| Example 55 | Dispersion liquid G11 | 65 | C-1 | 7.0 | — | — | E-1 | 2.6 | G-1 | 0.7 | — | — |
| Example 56 | Dispersion liquid G12 | 65 | C-1 | 7.0 | — | — | E-1 | 2.6 | G-1 G-2 | 0.35 0.35 | — | — |
| Example 57 | Dispersion liquid G2 | 65 | C-1 | 7.0 | — | — | E-1 | 2.6 | G-1 | 0.7 | — | — |
| Example 58 | Dispersion liquid G1 Dispersion liquid G2 | 32.5 32.5 | C-1 | 7.0 | — | — | E-1 | 2.6 | G-1 | 0.7 | — | — |
| Example 59 | Dispersion liquid G2 | 65 | C-1 | 4.0 | C-2 | 3.0 | E-1 | 2.6 | G-1 | 0.7 | — | — |
| Example 60 | Dispersion liquid G13 | 65 | C-1 | 4.0 | C-4 | 3.0 | E-1 | 2.6 | G-1 | 0.7 | — | — |
| Example 61 | Dispersion liquid G2 | 65 | C-1 | 7.0 | — | — | E-1 E-3 | 1.3 1.3 | G-1 | 0.7 | — | — |
| Example 62 | Dispersion liquid G2 | 65 | C-1 | 7.0 | — | — | E-1 | 2.6 | G-2 | 0.7 | — | — |
| Example 63 | Dispersion liquid G2 | 65 | C-1 | 7.0 | — | — | E-1 | 2.6 | G-3 | 0.7 | — | — |
| Example 64 | Dispersion liquid G14 | 60 | C-1 | 10.0 | — | — | E-1 | 3.1 | G-1 | 0.8 | — | — |
| Example 65 | Dispersion liquid G15 | 60 | C-1 | 10.0 | — | — | E-1 | 3.1 | G-1 | 0.8 | — | — |
| Example 66 | Dispersion liquid G16 | 60 | C-1 | 10.0 | — | — | E-1 | 3.1 | G-1 | 0.8 | — | — |
| Example 67 | Dispersion liquid G17 | 60 | C-1 | 10.0 | — | — | E-1 | 3.1 | G-1 | 0.8 | — | — |
| Comparative example 7 | Dispersion liquid G2 | 60 | — | — | D-1 | 2.0 | E-1 | 3.1 | G-1 | 0.8 | — | — |
| Comparative example 8 | Dispersion liquid G2 | 65 | — | — | D-1 | 1.4 | E-1 | 2.6 | G-1 | 0.7 | — | — |
| Comparative example 9 | Dispersion liquid G2 | 60 | — | — | D-1 | 2.0 | E-1 | 3.1 | G-1 | 0.8 | — | — |
| Comparative example 10 | Dispersion liquid G2 | 60 | — | — | D-1 | 2.0 | E-1 | 3.1 | G-1 | 0.8 | — | — |
| Comparative example 11 | Dispersion liquid G2 | 60 | — | — | D-1 | 2.0 | E-1 | 3.1 | G-1 | 0.8 | — | — |
| Comparative example 12 | Dispersion liquid G2 | 60 | — | — | D-1 | 2.0 | E-1 | 3.1 | G-1 | 0.8 | — | — |

| | Surfactant | | Polymerization inhibitor | | Solvent | | Concentration of colorant (mass %) | Thiol compound | | Thiol value ($\times 10^{-4}$ mmol/g) | Content of thiol compound (ppm) |
|---|---|---|---|---|---|---|---|---|---|---|---|
| | Type | Part by mass | Type | Part by mass | Type | Part by mass | | Type | Part by mass | | |
| Example 33 | I-1 | 5.0 | J-1 | 0.01 | K-1 | 21.1 | 50 | T1-1 | 0.0035 | 5.97 | 52 |
| Example 34 | I-1 | 5.0 | J-1 | 0.01 | K-1 | 19.7 | 55 | T1-2 | 0.0035 | 4.72 | 48 |
| Example 35 | I-1 | 5.0 | J-1 | 0.01 | K-1 | 17.1 | 60 | T2-1 | 0.0035 | 5.41 | 45 |
| Example 36 | I-1 | 5.0 | J-1 | 0.01 | K-1 | 16.1 | 65 | T2-2 | 0.0035 | 4.30 | 42 |
| Example 37 | I-1 | 5.0 | J-1 | 0.01 | K-1 | 12.2 | 70 | T2-3 | 0.0035 | 5.71 | 40 |
| Example 38 | I-1 | 5.0 | J-1 | 0.01 | K-1 | 22.1 | 55 | T2-4 | 0.0035 | 2.69 | 48 |
| Example 39 | I-1 | 5.0 | J-1 | 0.01 | K-1 | 19.7 | 55 | T2-5 | 0.0035 | 2.62 | 48 |
| Example 40 | I-1 | 5.0 | J-1 | 0.01 | K-1 | 19.7 | 55 | T3-1 | 0.0035 | 3.99 | 48 |
| Example 41 | I-1 | 5.0 | J-1 | 0.01 | K-1 | 21.3 | 55 | T3-2 | 0.0035 | 3.65 | 48 |
| Example 42 | I-1 | 5.0 | J-1 | 0.01 | K-1 | 22.9 | 55 | T3-3 | 0.0035 | 2.65 | 47 |
| Example 43 | I-1 | 5.0 | J-1 | 0.01 | K-1 | 19.7 | 55 | T4-1 | 0.0035 | 4.50 | 53 |
| Example 44 | I-1 | 5.0 | J-1 | 0.01 | K-1 | 19.7 | 48 | T5-1 | 0.0035 | 4.99 | 99 |
| Example 45 | I-1 | 5.0 | J-1 | 0.01 | K-1 | 19.7 | 55 | T2-4 | 0.0072 | 5.89 | 1 |
| Example 46 | I-1 | 5.0 | J-1 | 0.01 | K-1 | 19.7 | 55 | T2-4 | 0.0001 | 0.08 | 48 |
| Example 47 | I-1 | 5.0 | J-2 | 0.01 | K-1 | 19.7 | 55 | T2-4 | 0.0035 | 2.86 | 48 |
| Example 48 | I-1 | 5.0 | J-1 | 0.01 | K-1 | 19.7 | 55 | T2-4 | 0.0035 | 2.86 | 49 |
| Example 49 | I-1 | 5.0 | J-1 | 0.01 | K-1 | 19.3 | 54 | T2-4 | 0.0035 | 2.86 | 49 |
| Example 50 | I-1 | 5.0 | J-1 | 0.01 | K-1 | 19.3 | 54 | T2-4 | 0.0035 | 2.86 | 48 |
| Example 51 | I-1 | 5.0 | J-1 | 0.01 | K-1 | 19.7 | 55 | T2-4 | 0.0035 | 2.86 | 48 |
| Example 52 | I-1 | 5.0 | J-1 | 0.01 | K-1 | 19.7 | 55 | T2-4 | 0.0035 | 2.86 | 48 |
| Example 53 | I-1 | 5.0 | J-1 | 0.01 | K-1 | 19.7 | 55 | T2-4 | 0.0035 | 2.86 | 48 |
| Example 54 | I-1 | 5.0 | J-1 | 0.01 | K-1 | 19.7 | 55 | T2-4 | 0.0035 | 2.86 | 48 |
| Example 55 | I-1 | 5.0 | J-1 | 0.01 | K-1 | 19.7 | 55 | T2-4 | 0.0035 | 2.86 | 48 |
| Example 56 | I-1 | 5.0 | J-1 | 0.01 | K-1 | 19.7 | 55 | T2-4 | 0.0035 | 2.86 | 48 |
| Example 57 | I-1 | 5.0 | J-1 | 0.01 | K-1 | 9.85 | 55 | T1-1 | 0.0005 | 3.34 | 48 |

TABLE 5-continued

|  | | | | | | K-2 | 9.85 | | T2-4 | 0.003 | | |
|---|---|---|---|---|---|---|---|---|---|---|---|---|
| Example 58 | I-1 | 5.0 | J-1 | 0.01 | K-1 | 19.7 | 55 | T2-4 | 0.0035 | 2.86 | 48 |
| Example 59 | I-1 | 5.0 | J-1 | 0.01 | K-1 | 19.7 | 55 | T2-4 | 0.0035 | 2.69 | 47 |
| Example 60 | I-1 | 5.0 | J-1 | 0.01 | K-1 | 19.7 | 55 | T2-4 | 0.0035 | 5.45 | 64 |
| Example 61 | I-1 | 5.0 | J-1 | 0.01 | K-1 | 19.7 | 55 | T2-4 | 0.0035 | 2.86 | 48 |
| Example 62 | I-1 | 5.0 | J-1 | 0.01 | K-1 | 19.7 | 55 | T2-4 | 0.0035 | 2.86 | 48 |
| Example 63 | I-1 | 5.0 | J-1 | 0.01 | K-1 | 19.7 | 55 | T2-4 | 0.0035 | 2.86 | 48 |
| Example 64 | I-1 | 5.0 | J-1 | 0.01 | K-1 | 21.1 | 50 | T1-1 | 0.0035 | 5.97 | 52 |
| Example 65 | I-1 | 5.0 | J-1 | 0.01 | K-1 | 21.1 | 50 | TR-1 | 0.002 | 4.00 | 29 |
| Example 66 | I-1 | 5.0 | J-1 | 0.01 | K-1 | 21.1 | 50 | TR-3 | 0.002 | 3.26 | 29 |
| Example 67 | I-1 | 5.0 | J-1 | 0.01 | K-1 | 21.1 | 50 | T1-1 | 0.0035 | 5.97 | 52 |
| Comparative example 7 | I-1 | 5.0 | J-1 | 0.01 | K-1 | 29.1 | 50 | — | — | — | — |
| Comparative example 8 | I-1 | 5.0 | J-1 | 0.01 | K-1 | 25.3 | 55 | T2-4 | 0.01 | 7.12 | 137 |
| Comparative example 9 | I-1 | 5.0 | J-1 | 0.01 | K-1 | 29.1 | 50 | TR-1 | 0.007 | 14.02 | 103 |
| Comparative example 10 | I-1 | 5.0 | J-1 | 0.01 | K-1 | 29.1 | 50 | TR-2 | 0.009 | 12.41 | 132 |
| Comparative example 11 | I-1 | 5.0 | J-1 | 0.01 | K-1 | 29.1 | 50 | TR-3 | 0.008 | 13.03 | 118 |
| Comparative example 12 | I-1 | 5.0 | J-1 | 0.01 | K-1 | 29.1 | 50 | TR-4 | 0.0069 | 10.77 | 102 |

TABLE 6

| | Pigment dispersion liquid | | Resin | | Polymerizable compound | | Photopolymerization initiator | | Surfactant | | Polymerization inhibitor | |
|---|---|---|---|---|---|---|---|---|---|---|---|---|
| | Type | Part by mass | Type | Part by mass | Type | Part by mass | Type | Part by mass | Type | Part by mass | Type | Part by mass |
| Example 68 | Dispersion liquid B1 | 65 | C-1 | 7.0 | E-1 | 2.6 | G-1 | 0.7 | I-1 | 5.0 | J-1 | 0.01 |
| Example 69 | Dispersion liquid B2 | 65 | C-1 | 7.0 | E-1 | 2.6 | G-1 | 0.7 | I-1 | 5.0 | J-1 | 0.01 |
| Example 70 | Dispersion liquid B3 | 65 | C-1 | 7.0 | E-1 | 2.6 | G-1 | 0.7 | I-1 | 5.0 | J-1 | 0.01 |
| Example 71 | Dispersion liquid B4 | 65 | C-1 | 7.0 | E-1 | 2.6 | G-1 | 0.7 | I-1 | 5.0 | J-1 | 0.01 |

| | Solvent | | Concentration of colorant (mass %) | Thiol compound | | Thiol value ($\times 10^{-4}$ mmol/g) | Content of thiol compound (ppm) |
|---|---|---|---|---|---|---|---|
| | Type | Part by mass | | Type | Part by mass | | |
| Example 68 | K-1 | 19.7 | 55 | T2-4 | 0.0035 | 2.86 | 48 |
| Example 69 | K-1 | 19.7 | 55 | T2-4 | 0.0035 | 2.86 | 48 |
| Example 70 | K-1 | 19.7 | 55 | T2-4 | 0.0035 | 2.86 | 48 |
| Example 71 | K-1 | 19.7 | 55 | T2-4 | 0.0035 | 2.86 | 48 |

The abbreviations described in Tables 4 to 6 are as follows.

(Dispersion Liquid)

Dispersion Liquids R1 to R14: dispersion liquids R1 to R14 described above

Dispersion Liquids G1 to G17: dispersion liquids G1 to G17 described above

Dispersion Liquids B1 to B4: dispersion liquids B1 to B4 described above (Resin or Resin Solution)

C-1, C-3, C-4: resin solutions of the above-described resins C-1, C-3, and C-4

C-2: resin solution prepared by adding cyclohexanone to ARONIX UVT-302 (manufactured by TOAGOSEI CO., LTD, resin having a maleimide structure) to adjust the concentration of solid contents to be 20 mass %

D-1: resin having the following structure (the numerical value described together with the main chain indicates a molar ratio, Mw=30,000)

D-2: resin having the following structure (D-2 is a resin including a repeating unit having an ethylenically unsaturated group; the numerical value described together with the main chain indicates a molar ratio of the repeating unit, Mw=11,000)

D-3: resin solution of the above-described resin D-3

(D-1)

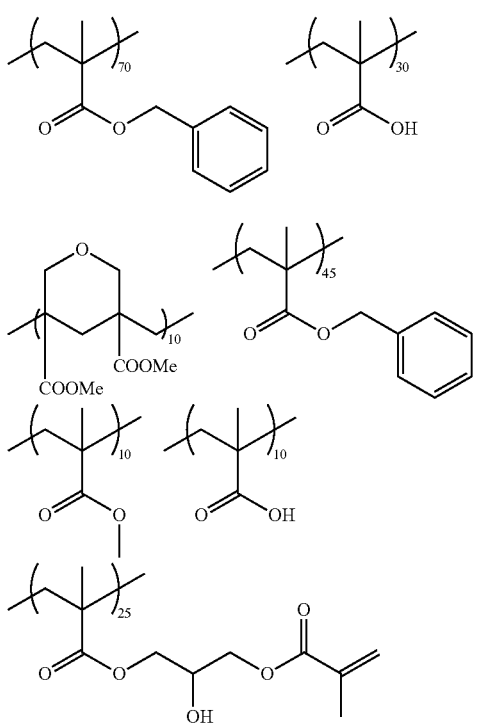

(D-2)

(Polymerizable Compound)
E-1: dipentaerythritol hexaacrylate (manufactured by Nippon Kayaku Co., Ltd., KAYARAD DPHA, molecular weight: 578)
E-2: trimethylolpropane triacrylate (manufactured by TOAGOSEI CO., LTD, ARONIX M-309, molecular weight: 296)
E-3: tris(2-acryloyloxyethyl) isocyanurate (manufactured by TOAGOSEI CO., LTD, ARONIX M-315, molecular weight: 423)
(Photopolymerization Initiator)
G-1: IRGACURE OXE2 (manufactured by BASF)
G-2: IRGACURE 369 (manufactured by BASF)
G-3: IRGACURE OXEOI (manufactured by BASF)
(Additive)
H-1: EHPE-3150 (manufactured by Daicel Corporation, epoxy compound)
H-2: TINUVIN 326 (manufactured by BASF, benzotriazole-based ultraviolet absorber)
(Surfactant)
I-1: 1 mass % of PGMEA solution of the following mixture (Mw=14,000)
In the following formula, "%" representing the proportion of a constitutional unit is mass %.

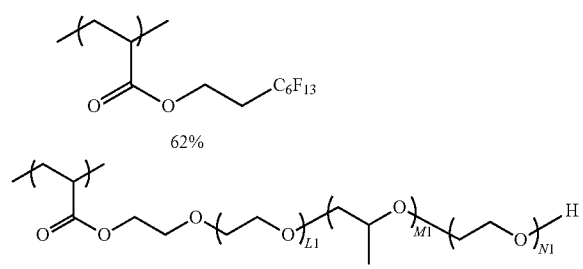

-continued

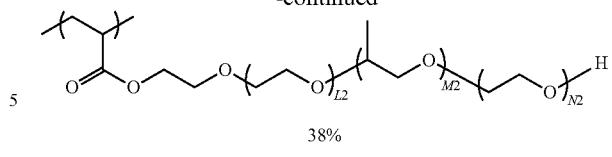

L1 + N1 + L2 + N2 = 14
M1 + M2 = 17

(Polymerization Inhibitor)
J-1: p-methoxyphenol
(Solvent)
K-1: PGMEA
K-2: cyclohexanone
(Thiol Compound)
Each of thiol compounds T1-1 and the like is the same compound as the above-described thiol compounds T1-1 and the like.
In addition, thiol compounds TR-1 to TR-4 are the same compounds as the above-described thiol compounds TR-1 to TR-4.
<Performance Evaluation>
(Evaluation of Pattern Adhesiveness)
The curable composition obtained above was applied to an 8-inch silicon wafer previously sprayed with hexamethyldisilazane using a spin coater such that the film thickness after drying was the film thickness (m) described, and a pre-baking was performed for 120 seconds at 100° C.
Using an i-ray stepper exposure device FPA-i5+ (manufactured by Canon Inc.), the coating film in the coated substrate was irradiated with light having a wavelength of 365 nm at an exposure amount of 50 mJ/cm² to 1,700 mJ/cm² through a mask having a 1.1 μm square island pattern. After the exposure, the exposed film was developed using an alkali developer CD-2000 (manufactured by Fujifilm Electronic Materials Co., Ltd.) at 25° C. for 40 seconds. Next, the developed film was rinsed with flowing water for 30 seconds and was dried by spraying to obtain a colored pattern.
The obtained 1.1 m square island pattern was observed using a scanning electron microscope (S-9220, manufactured by Hitachi, Ltd.) from above the pattern to measure the size of the pattern. In addition, adhesiveness was evaluated using an optical microscope. The pattern size in a case where all the patterns were in closely attached was evaluated on a 5-point scale below.
Evaluation "3" or higher is preferable, and "4" and "5" are evaluated as having excellent performance.
5: even in a case where the film thickness was 0.9 μm or more and less than 1.0 μm, all patterns were closely attached.
4: even in a case where the film thickness was 1.0 m or more and less than 1.05 μm, all patterns were closely attached.
3: even in a case where the film thickness was 1.05 m or more and less than 1.1 μm, all patterns were closely attached.
2: even in a case where the film thickness was 1.1 μm or more and less than 1.2 m, all patterns were closely attached.
1: all patterns were not closely attached unless the film thickness was 1.2 μm or more.
<Evaluation of Edge Shape of Cured Product>
By the following method, an edge shape of the patterned cured product formed of each curable composition was evaluated.

[Curable Composition Film Forming Step]

A curable composition film (composition film) was formed on a silicon wafer so that the film thickness after drying was 0.9 μm. The curable composition film was formed by using spin coating. The rotation speed of the spin coating was adjusted so as to obtain the above-described film thickness. The curable composition film after coating was placed on a hot plate with the silicon wafer facing down and was dried. The surface temperature of the hot plate was set to 100° C. and the drying time was set to 120 seconds.

[Exposing Step]

The obtained curable composition film was exposed under the following conditions.

The exposure was performed using an i-ray stepper (trade name "FPA-3000 iS+", manufactured by Canon Inc.). The curable composition film was irradiated (exposed) at an exposure amount of 400 mJ/cm$^2$ (irradiation time: 0.5 seconds) through a mask having a linear shape of 20 μm (width 20 μm, length 4 mm).

[Developing Step]

The curable composition film after curing was developed under the following conditions to obtain a patterned cured film.

The curable composition film after curing was subjected to a puddle development at 23° C. for 60 seconds using a 0.3 mass % tetramethylammonium hydroxide (TMAH) aqueous solution for 5 times to obtain a patterned cured product. Thereafter, the patterned cured product was rinsed using a spin shower, and further washed with pure water.

[Post-Baking Step]

The patterned cured product obtained above was heated at 220° C. for 300 seconds using a clean oven CLH-21CDH (manufactured by Koyo Thermo Systems Co., Ltd.).

Further, the patterned cured product after heating was placed on a hot plate having a surface temperature of 220° C. and heated for 300 seconds.

[Evaluation]

The above-described patterned cured product was imaged with a scanning electron microscope, and an edge shape of the 1.5 μm pattern cross section was evaluated according to the following standard.

As shown in FIG. 1, a length T of a notch at the bottom of a pattern edge part 2 of a patterned cured product 1 formed on a wafer 4 was measured. In FIG. 1, $L_1$ corresponds to an exposed area, and $L_2$ corresponds to a non-exposed area. The evaluation was performed according to the following standard.

Evaluation "A" or higher is preferable, and "AA" is evaluated as having excellent performance.

—Evaluation Standard—

AA: undercut width was 0.05 μm or less.

A: undercut width was more than 0.05 μm and 0.15 or less.

B: undercut width was more than 0.15 μm and 0.25 or less.

C: undercut width was more than 0.25 μm.

(Evaluation of Defects)

A silicon wafer having a diameter of 8 inches (1 inch=25.4 mm) was heat-treated in an oven at 200° C. for 30 minutes. Next, an undercoat resist solution (CT-4000, manufactured by Fujifilm Electronic Materials Co., Ltd.) was applied to this silicon wafer so that the film thickness after drying was 0.1 μm, and heated and dried in an oven at 220° C. for 1 hour to form an undercoat layer, thereby obtaining a silicon wafer substrate with an undercoat layer.

The obtained curable composition was applied to the undercoat layer of the silicon wafer substrate with an undercoat layer produced above. Next, a heating treatment (pre-baking) was performed for 120 seconds using a hot plate at 100° C. Next, using an i-ray stepper exposure device FPA-3000 i5+ (manufactured by Canon Inc.), the silicon wafer was exposed at a wavelength of 365 nm through a mask having a pattern at an exposure amount of 500 mJ/cm$^2$. As the mask, a mask capable of forming an island pattern of 1.4 μm×1.4 μm with a period of 2.8 μm×2.8 μm was used, and a shot having a size of 11 mm×11 mm was exposed to the entire region except the outer circumference of the wafer of 3 mm.

Next, the substrate on which the irradiated coating film was formed was placed on a horizontal rotary table of a spin-shower developing machine (DW-30 Type, manufactured by Chemitronics Co., Ltd.), and subjected to a puddle development at room temperature for 60 seconds using an alkali developer (CD-2060, manufactured by Fujifilm Electronic Materials Co., Ltd.). Next, the substrate after the puddle development was fixed on the horizontal rotary table by a vacuum chuck method, a rinse treatment (23 seconds×2 times) was performed by supplying pure water from above a rotation center in shower-like from an ejection nozzle while rotating the silicon wafer at a rotation speed of 50 rpm by a rotating device, and then the silicon wafer was spin-dried. Next, a heating treatment (post-baking) was performed for 300 seconds using a hot plate at 200° C. to form a pattern (pixel) of the cured film. The number of defects in the pattern of the obtained cured film was examined using a wafer defect evaluation device (ComPLUS3, manufactured by AMAT). Defects were evaluated according to the following standard.

A: total number of defects in 8-inch wafer ≤30

B: 30<total number of defects in 8-inch wafer ≤100

C: 100<total number of defects in 8-inch wafer

TABLE 7

| | Film thickness (μm) | Adhesive-ness | Edge shape | Defects |
|---|---|---|---|---|
| Example 1 | 0.70 | 3 | A | B |
| Example 2 | 0.65 | 3 | A | B |
| Example 3 | 0.60 | 4 | A | B |
| Example 4 | 0.55 | 4 | A | A |
| Example 5 | 0.50 | 5 | A | B |
| Example 6 | 0.65 | 5 | AA | A |
| Example 7 | 0.65 | 5 | A | A |
| Example 8 | 0.65 | 4 | A | A |
| Example 9 | 0.65 | 4 | A | A |
| Example 10 | 0.65 | 5 | A | A |
| Example 11 | 0.65 | 5 | A | A |
| Example 12 | 0.65 | 5 | AA | A |
| Example 13 | 0.65 | 5 | AA | A |
| Example 14 | 0.65 | 3 | A | B |
| Example 15 | 0.65 | 5 | AA | A |
| Example 16 | 0.65 | 5 | A | A |
| Example 17 | 0.65 | 5 | AA | A |
| Example 18 | 0.65 | 5 | AA | A |
| Example 19 | 0.65 | 5 | A | A |
| Example 20 | 0.65 | 5 | A | A |
| Example 21 | 0.65 | 5 | A | A |
| Example 22 | 0.65 | 5 | A | A |
| Example 23 | 0.65 | 5 | A | A |
| Example 24 | 0.65 | 5 | A | A |
| Example 25 | 0.65 | 5 | A | A |
| Example 26 | 0.65 | 5 | A | A |
| Example 27 | 0.65 | 5 | A | A |
| Example 28 | 0.65 | 5 | B | A |
| Example 29 | 0.65 | 5 | A | A |
| Example 30 | 0.65 | 5 | A | A |
| Example 31 | 0.65 | 5 | A | A |

TABLE 7-continued

| | | Evaluation result | | |
|---|---|---|---|---|
| | Film thickness (μm) | Adhesiveness | Edge shape | Defects |
| Example 32 | 0.65 | 5 | B | B |
| Comparative example 1 | 0.70 | 1 | C | C |
| Comparative example 2 | 0.65 | 3 | C | B |
| Comparative example 3 | 0.65 | 2 | C | C |
| Comparative example 4 | 0.65 | 2 | C | C |
| Comparative example 5 | 0.65 | 2 | C | C |
| Comparative example 6 | 0.65 | 2 | C | C |

TABLE 8

| | | Evaluation result | | |
|---|---|---|---|---|
| | Film thickness (μm) | Adhesiveness | Edge shape | Defects |
| Example 33 | 0.70 | 3 | A | B |
| Example 34 | 0.65 | 3 | A | B |
| Example 35 | 0.60 | 4 | A | B |
| Example 36 | 0.55 | 4 | A | A |
| Example 37 | 0.50 | 5 | A | B |
| Example 38 | 0.65 | 5 | AA | A |
| Example 39 | 0.65 | 5 | A | A |
| Example 40 | 0.65 | 4 | A | A |
| Example 41 | 0.65 | 4 | A | A |
| Example 42 | 0.65 | 5 | A | A |
| Example 43 | 0.65 | 5 | A | A |
| Example 44 | 0.65 | 5 | AA | A |
| Example 45 | 0.65 | 5 | AA | A |
| Example 46 | 0.65 | 3 | A | B |
| Example 47 | 0.65 | 5 | AA | A |
| Example 48 | 0.65 | 5 | A | A |
| Example 49 | 0.65 | 5 | AA | A |
| Example 50 | 0.65 | 5 | AA | A |
| Example 51 | 0.65 | 5 | A | A |
| Example 52 | 0.65 | 5 | A | A |
| Example 53 | 0.65 | 5 | A | A |
| Example 54 | 0.65 | 5 | A | A |
| Example 55 | 0.65 | 5 | A | A |
| Example 56 | 0.65 | 5 | A | A |
| Example 57 | 0.65 | 5 | A | A |
| Example 58 | 0.65 | 5 | A | A |
| Example 59 | 0.65 | 5 | A | A |
| Example 60 | 0.65 | 5 | A | A |
| Example 61 | 0.65 | 5 | A | A |
| Example 62 | 0.65 | 5 | A | A |
| Example 63 | 0.65 | 5 | A | A |
| Example 64 | 0.69 | 3 | B | B |
| Example 65 | 0.65 | 3 | B | B |
| Example 66 | 0.65 | 3 | B | B |
| Example 67 | 0.65 | 5 | B | B |
| Comparative example 7 | 0.70 | 1 | C | C |
| Comparative example 8 | 0.65 | 3 | C | B |
| Comparative example 9 | 0.65 | 2 | C | C |
| Comparative example 10 | 0.65 | 2 | C | C |
| Comparative example 11 | 0.65 | 2 | C | C |
| Comparative example 12 | 0.65 | 2 | C | C |

TABLE 9

| | | Evaluation result | | |
|---|---|---|---|---|
| | Film thickness (μm) | Adhesiveness | Edge shape | Defects |
| Example 68 | 0.65 | 5 | A | A |
| Example 69 | 0.65 | 5 | A | A |
| Example 70 | 0.65 | 5 | A | A |
| Example 71 | 0.65 | 5 | B | A |

From the results shown in Tables 7 to 9, it was found that the curable compositions of Examples 1 to 71, which were the curable compositions according to the embodiment of the present disclosure, were superior in the edge shape of the patterned cured product to be obtained, as compared with the compositions of Comparative Examples 1 to 12.

In addition, from the results shown in Tables 7 to 9, it was found that the curable compositions of Examples 1 to 71, which were the curable compositions according to the embodiment of the present disclosure, had excellent adhesiveness of the obtained cured product and have few defects in the patterned cured product to be obtained.

Further, in a case where the coating film detected in Comparative Example 1 or 3 was subjected to defect analysis by a scanning transmission electron microscope (STEM), in Comparative Example 1, Ca and Fe were detected in a defective portion as compared with a normal portion. In Comparative Example 3, Na, Ca, and Zn were detected in the defective portion as compared with the normal portion.

Examples 101 to 171

In Examples 101 to 171, the curable compositions of Examples 1 to 71 were used, respectively.

Such that color did not overlap with color of the curable composition, overlapping color compositions of Red composition, Green composition, and Blue composition, which will be described later, were used in place of the obtained curable compositions of Examples 1 to 71, respectively. For example, the color of the curable compositions of Examples 1 to 32 was Red, the color of the curable compositions of Examples 33 to 67 was Green, and the color of the curable compositions of Examples 68 to 71 was Blue.

A silicon wafer was coated with a Red composition by a spin coating method so that the thickness of a film after film formation was 1.0 μm. Next, the silicon wafer was heated using a hot plate at 100° C. for 2 minutes. Next, using an i-ray stepper exposure device FPA-3000 i5+ (manufactured by Canon Inc.), exposure was performed at 1,000 mJ/cm$^2$ through a mask having a dot pattern of 2 m square. Next, puddle development was performed at 23° C. for 60 seconds using a 0.3 mass % of tetramethylammonium hydroxide (TMAH) aqueous solution. Next, the coating film was rinsed by spin showering and was cleaned with pure water. Next, the coating film was heated using a hot plate at 200° C. for 5 minutes. As a result, the Red composition was patterned on the pattern of the infrared cut filter. Likewise, a Green composition and a Blue composition were sequentially patterned to form red, green, and blue colored patterns (Bayer pattern).

The Bayer pattern refers to a pattern, as disclosed in the specification of U.S. Pat. No. 3,971,065A, in which a 2×2 array of color filter element having one Red element, two Green elements, and one Blue element is repeated.

This filter was incorporated into a solid-state imaging element using a known method.

The obtained solid-state imaging element was irradiated with infrared rays by an infrared light emitting diode (infrared LED) in a low-illuminance environment (0.001 Lux) to acquire images. Next, the imaging performance of the solid-state imaging element was evaluated.

In a case where any of the curable compositions obtained in Examples 1 to 71 was used, a solid-state imaging element having suitable image recognition ability and moisture resistance was obtained.

The Red composition, the Green composition, and the Blue composition other than the curable compositions of Examples 1 to 71, which were used in Examples 101 to 171, are as follows.

—Red Composition—

The following components were mixed and stirred, and the obtained mixture was filtered through a nylon filter (manufactured by Nihon Pall Corporation) having a pore size of 0.45 μm to prepare a Red composition.

Red pigment dispersion liquid: 51.7 parts by mass
  Resin 4 (40 mass % PGMEA solution): 0.6 parts by mass
  Polymerizable compound 4: 0.6 parts by mass
  Photopolymerization initiator 1: 0.3 parts by mass
  Surfactant 1: 4.2 parts by mass
  PGMEA: 42.6 parts by mass —Green Composition—

The following components were mixed and stirred, and the obtained mixture was filtered through a nylon filter (manufactured by Nihon Pall Corporation) having a pore size of 0.45 μm to prepare a Green composition.

Green pigment dispersion liquid: 73.7 parts by mass
  Resin 4 (40 mass % PGMEA solution): 0.3 parts by mass
  Polymerizable compound 1: 1.2 parts by mass
  Photopolymerization initiator 1: 0.6 parts by mass
  Surfactant 1: 4.2 parts by mass
  Ultraviolet absorber (UV-503, manufactured by Daito Chemical Co., Ltd.): 0.5 parts by mass
  PGMEA: 19.5 parts by mass —Blue Composition—

The following components were mixed and stirred, and the obtained mixture was filtered through a nylon filter (manufactured by Nihon Pall Corporation) having a pore size of 0.45 μm to prepare a Blue composition.

Blue pigment dispersion liquid: 44.9 parts by mass
  Resin 4 (40 mass % PGMEA solution): 2.1 parts by mass
  Polymerizable compound 1: 1.5 parts by mass
  Polymerizable compound 4: 0.7 parts by mass
  Photopolymerization initiator 1: 0.8 parts by mass
  Surfactant 1: 4.2 parts by mass
  PGMEA: 45.8 parts by mass Raw materials used in the Red composition, the Green composition, and the Blue composition are as follows.

Red Pigment Dispersion Liquid

A mixed solution consisting of 9.6 parts by mass of C. I. Pigment Red 254, 4.3 parts by mass of C. I. Pigment Yellow 139, 6.8 parts by mass of a dispersant (Disperbyk-161, manufactured by BYK Chemie), and 79.3 parts by mass of PGMEA was mixed and dispersed using a beads mill (zirconia beads; diameter: 0.3 mm) for 3 hours to prepare a pigment dispersion liquid. Next, using a high-pressure disperser NANO-3000-10 (manufactured by Nippon BEE Chemical Co., Ltd.) equipped with a pressure reducing mechanism, the pigment dispersion liquid was further dispersed under a pressure of 2,000 kg/cm$^3$ at a flow rate of 500 g/min. This dispersion treatment was repeated 10 times, thereby obtaining a Red pigment dispersion liquid.

Green Pigment Dispersion Liquid

A mixed solution consisting of 6.4 parts by mass of C. I. Pigment Green 36, 5.3 parts by mass of C. I. Pigment Yellow 150, 5.2 parts by mass of a dispersant (Disperbyk-161, manufactured by BYK Chemie), and 83.1 parts by mass of PGMEA was mixed and dispersed using a beads mill (zirconia beads; diameter: 0.3 mm) for 3 hours to prepare a pigment dispersion liquid. Next, using a high-pressure disperser NANO-3000-10 (manufactured by Nippon BEE Chemical Co., Ltd.) equipped with a pressure reducing mechanism, the pigment dispersion liquid was further dispersed under a pressure of 2,000 kg/cm$^3$ at a flow rate of 500 g/min. This dispersion treatment was repeated 10 times. As a result, a Green pigment dispersion liquid was obtained.

Blue Pigment Dispersion Liquid

A mixed solution consisting of 9.7 parts by mass of C. I. Pigment Blue 15:6, 2.4 parts by mass of C. I. Pigment Violet 23, 5.5 parts of a dispersant (Disperbyk-161, manufactured by BYK Chemie), and 82.4 parts of PGMEA was mixed and dispersed using a beads mill (zirconia beads; diameter: 0.3 mm) for 3 hours to prepare a pigment dispersion liquid. Next, using a high-pressure disperser NANO-3000-10 (manufactured by Nippon BEE Chemical Co., Ltd.) equipped with a pressure reducing mechanism, the pigment dispersion liquid was further dispersed under a pressure of 2,000 kg/cm$^3$ at a flow rate of 500 g/min. This dispersion treatment was repeated 10 times, thereby obtaining a Blue pigment dispersion liquid.

Polymerizable compound 1: KAYARAD DPHA (mixture of dipentaerythritol hexaacrylate and dipentaerythritol pentaacrylate, manufactured by Nippon Kayaku Co., Ltd.) Polymerizable compound 4: following structure

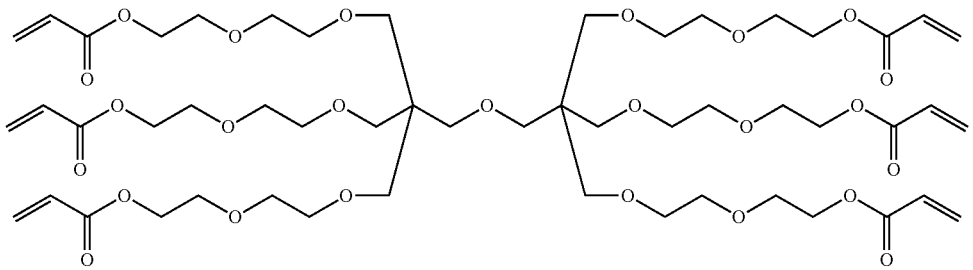 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Polymerizable compound 5: following structure (mixture in which a molar ratio between a left compound and a right compound is 7:3)

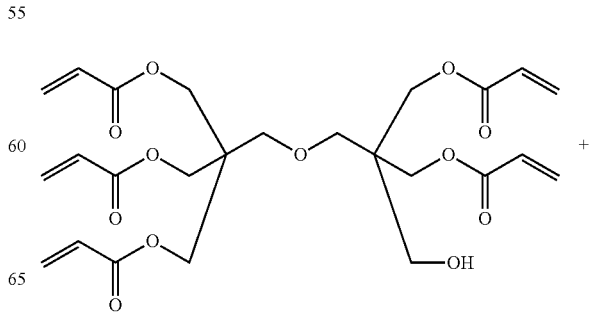

-continued

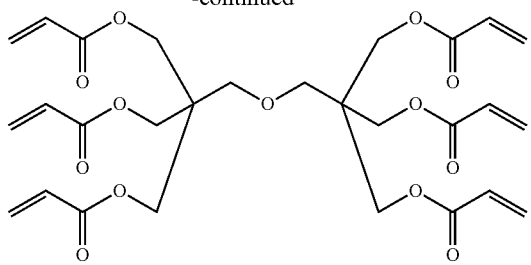

Resin 4: following structure (acid value: 70 mgKOH/g, Mw=11,000; a ratio in a constitutional unit is a molar ratio)

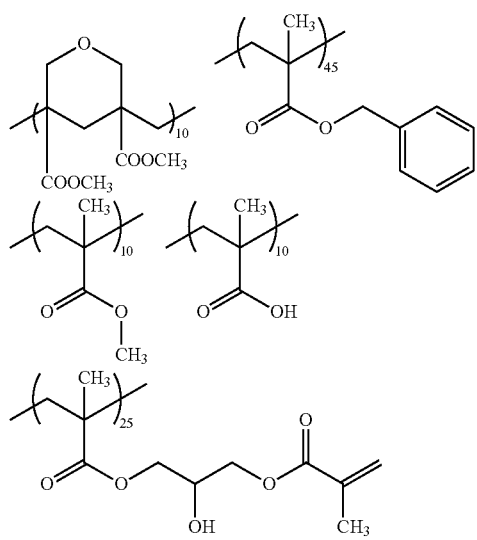

Photopolymerization initiator 1: IRGACURE-OXE01 (1-[4-(phenylthio)]-1,2-octanedione-2-(O-benzoyloxime), manufactured by BASF)

Surfactant 1: 1 mass % PGMEA solution of the following mixture (Mw: 14,000)

In the following formula, the unit of % (62% and 38%) indicating the proportion of a constitutional unit is mass %.

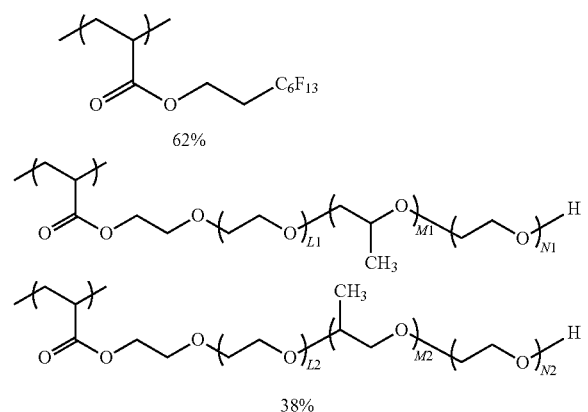

L1 + N1 + L2 + N2 = 14
M1 + M2 = 17

The disclosure of Japanese Patent Application No. 2019-154274 filed on Aug. 27, 2019 is incorporated in the present specification by reference.

All documents, patent applications, and technical standards described in the present specification are incorporated herein by reference to the same extent as in a case of being specifically and individually noted that individual documents, patent applications, and technical standards are incorporated by reference.

EXPLANATION OF REFERENCES

1: patterned cured product
2: pattern edge part
4: wafer
$L_1$: exposed area
$L_2$: non-exposed area
T: length of notch at bottom

What is claimed is:

1. A curable composition comprising:
   a colorant;
   a resin; and
   a thiol compound,
   wherein a thiol value is $6 \times 10^{-6}$ mmol/g to $6 \times 10^{-4}$ mmol/g.

2. A curable composition comprising:
   a colorant;
   a resin; and
   a thiol compound,
   wherein a content of the thiol compound is 1 ppm to 99 ppm.

3. The curable composition according to claim 1, wherein the resin includes a resin having a carboxy group and a graft chain.

4. The curable composition according to claim 3, wherein the resin is a polyester resin which has a carboxy group directly bonded to a main chain and has a graft chain in a side chain.

5. The curable composition according to claim 3, wherein the graft chain is an addition polymerization-type resin chain.

6. The curable composition according to claim 3, wherein the graft chain is an acrylic resin chain.

7. The curable composition according to claim 1, wherein the resin is a resin obtained by reacting a hydroxy group in a vinyl polymer (a) which is produced by a radical polymerization of an ethylenically unsaturated monomer in the presence of a compound (a1) having two hydroxy groups and one thiol group in a molecule, and has two hydroxy groups in one terminal region, with an acid anhydride group in a tetracarboxylic acid anhydride (b).

8. The curable composition according to claim 1, wherein the thiol compound includes a compound having two or more of at least one group selected from the group consisting of an ester bond and an amide bond, and one or more thiol groups.

9. The curable composition according to claim 1, wherein the thiol compound includes a compound having two or more carboxy groups and one or more thiol groups.

10. The curable composition according to claim 1, wherein the thiol compound includes at least one compound of the following compounds A to D, compound A: a compound obtained by condensing a thiol compound having a hydroxy group with a polyvalent carboxylic acid compound or a polyvalent carboxylic acid anhydride, compound B: a compound obtained by condensing a thiol compound having an amino group with a polyvalent carboxylic acid compound or a polyvalent carboxylic acid anhydride, compound C: a compound obtained by condensing a thiol compound having two or more carboxy groups with a polyhydric alcohol compound, compound D: a compound obtained by condensing a thiol compound having two or more carboxy groups with a polyvalent amine compound.

11. The curable composition according to claim 1, wherein the thiol compound includes a thiol compound having a molecular weight of 300 or more.

12. The curable composition according to claim 1, further comprising:
a polymerizable compound; and
a photopolymerization initiator.

13. The curable composition according to claim 1, further comprising:
an ultraviolet absorber.

14. The curable composition according to claim 1, further comprising:
a polymerization inhibitor.

15. The curable composition according to claim 14, wherein the polymerization inhibitor includes at least one compound selected from the group consisting of 2,2,6,6-tetramethylpiperidin-1-oxyl and 2,2,6,6-tetramethyl-4-hydroxypiperidin-1-oxyl.

16. A cured product obtained by curing the curable composition according to claim 1.

17. A color filter comprising:
the cured product according to claim 16.

18. A solid-state imaging element comprising:
the color filter according to claim 17.

19. An image display device comprising:
the color filter according to claim 17.

* * * * *